United States Patent [19]
Reddy et al.

[11] Patent Number: 6,107,824
[45] Date of Patent: Aug. 22, 2000

[54] CIRCUITRY AND METHODS FOR INTERNAL INTERCONNECTION OF PROGRAMMABLE LOGIC DEVICES

[75] Inventors: Srinivas T. Reddy, Fremont; Ketan Zaveri, San Jose; Christopher F. Lane, Campbell; Andy L. Lee, San Jose; Cameron R. McClintock, Mountain View; Bruce B. Pedersen; Manuel Mejia, both of San Jose; Richard G. Cliff, Milpitas, all of Calif.

[73] Assignee: Altera Corporation, San Jose, Calif.

[21] Appl. No.: 09/086,302

[22] Filed: May 28, 1998

Related U.S. Application Data

[60] Provisional application No. 60/062,077, Oct. 16, 1997.

[51] Int. Cl.⁷ .............................. G06F 7/38; H01L 25/00
[52] U.S. Cl. ............................ 326/41; 326/41; 326/40; 326/39; 326/38; 326/37
[58] Field of Search .................... 326/40, 41, 38, 326/39, 37

[56] References Cited

U.S. PATENT DOCUMENTS

| | | | |
|---|---|---|---|
| Re. 34,363 | 8/1993 | Freeman | 307/465 |
| 3,473,160 | 10/1969 | Wahlstrom | 340/172.5 |
| 4,609,986 | 9/1986 | Hartmann et al. | 364/200 |
| 4,617,479 | 10/1986 | Hartmann et al. | 307/465 |
| 4,642,487 | 2/1987 | Carter | 307/465 |
| 4,677,318 | 6/1987 | Veenstra | 307/465 |
| 4,713,792 | 12/1987 | Hartmann et al. | 364/900 |
| 4,758,745 | 7/1988 | Elgamal et al. | 307/465 |
| 4,774,421 | 9/1988 | Hartmann et al. | 307/465 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 4,918,440 | 4/1990 | Furtek | 340/825.83 |
| 5,023,606 | 6/1991 | Kaplinsky | 340/825.8 |
| 5,073,729 | 12/1991 | Greene et al. | 307/465.1 |
| 5,121,006 | 6/1992 | Pedersen | 307/465 |

(List continued on next page.)

FOREIGN PATENT DOCUMENTS

| | | | |
|---|---|---|---|
| 463746 A2 | 1/1992 | European Pat. Off. | G06F 15/60 |
| 630115 A2 | 12/1994 | European Pat. Off. | H03K 19/177 |
| WO 95/04404 | 2/1995 | WIPO | H03K 19/177 |
| WO 95/22205 | 8/1995 | WIPO | H03K 19/177 |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory,* A. Mukhopadhyay, ed., Academic Press, New York, 1971, chapters VI and IX, pp. 229–254 and 369–422.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

*ACT Family Field Programmable Gate Array Databook,* Apr. 1992, Actel Corporation, Sunnyvale, CA, pp. 1–35 through 1–44.

*The Programmable Logic Data Book,* 1994, Xilinx, Inc., San Jose, CA, pp. 2–7, 2–12, and 2–13.

*Primary Examiner*—Michael Tokar
*Attorney, Agent, or Firm*—Fish & Neave; G. Victor Treyz; Michael E. Shanahan

[57] ABSTRACT

Programmable interconnection group arrangements for selectively interconnecting logic on a programmable logic device are provided. Interconnection groups may be programmed to route signals between the various conductors on the device, and to route signals from various logic regions on the device to the various conductors. The interconnection groups provide routing flexibility and efficiency without using excessive amounts of interconnection resources.

158 Claims, 21 Drawing Sheets

U.S. PATENT DOCUMENTS

| | | | |
|---|---|---|---|
| 5,122,685 | 6/1992 | Chan et al. | 307/465.1 |
| 5,132,571 | 7/1992 | McCollum et al. | 307/465.1 |
| 5,144,166 | 9/1992 | Camarota et al. | 307/465.1 |
| 5,208,491 | 5/1993 | Ebeling et al. | 307/465 |
| 5,218,240 | 6/1993 | Camarota | 307/443 |
| 5,220,214 | 6/1993 | Pedersen | 307/465 |
| 5,225,719 | 7/1993 | Agrawal et al. | 307/465 |
| 5,255,203 | 10/1993 | Agrawal et al. | 364/489 |
| 5,258,668 | 11/1993 | Cliff et al. | 307/465 |
| 5,260,610 | 11/1993 | Pedersen et al. | 307/465 |
| 5,260,611 | 11/1993 | Cliff et al. | 307/465 |
| 5,274,581 | 12/1993 | Cliff et al. | 364/784 |
| 5,338,984 | 8/1994 | Sutherland | 307/465.1 |
| 5,350,954 | 9/1994 | Patel | 307/465 |
| 5,371,422 | 12/1994 | Patel et al. | 326/41 |
| 5,448,186 | 9/1995 | Kawata | 326/41 |
| 5,455,525 | 10/1995 | Ho et al. | 326/41 |
| 5,457,410 | 10/1995 | Ting | 326/41 |
| 5,467,029 | 11/1995 | Taffe et al. | 326/41 |
| 5,469,003 | 11/1995 | Kean | 326/39 |
| 5,483,178 | 1/1996 | Costello et al. | 326/41 |
| 5,509,128 | 4/1996 | Chan | 395/311 |
| 5,541,530 | 7/1996 | Cliff et al. | 326/41 |
| 5,689,195 | 11/1997 | Cliff et al. | 326/41 |
| 5,808,479 | 9/1998 | Sasaki et al. | 326/41 |
| 5,942,913 | 8/1999 | Young et al. | 326/41 |

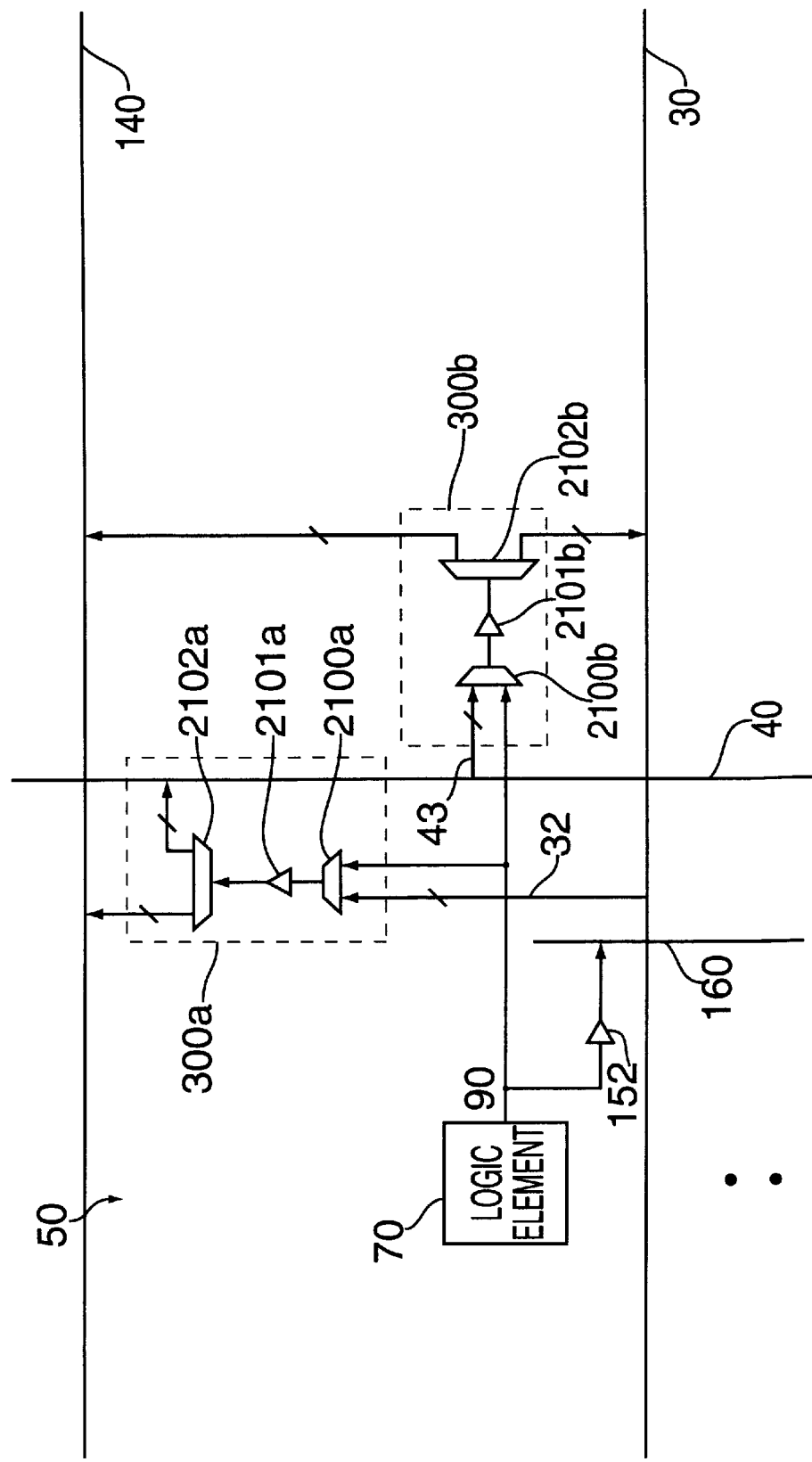

H   →   GH

H   →   V

H   →   ANOTHER H

V   →   GH

V   →   ANOTHER V

| | | |
|---|---|---|
| V | → | GV |
| V | → | H |
| GV | → | H |
| GV | → | V |
| GV | → | GH |
| GV | → | ANOTHER GV |
| H | → | GV |
| H | → | V |
| GH | → | GV |
| GH | → | ANOTHER GH |

FIG. 13

CIRCUITRY AND METHODS FOR INTERNAL INTERCONNECTION OF PROGRAMMABLE LOGIC DEVICES

This application claims the benefit of U.S. provisional application No. 60/062,077, filed Oct. 16, 1997.

BACKGROUND OF THE INVENTION

The present invention relates to programmable logic devices ("PLDs"), and more particularly, to circuitry for interconnecting and driving signals onto various programmable logic device interconnects.

Programmable logic devices are well known as is shown, for example, by Pedersen et al. U.S. Pat. No. 5,260,610 and Cliff et al. U.S. Pat. No. 5,260,611.

There is continued interest in programmable logic devices with greater logic capacity. This calls for devices with larger numbers of regions of programmable logic. It also calls for logic devices with greater programmable interconnectivity for making needed connections between the increased numbers of logic regions. It is important, however, to organize interconnection resources judiciously so that those resources provide flexible interconnectivity, but do not begin to take up excessive amounts of space on the device, thereby unduly interfering with the amount of additional logic that can be included in the device. To accomplish this, it would be desirable to find ways to organize the interconnection resources on programmable logic devices so that the efficiency of utilization of the interconnection resources can be maximized. More interconnectivity could therefore be provided in the device to serve more logic in the device without simply adding more interconnection resources with the increased logic capability.

It is therefore an object of this invention to provide improved arrangements of interconnection resources for programmable logic devices.

It also an object of the invention to provide programmable logic device interconnection arrangements that can efficiently and flexibly interconnect larger numbers of programmable logic regions than previously possible.

SUMMARY OF THE INVENTION

These and other objects of the invention are accomplished in accordance with the principles of the present invention by providing arrangements for interconnecting resources on programmable logic devices that have a plurality of super-regions of programmable logic disposed on the device in a two-dimensional array of intersecting rows and columns. Each logic super-region in such a programmable logic device includes a plurality of regions of programmable logic and a plurality of inter-region interconnection conductors associated with the regions for conveying signals to and between the regions in that super-region. Each region may include a plurality of subregions of programmable logic. A typical subregion is rogrammable to perform any of several logical operations on a plurality of input signals applied to the subregion to produce an output signal of the subregion. Programmable logic connectors and local conductors may be associated with the regions for selectively bringing signals from the associated inter-region conductors to the subregions in that region for use as inputs. Interconnection groups may be used to selectively apply subregion output signals to the associated inter-region conductors.

A plurality of horizontal inter-super-region interconnection conductors may be associated with each row of super-regions for selectively conveying signals to, from, and between the super-regions in the that row. Similarly, a plurality of vertical inter-super-region interconnection conductors may be associated with each column of super-regions for selectively conveying signals to, from, and between the super-regions in that column.

The local conductors for selectively bringing signals into the region may include region-feeding conductors for bringing signals into the programmable logic region and local feedback conductors for making output signals of the region available as inputs to the region (i.e. recirculating signals in a programmable logic region). The region-feeding conductors are programmably connectable to the inter-region interconnection conductors. The region feeding conductors convey signals from the inter-region interconnection conductors to the inputs of the subregions in the region. The local feedback conductors are programmably connectable to the input of the subregions. The local feedback conductors supply feedback signals from the subregions to the inputs of the subregions.

Programmable interconnection groups may be used for various interconnection tasks such as turning signals traveling on inter-super-region and inter-region conductors onto other conductors and applying subregion output signals to the inter-super-region and inter-region conductors. The interconnection groups are typically organized so that they selectively direct signals from logic regions and inter-region and inter-super-region conductors to other inter-region and inter-super-region conductors.

Each interconnection group preferably has a number of programmable multiplexers (switching circuits). In one suitable arrangement, a programmable multiplexer in an interconnection group may select as an output signal: (1) one or more output signals from an associated logic region, (2) one or more output signals of an adjacent logic region, or (3) one or more inter-region or inter-super-region conductor signals. The interconnection group may apply the selected signal to a driver circuit. Output signals from the driver circuit may be programmably connected (e.g., using a demultiplexer or second multiplexer) to one or more inter-region or inter-super-region conductors. This arrangement provides a number of pathways for routing signals from logic elements and conductors to each conductor type. This arrangement also helps to reduce the amount of interconnection circuitry on the programmable logic device by reducing or eliminating the need for numerous dedicated interconnection circuits.

Some of the programmable interconnection groups, such as those near the periphery of the device, may also receive signals from input/output ("I/O") pins. These interconnection groups may be used to route signals from the I/O pins to the appropriate conductors on the device. Some I/O pins may have dedicated interconnection groups that route signals to one or more inter-super-region conductors and/or one or more inter-region interconnection conductors.

The region-feeding conductors and local feedback conductors are generally not directly connected to the inter-super-region conductors. In order to reach a local or region-feeding conductor, signals from inter-super-region conductors must be routed through an interconnection group and inter-region interconnection conductors. This arrangement reduces the number of programmable connections used to connect signals to the local and region-feeding conductots.

The interconnection groups increase interconnectivity and routing flexibility on the programmable logic device without using excessive amounts of interconnection resources. The interconnection groups also help to minimize the number of blocked signal routes encountered when implementing a design on the programmable logic device. Interconnections groups may reduce the area required for a programmable logic device with a given amount of logic circuitry by reducing the number of programmable interconnections that are needed on the device. The interconnection groups may also help to reduce the number of interconnection conductors used in routing various signals, thereby reducing parasitic loading and increasing the speed of the device.

Further features of the invention, its nature and various advantages will be more apparent from the accompanying drawings and the following detailed description of the preferred embodiments.

BRIEF DESCRIPTION OF THE DRAWINGS

FIG. 5 is an expanded view of the interconnection group shown in FIG. 4a.

FIG. 7a is a diagram of another illustrative interconnection group accordance with the present invention.

FIG. 10 is a table showing the type of turns that are supported by the interconnection group arrangement shown in FIGS. 4a and 6a.

FIG. 11 is a table showing the type of turns that are supported by the interconnection group arrangement shown in FIG. 7a.

FIG. 12 is a table showing the type of turns that are supported by the interconnection group arrangement shown in FIG. 8a.

FIG. 13 is a table showing the type of turns that are supported by the interconnection group arrangement shown in FIG. 9a.

DETAILED DESCRIPTION OF THE PREFERRED EMBODIMENTS

Various aspects of a first embodiment of the present invention will be described with reference to FIGS. 1–5. Thereafter, some of these aspects will be further described with reference to embodiments of the types shown in FIGS. 6a–9c, which also illustrate some additional aspects of the invention.

Figure 1:
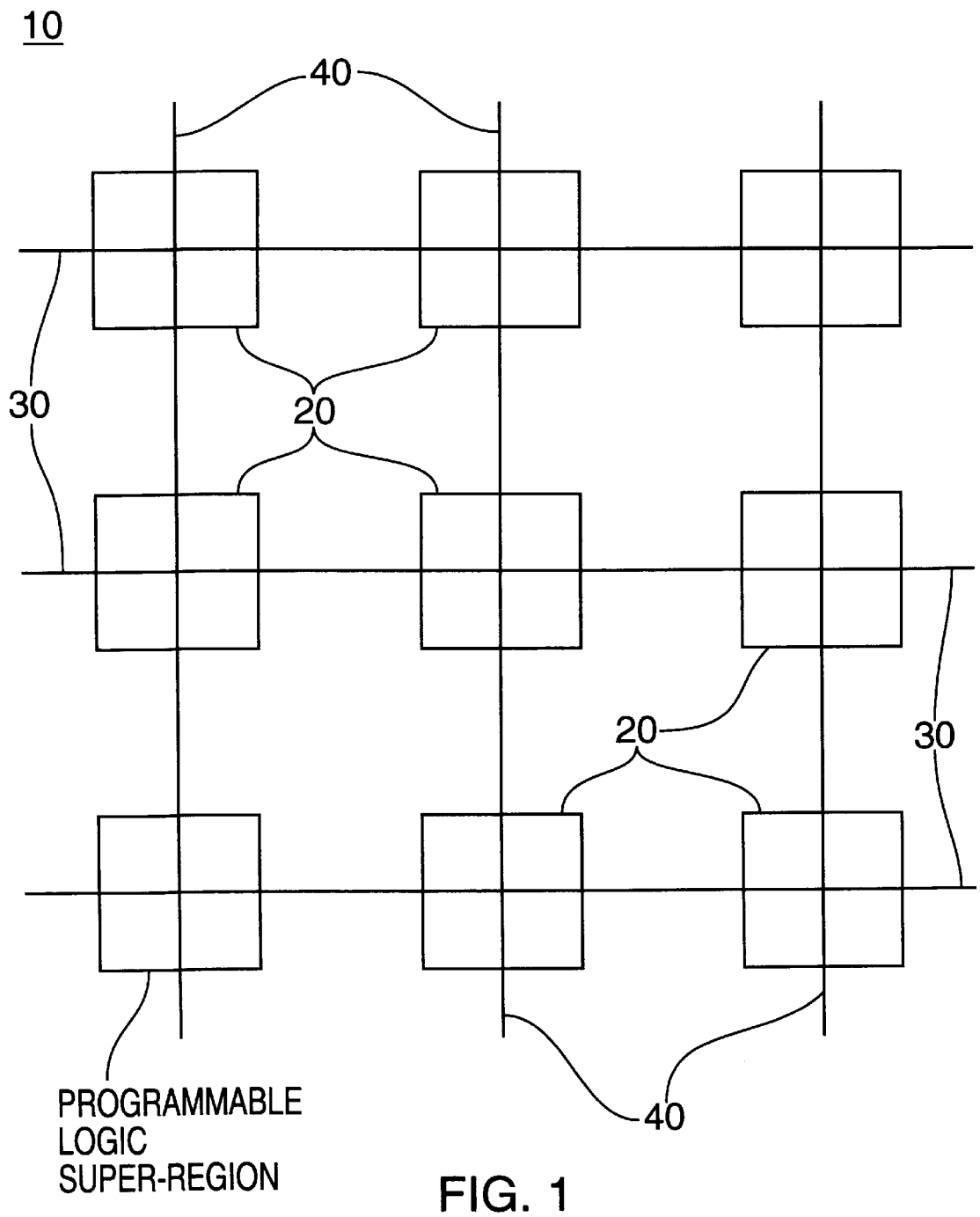
FIG. 1 is a diagram of an illustrative programmable logic device that may be used in accordance with the present invention.

In FIG. 1, an illustrative embodiment of a programmable logic integrated circuit device 10 is shown including a plurality of programmable logic super-regions 20 disposed on the device in a two-dimensional array of rows and columns. Programmable logic super-regions such as programmable logic super-regions 20 are sometimes referred to as groups of logic array blocks (GOLs).

A plurality of inter-super-region horizontal interconnection conductors 30 are associated with each of the rows of device 10 and a plurality of vertical inter-super-region interconnection conductors 40 are associated with each of the columns. The number of rows and columns (i.e., three in each case) shown in FIG. 1 is merely illustrative, and any number of rows and columns can be provided as desired. Although not shown in FIG. 1, device 10 preferably has input/output circuity and pins for connecting device 10 to external circuitry. Such input/output circuitry may be disposed around the periphery of the device and may be programmably connected to conductors 30 and 40.

It will be understood that terms like "row" and "column," "horizontal" and "vertical," "left" and "right," "upper" and "lower," and other directional or orientational terms are used herein only for convenience, and that no fixed or absolute directions or orientations are intended by the use of these terms.

Figure 2:
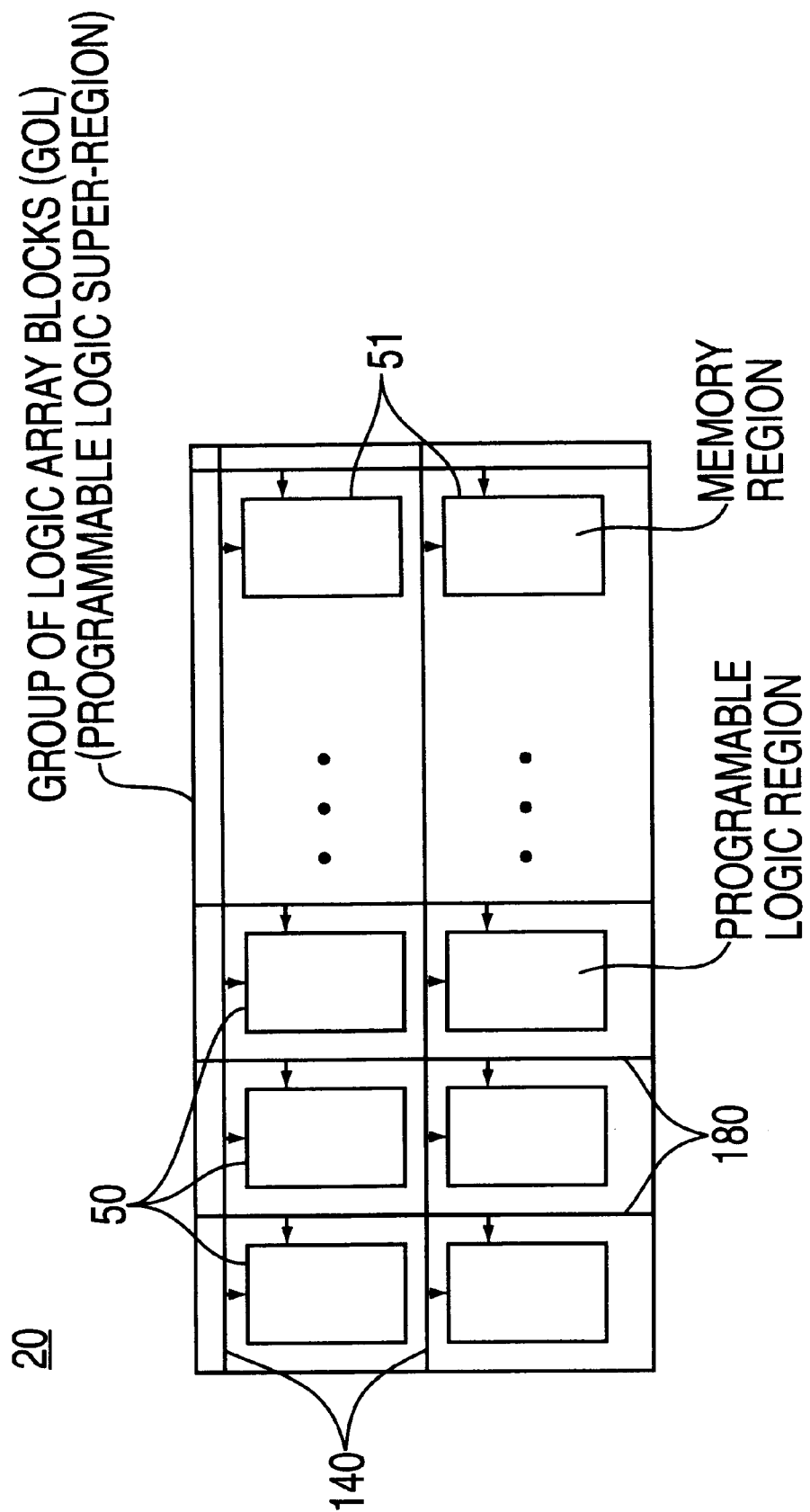
FIG. 2 is a more detailed diagram of a portion of the programmable logic device shown in FIG. 1.

An illustrative embodiment of a representative GOL 20 is shown in more detail in FIG. 2. In the FIG. 2 representation, GOL 20 includes a two dimensional array of rows and columns of programmable logic regions 50. Such programmable logic regions 50 are sometimes called logic array blocks (LABs). Each GOL 20 may include memory regions 51, which may each contain a configurable block of random access memory (RAM) such as static random access memory (SRAM). A typical GOL 20 might include one memory region 51 and a one-by-sixteen array of associated LABs 50 (i.e., 16 LABs 50 in a single row, one LAB 50 in each of 16 columns). Another typical GOL might include two memory regions 51, each associated with its own row of 16 LABs (i.e., two LABs per column).

Figure 3:
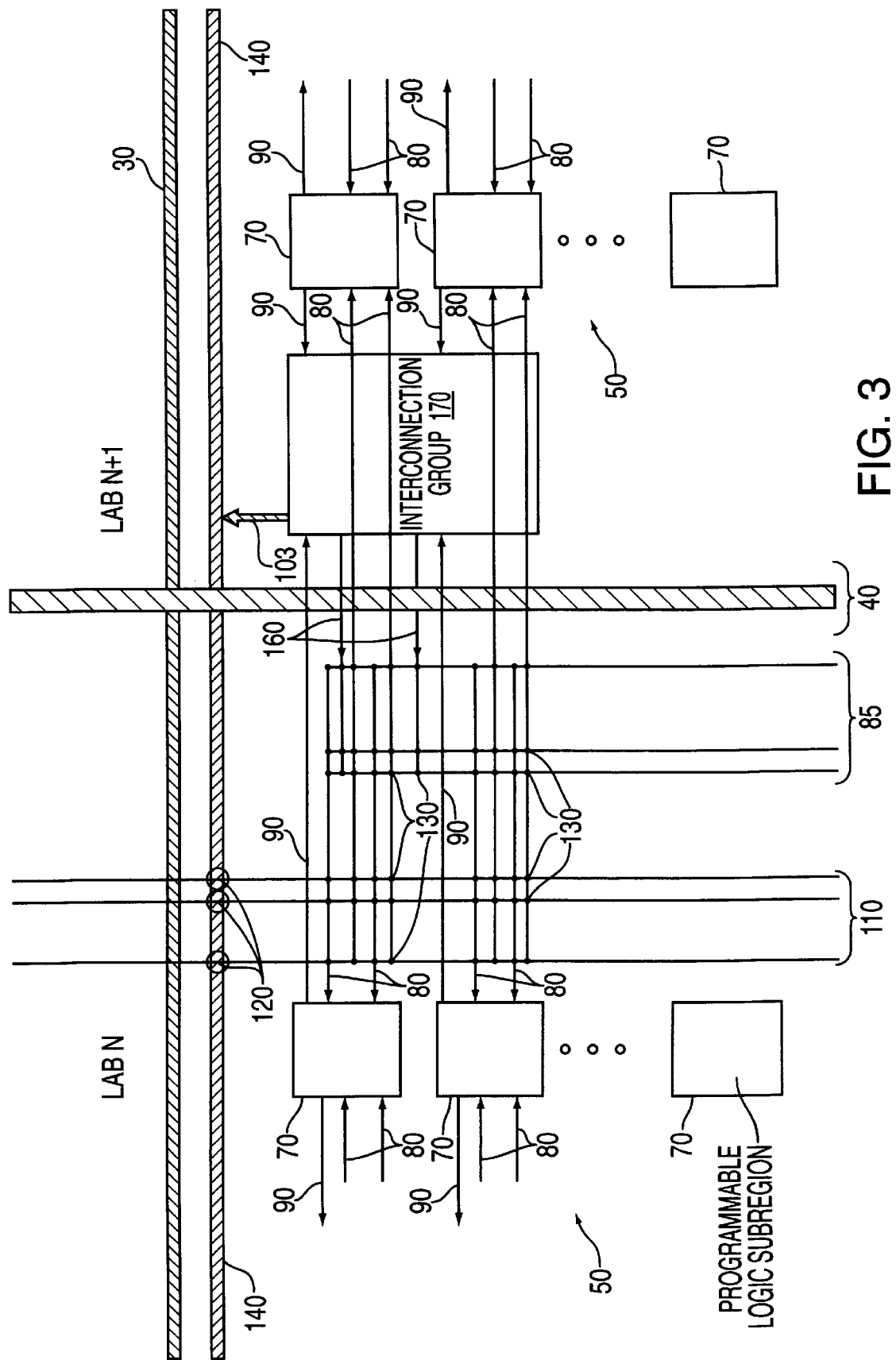
FIG. 3 is an even more detailed diagram of a portion of the programmable logic device shown in FIG. 1.

In FIG. 3, an illustrative embodiment of two representative LABs 50 (N and N+1) is shown within each GOL 20. LABs 50 are interconnected by inter-region interconnection conductors, such as horizontal inter-region interconnection conductors 140. In the FIG. 3 representation, each LAB 50 includes a plurality of programmable logic subregions 70, which are sometimes called logic elements (LEs). For example, each LAB 50 may include ten logic elements 70. Each logic element 70 is programmable to perform any of a number of logic functions on the logic signals provided at its input conductors 80. For example, each logic element 70 may include a programmable four-input look-up table for producing a look-up table output which is any logical combination of four inputs applied to the logic element by input conductors 80. Each logic element 70 may additionally include a register and programmable switches for allowing the look-up table output to be selectively registered by the register. The output conductor 90 of the logic element may then be supplied with either the registered or unregistered look-up table output. It may also be possible to bypass the lookup table. The output conductors 90 of logic elements 70 are connected to interconnection groups such as interconnection group 170, which selectively route logic element output signals on conductors 90 to vertical inter-super-region interconnection conductors 40, horizontal inter-super-region interconnection conductors 30, horizontal inter-region interconnection conductors 140 (via conductors 103) or local conductors 85 (via conductors 160). Interconnection groups 170 may contain programmable logic connectors ("PLCs") for programmably connecting inputs to the group to outputs of the group. Interconnection group PLCs may be organized in the form of switching circuits such as multiplexers or demultiplexers. Each logic element output signal output signal on a conductor 90 may be fed back within a LAB 50 so that it may be used as an input to any of the logic elements 70 in that region.

Each LAB 50 may include a plurality of LAB-feeding (i.e., region-feeding) conductors 110 for selectively bringing signals from horizontal inter-region conductors 140 into the LAB. PLCs 120 programmably connect horizontal inter-region conductors 140 to LAB-feeding conductors 110 for this purpose. PLCs 120, which may be organized as multiplexers, may be only partially populated with possible connections (i.e., each of LAB-feeding conductors 110 may be programmably connectable to only a subset of horizontal inter-region conductors 140). However, the population densities and distributions of these connections are preferably such that signals traveling on each conductor 140 have several possible paths into a given LAB 50 via conductors 110.

PLCs 130 allow the signals on LAB-feeding conductors 110 and local conductors 85 to be selectively applied to logic element inputs 80. PLCs 130 are configured to act as multiplexers. The interconnection between conductors 80, 90 and 160 and conductors 85 and 110 may be fully populated or partially populated with PLCs, as desired. If this intersection is only partially populated with PLCs, the population densities and distributions of PLCs 130 are preferably such that signals traveling on each conductor 85 and 110 have several possible paths into each logic element 70 via input conductors 80.

Logic element input conductors 80 may be configured to allow signals traveling on each region-feeding conductor 110 and each local conductor 85 to be routed to adjacent LABs 50. As shown in FIG. 3, this creates an interleaved input conductor arrangement in which input conductors 80 alternately connect to either a LAB to the left of the local conductors 85 or a LAB to the right of local conductors 85. For example, if one input conductor 80 is connected to LAB N, the next input conductor 80 may be connected to LAB N+1, and the following input conductor 80 may be connected to LAB N, etc.).

The logic circuitry of the LAB 50 shown in FIG. 3 may be generally like the corresponding portion of the LAB structure shown in Cliff et al. U.S. Pat. No. 5,689,195 (see, e.g., FIG. 3 of that patent). Additional features such as those shown in the '195 patent may be included in the LABs 50 if desired. Additional conductors for so-called fast lines and/or clock signal lines, carry and/or cascade interconnections between logic elements 70, lines for register control signals derived from local conductors 85 and/or region feeding conductors 110 may be provided. If desired, the logic elements 70 in LABs 50 can be constructed using product term logic. The LAB arrangement shown in FIG. 3 is illustrative only. Any suitable type of logic array block circuit arrangement may be used if desired.

Figure 4A:
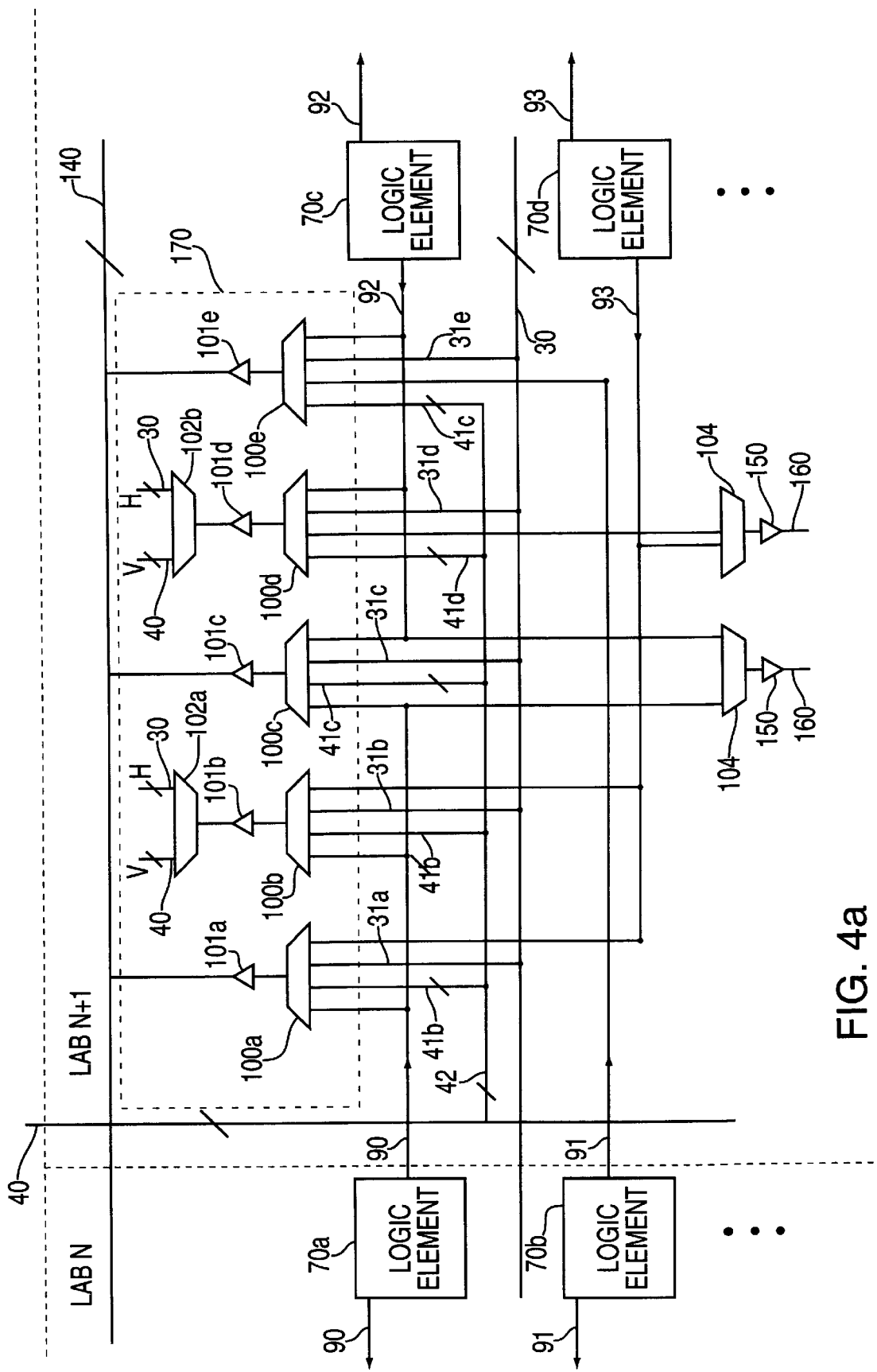
FIG. 4a is a diagram of an illustrative interconnection group in accordance with the present invention.

A portion of an illustrative GOL 20 and the interconnections associated with that GOL 20 are shown in FIG. 4a. In addition, illustrative interconnection and driver circuitry that is used by GOL 20 is shown. In particular, FIG. 4a shows an illustrative driver arrangement for interconnecting GOL 20 with the horizontal inter-super-region interconnection conductors 30, vertical inter-super-region interconnection conductors 40, and global horizontal inter-region interconnection conductors 140 that are associated with that GOL 20. Horizontal inter-super-region interconnection conductors 30 (hereinafter "H conductors") and vertical inter-super-region interconnection conductors 40 (hereinafter "V conductors") span the entire length of PLD 10 and provide interconnection among the various GOLs 20 within the PLD 10 (see FIG. 1). Communication between GOLs 20 in the horizontal direction is accomplished by using H conductors 30, whereas communication between GOLs in the vertical direction is accomplished using V conductors 40. If desired, H conductors 30 and V conductors 40 may include fractional-length interconnection conductors (e.g. half-length interconnection conductors, quarter-length interconnection conductors, one-eight-length interconnection conductors, etc.). Such fractional-length interconnection conductors may be selectively interconnected to produce either longer fractional-length conductors or full-length interconnection conductors if desired.

Each set of global horizontal inter-region conductors 140 (hereinafter "GH conductors") spans the entire length of a GOL 20 and provides interconnection among the various LABs 50 and memory regions 51 within that GOL. If desired, GH conductors 140 may include fractional-length interconnection conductors (e.g. half-length, quarter-length, one-eight-length, etc.). Such fractional-length interconnection conductors may be selectively interconnected to produce either longer fractional-length conductors or full-length interconnection conductors if desired. Communication between the LABs 50 and memory regions 51 in a GOL 20 containing a single row of LABs 50 may be accomplished using GH conductors 140. Communications between LABs in a GOL 20 containing more than one row of LABs 50 may be accomplished using comparable global vertical inter-region interconnection conductors 180 (hereinafter "GV conductors" as shown in FIG. 9).

FIG. 4a also shows how multiplexing and driver circuitry may be used to convey output signals from logic elements 70 to local branch conductors 160. Multiplexers 104 may receive output signals on conductors 91–94 from logic elements 70a–70d and may selectively direct those signals to local branch conductors 160 (preferably via buffers 150). Local branch conductors 160 may be programmably connected (by PLCs such as PLCs 130 of FIG. 3) to LAB-feeding conductors 110 and local conductors 85 (FIG. 3) to provide interconnection pathways among the various logic elements 70 within adjacent LABs 50. (Local drivers 150 and other driver circuitry for LAB 50 of FIG. 3 are not shown in FIG. 3 to avoid over-complicating the drawings.)

Logic designs implemented on PLD 10 typically require signals from the logic elements 70 or memory regions 51 to be routed to other LABs 50 or memory region 51 in the same row. Such signals must generally also be routed to other GOLs 20 within the PLD 10. Several types of interconnection paths may be used to support inter-LAB and inter-GOL communications. For example, communications between the LABs 50 within a GOL 20 may require signals from the logic elements 70 of a LAB 50 and the memory region 51 in the same row as that LAB 50 to be applied to GH conductors 140. Communications between LABs 50 in different GOLs 20 may require the interconnection of multiple conductor types such as V to H, H to V, V to GH, and H to GH.

The driver arrangement shown in FIG. 4a allows signals to be selectively routed among multiple conductor types. Each LAB 50 has a set of associated V conductors 40, H conductors 30, and GH conductors 140. Signals from logic elements 70 are applied to multiple V, H, and GH conductors 40, 30, and 140 along with signals from other V and H conductors 40 and 30 in order to provide each signal with a number of possible paths to each conductor type. This is accomplished by a set of programmable multiplexers 100 (based on PLCs) and demultiplexers 102 (also based on PLCs) which route selected inputs to their outputs. For example, signals from logic elements 70a–d, H conductors 30, and V conductors 40 are applied to certain inputs of multiplexers 100a–e. Multiplexers 100 programmably select from among these input signals and allow the selected signals to pass as outputs to the appropriate conductors, preferably using driver buffers such as GH drivers 101a, 101c and 101e or V/H drivers 101b and 101d. In this way, signals from H and V conductors 30 and 40 and outputs from various logic elements 70 can share direct access to both inter-region interconnection conductors (GH conductors 140), and inter-GOL interconnection conductors (V conductors 40 and H conductors 30) without having to pass through intermediate conductors. Memory regions 51 (FIG. 2) in the same row as a given set of logic elements 70 can be interconnected with a comparable driver arrangement.

One benefit of the interconnection scheme of FIG. 4a is that signals on one type of conductor can readily "turn" to another type of conductor to reach a desired destination. For example, if it is desired to route a signal from a LAB 50 in one GOL 20 to another LAB 50 in a GOL 20 diagonally across PLD 10, the signal may be conveyed horizontally on an H conductor 30, then make an H to V turn and be conveyed on a V conductor 40 until it arrives at the desired GOL 20. The signal could then make an H to GH turn and be conveyed on a GH conductor 140 until it arrives at the desired LAB 50.

Signals traveling on H conductors 30 can be turned to travel along V conductors 40, GH conductors 140, or other H conductors 30. Horizontal branch conductors 31a–31e are provided to allow certain H conductors 30 to be connected to the inputs of programmable multiplexers 100. A signal from an H conductor 30 can be turned to a V conductor 40 by programming a multiplexer such as multiplexer 100d to apply the input signal received from horizontal branch conductor 31d to V/H driver 101d. Programmable demultiplexer 102b receives the output signal from V/H driver 101d and routes it to a selected V conductor 40. Demultiplexer 102b may also be programmed to apply the selected signal to another H conductor 30. A signal from an H conductor 30 can be turned onto a GH conductor 140 by programming a multiplexer such as multiplexer 100c to apply the input signal received from horizontal branch conductor 31c to GH driver 101c. This allows signals from the inter-GOL H conductors 30 to be selectively brought into a GOL 20.

Connections between H conductors 30 and the multiplexers 100 associated with a row of LABs 50 are generally equally distributed among the interconnection groups 170 associated with that row by horizontal branch conductors 31. Each horizontal branch conductor 31 in a given row of LABs 50 is preferably connected to a different one of the H conductors 30 associated with that row of LABs. For example, a row of LABs 50 may include 16 LABs and a memory region 51, each of which may be associated with at least one interconnection group 170 that has five multiplexers 100 (for a total of 80 multiplexers 100 associated with that row). A set of 80 H conductors 30 may be associated with the row, each H conductor 30 being connected to a different multiplexer 100 by a horizontal branch conductor 31. Horizontal branch conductors 31 may be arranged in this way to avoid competition between the H conductors 30 associated with a given row of LABs for the same drivers.

In certain GOL arrangements, however, the number of available multiplexers 100 in a given row of LABs 50 may exceed the number of H conductors 30 associated with that row of LABs. For example, each LAB 50 may include five interconnection groups 170, each of which may have multiple multiplexers 100. LABs of this type may be arranged in a row so that there are that five rows of interconnection groups 170 within a row of LABs 50. For example, in FIG. 5, interconnection groups 170a, 170'b, and 170c from LABs N, N+1, and memory region 51 are arranged such that they form a row of interconnection groups within that row of LABs. This type of arrangement may be repeated for all of the interconnection groups within the row of LABs so that each interconnection group 170 is associated with a row of interconnection groups. For example, in FIG. 5, interconnection groups 170'c, 170d, and 170'f may form a row of interconnection groups, interconnection groups 170g, 170'h, and 170i may form a row of interconnection groups, etc.

Figure 5:
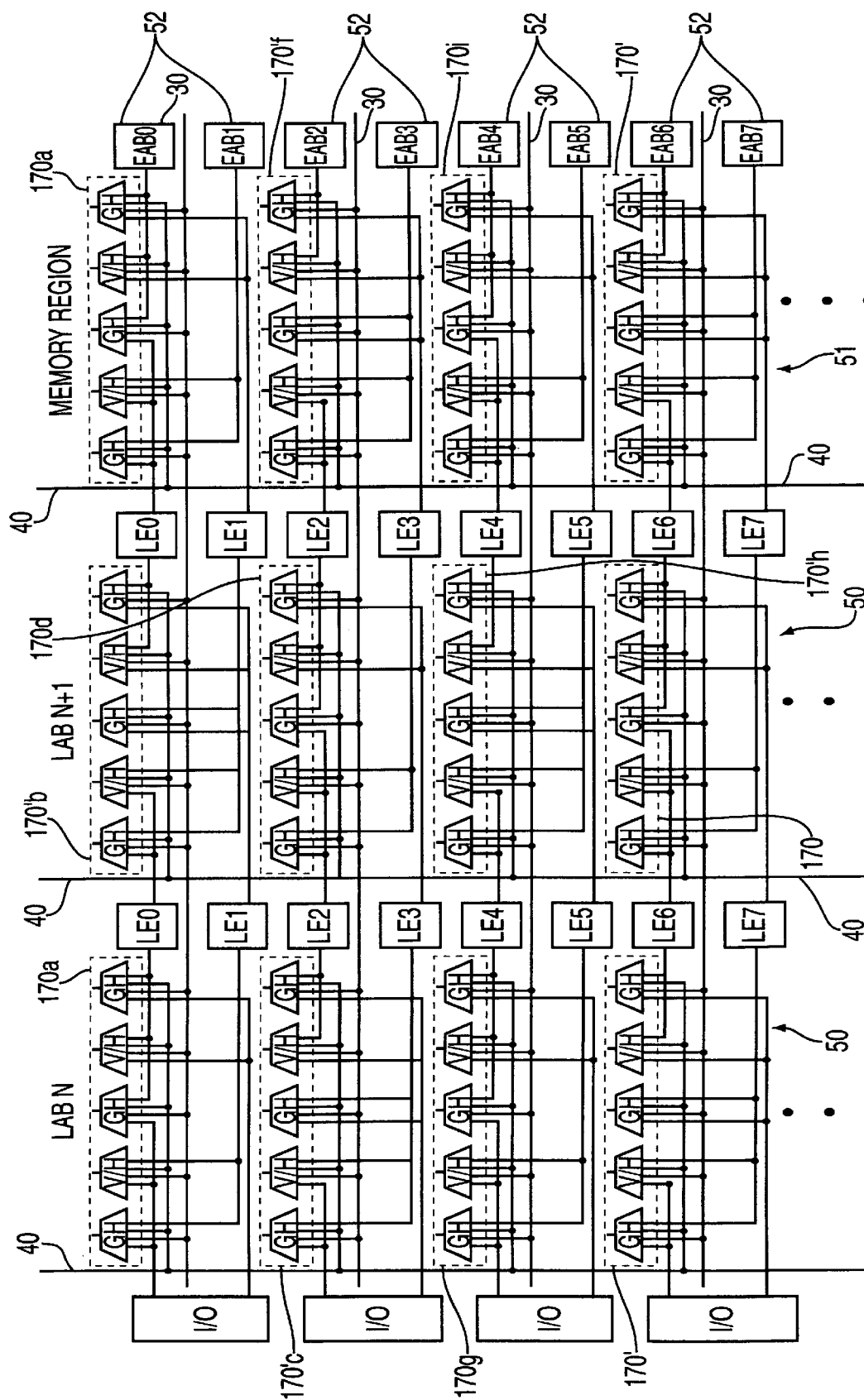

As described above, a set of multiple H conductors 30 may be associated with a given row of LABs. This set of multiple H conductors 30 may be divided into subsets so that each of the subsets may be associated with a different one of the multiple rows of interconnection groups 170. This is illustrated in FIG. 5. In one suitable GOL arrangement, a set of 100 H conductors 30 associated with a row of LABs may be divided into five subsets of 20 conductors each. A given row of LABs may contain 16 LABs 50 and a memory region 51. Each one of the five subsets of H conductors 30 may be associated with a different one of the five rows of interconnection groups 170 so that a total of 80 multiplexers 100 may be associated with that row of interconnection groups. In this case, each H conductor 30 may be connected to multiple different multiplexers 100 in its row of interconnection groups. For example, each H conductor 30 may be connected to four different multiplexers 100, each multiplexer preferably being in a different interconnection group 170. This arrangement distributes H conductors 30 evenly among interconnection groups 170 and improves routing flexibility within a given GOL 20 by providing signals traveling on each H conductor 30 with pathways to multiple multiplexers 100.

As shown in FIGS. 4a and 5, each interconnection group 170 may include three multiplexers 100 (GH multiplexers) for selectively connecting signals to GH conductors 140 and two multiplexers 100 (V/H multiplexers) for selectively connecting signals to V conductors 40 or H conductors 30. In GOL arrangements wherein each H conductor 30 is connected to only two multiplexers 100 within a given row of LABs, each H conductor 30 may be connected to at least one of each multiplexer type within that GOL (i.e., one GH multiplexer and one V/H multiplexer). However, in GOL arrangements wherein each H conductor 30 is connected to more than two (e.g., four), multiplexers 100 the number of connections to each multiplexer type may be varied to suit particular needs. For example, each H conductor 30 may be connected to one V/H multiplexers and three GH multiplexers per GOL.

H conductors 30 need not always be connected to multiplexers 100 in whole number ratios. For example, H conductors 30 may be connected on average to 1.6 V/H multiplexers in a given row of interconnection groups. This type of fractional interconnecting may be implemented by overlapping at least some of the connections between horizontal branch conductors 31 and H conductors 30. For example, each H conductor 30 may be connected to either one or two V/H multiplexers 100 in a row of interconnection groups (i.e., by connecting each H conductor 30 to either one or two horizontal branch conductors 31 associated with that row). Similarly, each H conductor 30 may connect to either two or three GH multiplexers 100 in a row of interconnection groups (i.e., by connecting each H conductor 30 to either two or three horizontal branch conductors 31 associated with that row). This interconnection scheme may be employed in GOL arrangements where the number of H conductors 30 associated with a row of interconnection groups is not a perfect multiple of the number of horizontal branch conductors 31 in that row.

For example, a given row of interconnection groups may be associated with a subset of 20 H conductors 30 and 32 V/H multiplexers 100. Each V/H multiplexer 100 may have one horizontal branch conductor 31. In this case, each of the 20 H conductors 30 may be connected to the 32 horizontal branch conductors 31 by overlapping 12 of the connections, i.e., 12 H conductors 30 are each connected to two horizontal branch conductors 31 and eight H conductors 30 are each connected to only one horizontal branch conductor 31. As a result, the subset of 20 H conductors 30 may be connected on average to 1.6 V/H multiplexers per row of interconnection groups.

As another example, a given row of interconnection groups may be associated with a subset of 20 H conductors 30 and 48 GH multiplexers 100, each with one horizontal branch conductor 31. In this case, each of the 20 H conductors 30 can connect to the 48 horizontal branch conductors 31 by overlapping all 20 of the connections, i.e., 12 H conductors 30 may each be connected to two horizontal branch conductors 31 and eight H conductors 30 may each be connected to three horizontal branch conductors 31. As a result, a subset of 20 H conductors 30 may be connected on average to 2.4 GH multiplexers per row of interconnection groups. This type of fractional overlapping may be used to ensure that at least some H conductors 30 have access to multiple V/H and GH interconnection groups 170 in a given row of LABs 50.

This fractional overlapping interconnection scheme between the sets of horizontal branch conductors 31 and H conductors 30 is preferably implemented in a random fashion. This may be done to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

Signals traveling on V conductors 40 can be turned to travel along H conductors 30, GH conductors 140, or other V conductors 40. Vertical branch-feeding conductors 42 are used to connect V conductors 40 to vertical branch conductors 41*a–e*, which in turn are connected to certain inputs of programmable multiplexers 100. A signal from a V conductor 40 can be turned onto an H conductor 30 by programming a multiplexer such as multiplexer 100*b* to apply the input signal received from one of vertical branch conductors 41*b* to V/H driver 101*b*. Programmable demultiplexer 102*a* receives the output signal from 101*b* and routes it to a selected H conductor 30. Demultiplexer 102*a* may also be programmed to route the selected signal to another V conductor 40. A signal from a V conductor 40 can be applied to a GH conductor 140 by programming a multiplexer such as multiplexer 100*a* to apply the input signal received from one of vertical branch conductors 41*a* to GH driver 101*a*. This allows signals from the inter-GOL V conductors 40 to be selectively brought into a GOL 20.

Figure 10:
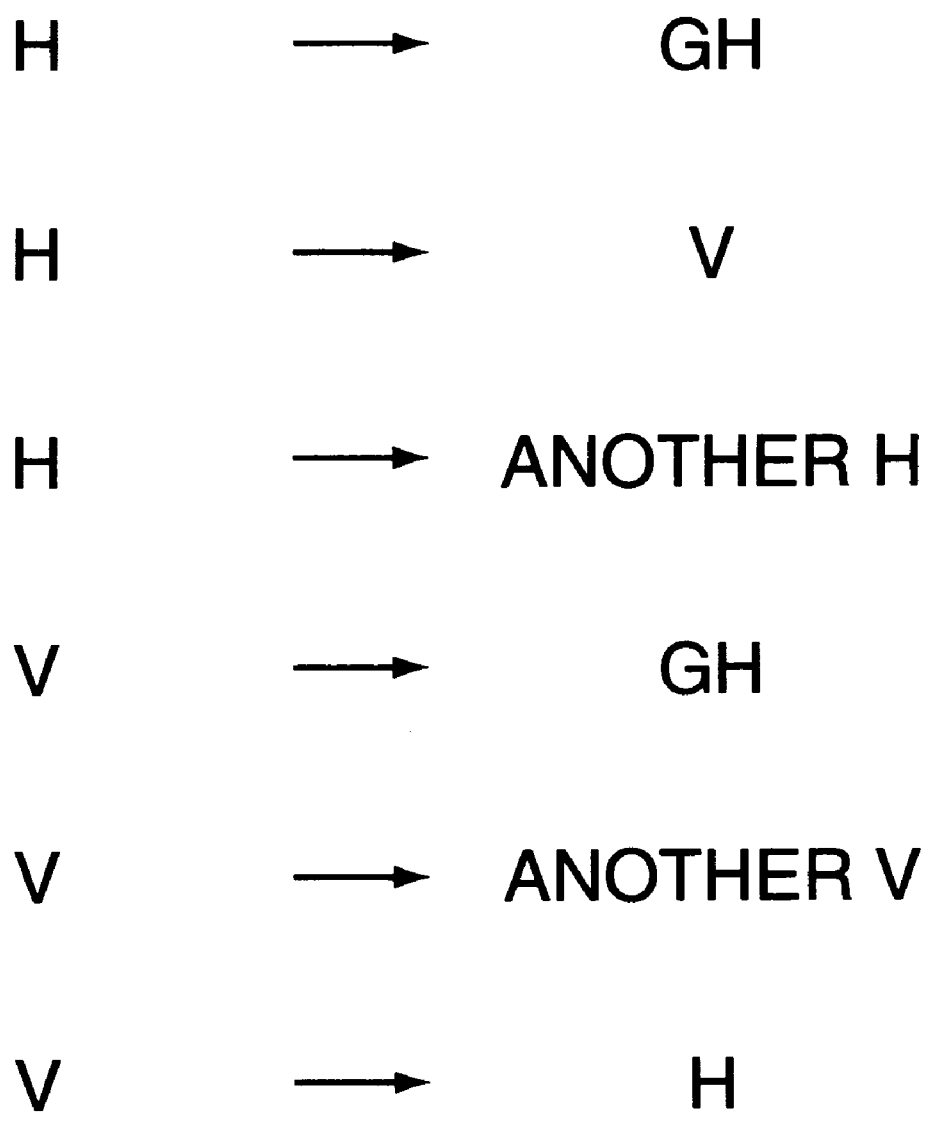

The turns supported by the driver arrangement of FIGS. 4*a* and 5 are summarized in the table of FIG. 10.

Connections between V conductors 40 and multiplexers 100 associated with a column of LABs 50 are generally equally distributed among the interconnection groups 170 associated with that column of LABs 50 by vertical branch-feeding conductors 42 and vertical branch conductors 41. Each set of vertical branch-feeding conductors 42 in a given LAB 50 may be connected to only a portion of the total number of V conductors 40 associated with that LAB 50 such that each V conductor 40 has access to at least two different sets of vertical branch-feeding conductors 42 within that LAB 50. This is illustrated in the interconnection diagram of FIG. 4*b*, which depicts a suitable interconnection arrangement between a set of 80 V conductors 40 (0–79) and five sets of vertical branch-feeding conductors 42*a*–42*e* of the interconnection groups 170 associated with a given LAB 50. Each set of vertical branch-feeding conductors 42 may contain multiple conductors, each of which is connected to a different one of the V conductors 40. For example, each set of vertical branch-feeding conductors 42 may contain 32 conductors.

Figure 4B:
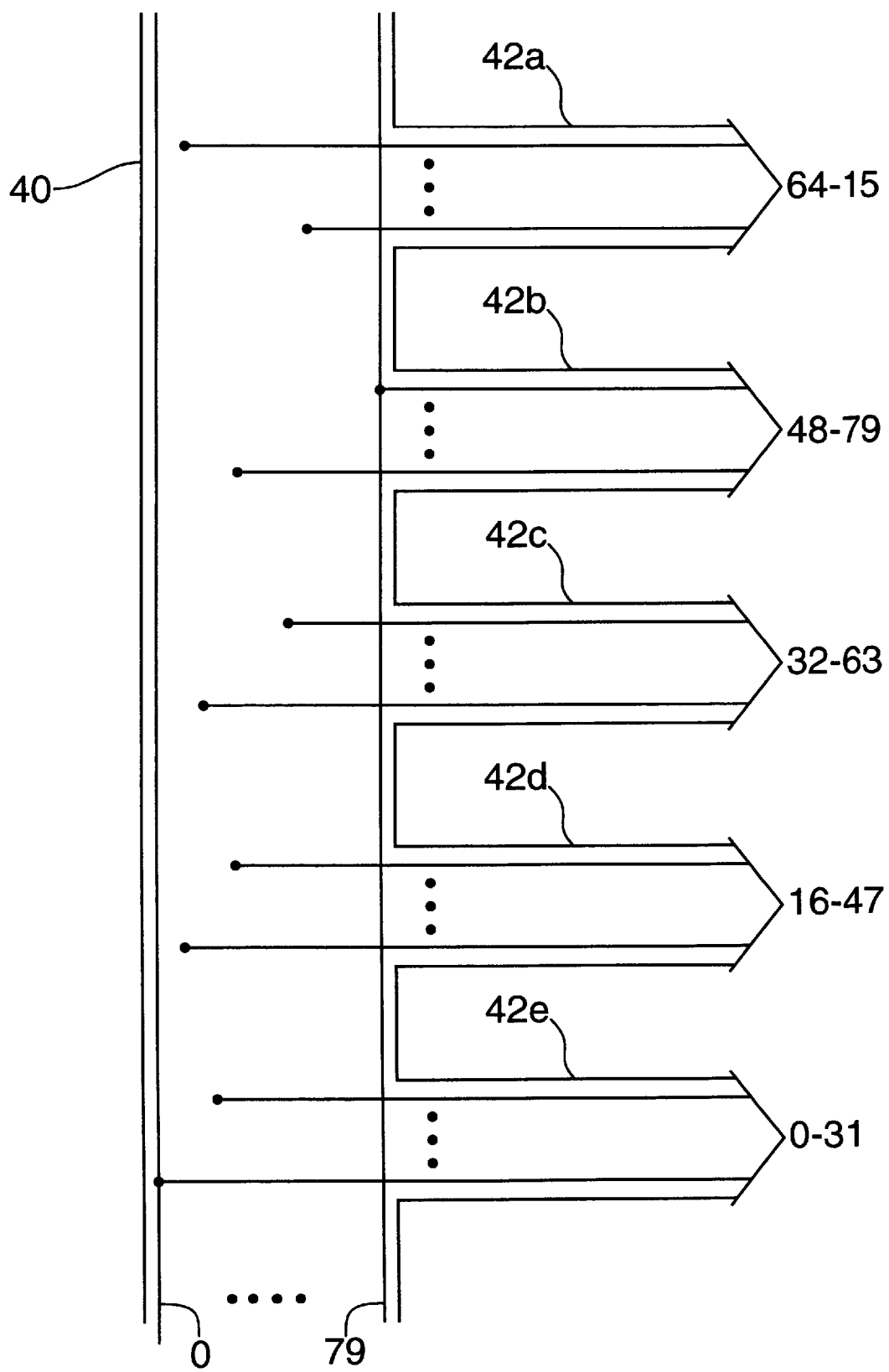
FIG. 4b is a diagram of an illustrative arrangement for interconnecting vertical inter-super-region conductors and vertical branch feeding-conductors in accordance with the present invention.

In FIG. 4*b*, each V conductor 40 is associated with a number from left to right, the left-most V 10 conductor 40 being conductor number 0 and the right-most V conductor 40 being conductor number 79. The number on the right hand side of each vertical branch-feeding conductor set 42 denotes which of the 80 V conductors 40 that set is connected to. For example, vertical branch-feeding conductor set 42*e* is connected to V conductors 40 numbered 0–31 (vertical branch-feeding conductor set 42*d* is connected to V conductors 40 numbered 16–47, etc.).

In the arrangement of FIG. 4*b*, the connections made between the sets of vertical branch-feeding conductors 42 and V conductors 40 preferably partially overlap. For example, conductors of branch-feeding conductor set 42*c* are connected to V conductors 40 numbered 32–63, whereas the conductors of branch-feeding conductor set 42*d* are connected to V conductors numbered 48–79. Both conductor sets 42*c* and 42*d* are connected to V conductors 40 numbered 48–63. This overlapping interconnection scheme increases signal routing flexibility by permitting signals traveling on 30 each V conductor 40 to be routed to multiple vertical branch-feeding conductor sets 42 within a given LAB 50, thus providing each signal with multiple pathways to different interconnection groups 170.

This overlapping interconnection scheme between the sets of vertical branch-feeding conductors 42 and V conductors 40 is preferably implemented in a random fashion. In FIG. 4b, interconnections are shown as being arranged in a somewhat orderly fashion to facilitate comprehension of the basic interconnection principle. In practice, these interconnections are randomly distributed in order to make the routing capability of each LAB 50 similar so that one LAB 50 is not greatly preferred over another when forming a particular pattern of interconnections. Distributing interconnections in this way reduces the number of special interconnection cases, making routing problems easier to solve.

Connections between vertical branch-feeding conductors sets 42 and GH vertical branch conductor sets 41a, 41c, and 41e associated with a given interconnection group 170 are typically arranged so that each GH branch conductor set 41 is connected to an approximately equal but different portion of the total number of conductors in a given set of vertical branch-feeding conductors 42. This is illustrated in the interconnection diagram of FIG. 4c, which depicts a suitable interconnection arrangement between a set of 32 vertical branch-feeding conductors 42 (0–31) and five vertical branch conductor sets 41a–41e of a given interconnection group 170. Each set of GH vertical branch conductors 41 may contain an approximately equal number of conductors, each of which is connected to a different one of the vertical branch-feeding conductors 42. For example, GH vertical branch conductor sets 42a and 42e may each contain 11 conductors and GH vertical branch conductor set 42c may contain 10 conductors.

Figure 4C:
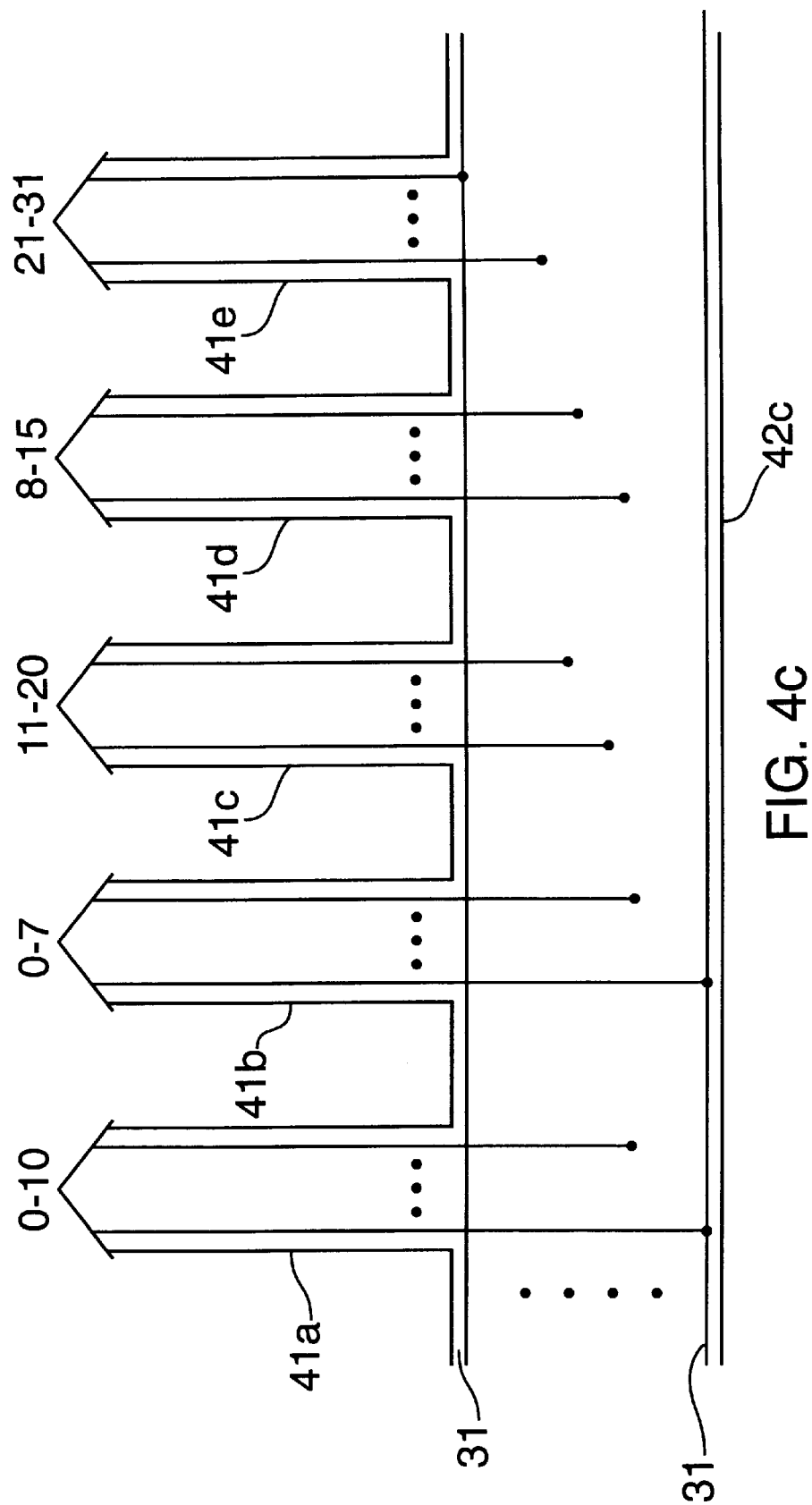
FIG. 4c is a diagram of an illustrative arrangement interconnecting vertical branch-feeding conductors and vertical branch conductors in accordance with the present invention.

In the arrangement of FIG. 4c, each vertical branch-feeding conductor 42 is associated with a number, the upper-most vertical branch-feeding conductor 42 being conductor number 31 and the lower-most vertical branch-feeding conductor being conductor number 0. The numbers above the vertical branch conductor sets 41 denote which of the 32 vertical branch-feeding conductors 42 each set is connected to. For example, vertical branch conductor set 41e is connected to vertical branch-feeding conductors 42 numbered 0–10 (vertical branch conductor set 41c is connected to vertical branch-feeding conductors 42 numbered 11–20, etc.).

In the arrangement of FIG. 4c, the VH vertical branch conductors 41b and 41d are preferably connected to only a portion of the total number of vertical branch-feeding conductors 42 associated with a given interconnection group, such that each V conductor 40 is connected to at least one of the VH vertical branch conductors 41 within a given LAB 50. This is partially illustrated in the interconnection diagram of FIG. 4c, which shows a typical interconnection arrangement between a set of 32 vertical branch-feeding conductors 42 (0–31) and two sets of eight (0–7 and 8–15) VH vertical branch conductors (41b and 41d) of a given interconnection group 170. V conductors 40 which are ultimately connected to the VH vertical branch conductors 41 (through vertical branch-feeding conductors 42) of a given interconnection group 170 are preferably not connected to the VH vertical branch conductors 41 of another interconnection group 170 within a given LAB 50. For example, in FIG. 4b, a V conductor 40 which ultimately connects to a VH branch conductor 41 through branch-feeding conductor set 42e preferably does not connect to another VH branch conductor 41 through other branch-feeding conductor sets (i.e. 42a–42d).

This interconnection scheme between the sets of vertical branch conductors 41 and vertical branch-feeding conductors 42 is preferably implemented in a random fashion. In FIG. 4c, interconnections are shown as being arranged in a somewhat orderly fashion to facilitate comprehension of the basic interconnection principle. In practice, these interconnections are randomly distributed to make the routing capability of each interconnection group 170 similar so that one interconnection group 170 is not greatly preferred over another when forming a particular pattern of interconnections. Distributing interconnections in this way reduces the number of special interconnection cases, making routing problems easier to solve.

Output signals from GH drivers such as drivers 100a, 100c, and 100e of FIG. 4a are applied directly to GH conductors 140, whereas output signals from V/H drivers such as drivers 101b and 101d are further applied to routing demultiplexers 102a and 102b to allow selective routing to one or more of several V conductors 40 and H conductors 30. The direct-drive capability of the GH drivers affords the GH conductors 140 a speed benefit, allowing communications between the LABs 50 and memory regions 51 in a given GOL 20 to be accomplished using GH conductors 140 without a significant time penalty. On the other hand, the V and H conductors 40 and 30 are long compared to the GH conductors 140 causing them to have a somewhat higher resistance and capacitance. As a result, there is less benefit in driving V and H conductors 40 and 30 directly. Driving V conductors 40 and H conductors 30 through a demultiplexer therefore provides a way to increase logic density without incurring significant incremental speed penalties. If desired, drivers 101a–101e may be programmably-controlled tri-state drivers, so that more than one such driver can be connected to a given one of conductors 30, 40, or 140.

As shown in FIG. 4a, signals from V and H conductors 40 and 30 and adjacent LABs N and N+1 are routed to GH, V, and H conductors 140, 40, and 30 through interconnection group 170 (i.e. drivers 101, multiplexers 100, and demultiplexers 102). In the arrangement of FIG. 4a, each logic element 70 has an associated interconnection group 170. The interconnection group 170 handles signals for the LAB 50 with which it is associated and handles signals for an adjacent LAB 50. For example, interconnection group 170 in FIG. 4a handles signals for LAB N+1 and adjacent LAB N. This arrangement allows logic elements 70 from two adjacent LABs 50 to have access to the same interconnection group 170. For example, each interconnection group 170 can be driven by four logic elements 70, two of which are from LAB N (70a and 70b) and two of which are from LAB N+1 (70c and 70d). The connections made by interconnection group 170 are arranged to avoid competition between the logic elements 70 in a LAB 50 for the same drivers. For example, a logic element 70 from LAB N can share GH and/or V/H drivers with logic elements 70 from LAB N+1, but not with another logic element 70 from LAB N. Logic elements 70 within a LAB 50 may share the resources of same interconnection group 170, but are preferably connected to different drivers within that group.

This arrangement is illustrated in FIG. 4a, where logic element 70a of LAB N and logic element 70d of LAB N+1 share GH and V/H drivers 101a and 101b, whereas logic element 70b of LAB N shares drivers 101d and 101e with logic element 70c of LAB N+1. The middle GH driver 101c is shared between logic element 70a of LAB N and logic element 70c of LAB N+1. The driver routing arrangement of FIG. 4a provides routing flexibility on PLD 10 while eliminating driver contention among the logic elements 70 in a LAB 50 by ensuring that the multiplexers 100 in a given interconnection group 170 do not receive output signals exclusively from any one LAB.

Interconnection groups 170 can be arranged in a variety of ways to allow signals access to different conductors types. In the FIG. 4a arrangement, multiplexers 100 allow signals from each interconnection group 170 to be connected to two V/H drivers 101b and 101d and three GH drivers 101a, 101c, and 101e. This arrangement is illustrative only and other such suitable arrangements may be used if desired. For example, interconnection groups 170 can be configured to include other even or odd combinations of GH and V/H drivers. Additional multiplexers and demultiplexers may be added to the interconnection group 170 in order to provide enhanced routing flexibility. Multiplexers 100 having a different number of inputs may be used to accommodate signals from a different number of conductors. Demultiplexers 102 having a different number of outputs may be used to direct signals to a different number of conductors.

FIG. 5 is an expanded view of FIG. 4a, illustrating a possible arrangement for the interconnection groups 170 in a GOL 20. As shown in FIG. 5, interconnection groups 170 are associated with adjacent LABs 50 (e.g., LABs N and N+1). FIG. 5 also shows how a memory region 51 associated with a row of LABs 50 may use an interconnection group 170 to route signals from memory blocks 52 to V conductors 40, H conductors 30, and GH conductors 140. Each logic element 70 is connected to two interconnection groups 170, one from the LAB 50 with which it is associated, and one from an adjacent LAB 50. In this way, a single interconnection group 170 is always connected to two different LABs 50. For example, interconnection group 170b is connected to LAB N and LAB N+1.

With the arrangement of FIG. 5, pairs of logic elements 70 from a given LAB 50 are connected to the same two interconnection groups 170. For example, LE0 and LE1 in LAB N are both connected to interconnection groups 170a and 170'b, LE2 and LE3 in LAB N are both connected to interconnection groups 170'c and 170d. Each logic element 70 may have access to a total of five drivers (three GH and two V/H drivers as shown in FIG. 4a), which are divided among two adjacent interconnection groups 170 so that one logic element 70 has access to three drivers in one interconnection group 170 (two GH drivers and one V/H driver) and two drivers in the other interconnection group (one GH driver and one V/H driver). However, logic elements 70 in the same LAB 50 are preferably connected to different sets of drivers within a given interconnection group 170. Although two logic elements 70 from a given LAB 50 may be connected to the same two interconnection groups 170, the connection patterns of the logic elements 70 in each group are not identical. For example, LE0 and LE1 of LAB N are connected to the same two interconnection groups, i.e., interconnection groups 170a and 170'b. LE1 is connected to two drivers in LAB N (one GH driver and one V/H driver). LE0 is connected to the other three drivers in LAB N (two GH drivers and one V/H driver) to avoid contention. LE1 is, therefore, connected to two drivers in LAB N while LE0 is connected to the other three drivers.

There are two interconnection group patterns that are used in the arrangement of FIG. 5: the pattern of interconnection groups 170, such as groups 170a and 170d (hereinafter "pattern one") and the pattern of interconnection groups 170', such as groups 170'b and 170'c (hereinafter "pattern two"). In the pattern one interconnection group, the two upper logic elements associated with that interconnection group are each connected to two GH drivers and one V/H driver in that group (e.g. LE2 in LABs N and N+1 connected to group 170d), whereas the lower two logic elements are each connected to only one GH driver and one V/H driver in the group (e.g. LE3 in LABs N and N+1 connected to group 170d). In a pattern two interconnection group, the situation is reversed: the upper two logic elements associated with that interconnection group are each connected to one GH driver and one V/H driver in the group (e.g. LE0 in LABs N and N+1 connected to group 170'b) and the lower two logic elements associated with the group are each connected to two GH drivers and one V/H driver (e.g. LE1 in LABs N and N+1 connected to group 170'b).

As shown in FIG. 5, interconnection groups 170 and 170' (patterns one and two respectively) may be alternated in a checkerboard fashion throughout a GOL 20. This makes the routing capability of each LAB 50 similar so that one LAB 50 is not greatly preferred over another when forming a particular pattern of interconnections. Distributing resources in this way reduces the number of special interconnection cases, making routing problems easier to solve.

The illustrative embodiment shown in FIG. 6 provides an alternate interconnection arrangement for selectively routing signals from logic elements 70 and H and V conductors 30 and 40 to the H, V, and GH conductors 30, 40 and 140 associated with adjacent LABs N and N+1. This is accomplished by a set of interconnection groups 200 that are associated with each logic element 70 of a given LAB 50. Two types of interconnection groups 200 are shown in FIG. 6: GH interconnection groups 200a and 200c (i.e. multiplexers 1100, multiplexers 1103, and drivers 1101) and V/H interconnection groups 200b and 200d (i.e. multiplexers 1100, demultiplexers 1102, and drivers 1101). Each logic element 70 in a given LAB 50 may be associated with two interconnection groups 200. For example, a logic element 70 may be associated with one V/H interconnection group 200 and one GH interconnection group 200. Each GH interconnection group 200a or 200c can handle signals for the LAB 50 with which it is associated along with signals from two adjacent LABs 50. Each V/H interconnection group 200b or 200d can handle signals for the LAB 50 with which it is associated along with signals from an adjacent LAB 50. This arrangement allows logic elements 70 from adjacent LABs 50 to have access to the same interconnection groups 200. For example, each interconnection group 200 can be driven by at least two logic elements 70, one from LAB N (70a) and one from LAB N+1 (70b).

Signals from logic elements 70 and H and V conductors 30 and 40 are applied to certain inputs of the interconnection groups 200 to provide each signal with a number of possible paths to each conductor type. This is accomplished by a set programmable multiplexers that select from among these input signals and apply the selected signals to the desired conductors. For example, in a GH interconnection group such as 200a, signals from logic element 70a, H conductors 30, and V conductors 40 are applied to certain inputs of multiplexers 1100a and 110b. Programmable multiplexers 1100 select from among these input signals and allow the selected signals to pass as outputs to programmable swap multiplexers 1103. Swap multiplexers such as 1103a and 1103b then select from among these input signals and signals received from other GH interconnection groups 200 associated with adjacent LABs 50 (e.g. LABs N−1 (not shown) and N+1). This is shown in FIG. 6 where swap multiplexers 1103 are connected to multiplexers 1100 of adjacent GH interconnection groups 200 by inter-LAB swap conductors 201a–201f. The selected signals are allowed to pass as outputs to the appropriate conductors, preferably using driver buffers such as GH driver buffers 1101. Connections to swap multiplexers 1103 are typically configured to avoid competition between the logic elements 70 in a given LAB 50 for the same drivers. For example, logic element 70a from LAB N can share GH drivers via swap multiplexers 102 with logic elements 70 from LAB N+1 and N−1 (not shown) but preferably not with another logic element 70 from LAB N. This eliminates driver contention among the logic elements 70 in a LAB 50 by ensuring that the multiplexers in a given GH interconnection group 200 do not receive output signals exclusively from any one LAB 50.

In a V/H interconnection group such as 200b, signals from logic element 70a of LAB N and logic element 70b of adjacent LAB N+1 are applied to certain inputs of multiplexer 1100c along with signals from H conductors 30 and V conductors 40. Programmable multiplexers 1100 select from among such input signals and may allow the selected signals to pass as outputs to programmable routing demultiplexers such as 1102a of group 200b, preferably using driver buffers such as V/H driver buffer 1101c of group 200b. Routing demultiplexers 1102 may then connect the selected signals to the desired H or V conductors 30 and 40. For example, demultiplexer 1102a could be programmed to connect signals to either the V or H conductors 40 and 30.

Connections to multiplexers 1100 are configured to avoid competition between the logic elements 70 in a given LAB 50 for the same drivers. For example, logic elements 70 of a given LAB 50 can share V/H interconnection groups 200 with logic elements 70 from an adjacent LAB 50 (via conductors 202a–202c), but preferably not with another logic element 70 from that LAB. This eliminates competition for drivers among the logic elements 70 in a LAB 50 by ensuring that the multiplexers in a given V/H interconnection group 200 do not receive output signals exclusively from any one LAB 50.

Using GH and V/H interconnection groups 200 allows signals from V and H conductors 30 and 40 and outputs from multiple logic elements 70 to share direct access to H, V and GH conductors 30, 40 and 140 (i.e. access that does not involve passing through intermediate conductors).

FIG. 6 also shows driver circuitry that may be used to convey output signals from logic elements 70 to local branch conductors 160. Communication on the local level may be accomplished by selectively connecting each logic element 70 to local branch conductors 160 via dedicated local drivers 151.

Signals traveling on H conductors 30 can be turned to travel along V conductors 40, GH conductors 140, or other H conductors 30. Horizontal branch conductors 31a'–31f' are provided to allow certain H conductors 30 to be connected to the inputs of programmable multiplexers 1100. A signal from an H conductor 30 can be turned to a V conductor 40 by programming a multiplexer such as multiplexer 1100c to apply input signals received from one of horizontal branch conductors 31c' to V/H driver 1101c. Demultiplexer 1102a receives the output signals from V/H driver 1101c and applies them to selected V conductors 40. Demultiplexer 1102a may also be programmed to apply selected signals to other H conductors 30. Signals from H conductors 30 can be turned onto GH conductors 140 by programming a multiplexer such as multiplexer 1100b to apply input signals received from one of horizontal branch conductors 31b' to swap multiplexer 1103b. Swap multiplexer 1103b may then be programmed to apply signals received from multiplexer 1100b to GH driver 101b. Swap multiplexer 1103b may also be programmed to apply signals from H conductors 30 received from an adjacent GH interconnection group (via conductor 201b) to GH driver 1101b. This allows signals from the inter-GOL H conductors 30 to be selectively brought into a GOL 20.

Connections between H conductors 30 and multiplexers 1100 associated with a row of LABs 50 are distributed among the interconnection groups 200 associated with that row by horizontal branch conductors 31'. Each horizontal branch conductor 31' may be connected to a different one of H conductors 30 associated with a given row of LABs 50. For example, a given row of LABs may include 16 LABs 50, each of which may be associated with one GH and one V/H interconnection group 200. Each GH interconnection group 200 may contain two multiplexers 1100 and each V/H interconnection group 200 may contain one multiplexer 1100 (for a total of 48 multiplexers 1100 associated with that row of LABs, 32 in GH interconnection groups and 16 in V/H interconnection groups). A set of 48 H conductors 30 may be associated with that row, each H conductor 30 being connected to a different multiplexer 1100 by a horizontal branch conductors 31'. Horizontal branch conductors 31' may be arranged in this way to avoid competition between the H conductors 30 associated with a given row of LABs for the same drivers.

In certain GOL arrangements, however, the number of available multiplexers 1100 in a given row of LABs 50 may exceed the number of H conductors 30 associated with that row. For example, each LAB 50 may include multiple GH and V/H interconnection groups 200, each of which may have one or more multiplexers 1100. LABs of this type may be arranged in a row so that multiple rows of interconnection groups 200 are created within that row of LABs. For example, in FIG. 5, interconnection groups 170a, 170'b, and 170c from LABs N, N+1, and memory region 51 are arranged such that they form a row of interconnection groups within a row of LABs. LABs containing interconnection groups 200 may be arranged in a similar fashion so that each interconnection group 200 is associated with a particular row of interconnection groups.

As described above, a set of multiple H conductors 30 may be associated with that row of LABs. This set of H conductors 30 may be divided into subsets so that each of the subsets may be associated with a different one of the multiple rows of interconnection groups 200. This is illustrated in FIG. 5 which shows how subsets of H conductors 30 may be associated with a different row of interconnection groups. In a particular GOL arrangement, a given row of LABs 50 may have ten rows of interconnection groups 200. A set of 100 H conductors 30 may be associated with that row of LABs, which is divided into ten subsets of ten. Each of these subsets may be associated with a different one of the ten rows of interconnection groups 200. In GOL arrangements having a row of 16 LABs, a total of 48 multiplexers 1100 may be associated with a given row of interconnection groups, 32 in GH interconnection groups and 16 in V/H interconnection groups. In this case, the H conductors 30 associated with a given row of interconnection groups may be connected to multiple different multiplexers 1100 in that row. For example, each H conductor 30 may be connected to three GH multiplexers 1100 and one V/H multiplexer 1100 in that row.

Subsets of H conductors 30 need not always be connected to multiplexers 1100 in whole number ratios. For example, a subset of H conductors 30 may be connected to an average of 1.6 V/H multiplexers in a given row of interconnection groups. This type of fractional interconnecting may be implemented by overlapping at least some of the connections between horizontal branch conductors 31' and H conductors 30. For example, each H conductor 30 may be connected to either one or two V/H multiplexers 1100 in a row of interconnection groups (i.e., by connecting each H conductor 30 to either one or two horizontal branch conductors 31' associated with that row). Similarly, each H conductor 30 may be connected to either two or three GH multiplexers 1100 in a row of interconnection groups (i.e., by connecting each H conductor 30 to either two or three horizontal branch conductors 31' associated with that row). This interconnection scheme may be employed in GOL arrangements where the number of H conductors 30 associated with a row of interconnection groups is not a perfect multiple of the number of horizontal branch conductors 31' in that row.

For example, a given row of interconnection groups may be associated with a subset of ten H conductors 30 and 16 V/H multiplexers 1100, each with one horizontal branch conductor 31'. In this case, each of the ten H conductors 30 can be connected to the 16 horizontal branch conductors 31' by overlapping six of the connections, i.e., six H conductors 30 may be connected to two horizontal branch conductors 31' and four H conductors 30 may be connected to only one horizontal branch conductor 31'. Consequently, the subset of ten H conductors 30 may be connected on average to 1.6 V/H multiplexers per row of interconnection groups.

This row of interconnection groups may also be associated with 32 GH multiplexers 1100, each with one horizontal branch conductor 31'. In this case, each of the ten H conductors 30 can be connected to the 32 horizontal branch conductors 31' by overlapping all ten of the connections, i.e., eight H conductors 30 may each be connected to three horizontal branch conductors 31' and two H conductors 30 may each be connected to four horizontal branch conductors 31'. Consequently, the subset of ten H conductors 30 may be connected on average to 3.2 V/H multiplexers per row of interconnection groups. This type of fractional overlapping may be used to ensure that at least some H conductors 30 have access to multiple V/H and GH interconnection groups 200 in a given row of LABs 50.

This fractional overlapping interconnection scheme between the sets of horizontal branch conductors 31' and H conductors 30 is preferably implemented in a random fashion. This is done in order to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

Signals traveling on V conductors 40 can be turned to travel along H conductors 30, GH conductors 140, or other V conductors 40. Vertical branch conductors 41a'–41f' are provided to connect V conductors 40 to certain inputs of programmable multiplexers 1100. Signals from V conductors 40 can be turned onto H conductors 30 by programming a multiplexer such as multiplexer 1100f to apply the input signals received from one of vertical branch conductors 41f' to V/H driver 1101f. Demultiplexer 1102b receives the output signal from 1101f and routes it to selected H conductors 30. Demultiplexer 1102b may also be programmed to apply the selected signals to other V conductors 40. A signal from a V conductor 40 can be applied to a GH conductor 140 by programming a multiplexer such as multiplexer 1100e to apply the input signals received from one of vertical branch conductors 41d' to swap multiplexer 1103d. Swap multiplexer 1103d may then be programmed to apply signals received from multiplexer 1100e to GH driver 1101e. Swap multiplexer 1103d may also be programmed to apply signals from V conductors 40 received from an adjacent GH interconnection group (via conductor 201f) to GH driver 1101e. This allows signals from the inter-GOL V conductors 40 to be selectively brought into a GOL 20.

A memory region 51 (FIG. 5) in the same row as a given LAB 50 is preferably interconnected to the conductors associated with that row using a comparable driver arrangement.

The turns supported by the driver arrangement of FIG. 6 are summarized in the table of FIG. 10.

Connections between V conductors 40 and multiplexers 1100 associated with a column of LABs 50 are distributed among the GH and V/H interconnection groups 200 associated with that column of LABs by vertical branch conductors 41'. Each set of vertical branch conductors 41' in a given LAB 50 may be connected to only a portion of the total number of V conductors 40 associated with that LAB 50 such that each V conductor 40 has access to at least two different GH interconnection groups and one V/H interconnection group within that LAB 50. This is illustrated in the interconnection diagram of FIG. 6b, which is a partial depiction of a suitable interconnection arrangement between a set of 80 V conductors 40 (0–79) and the sets of vertical branch conductors 41a'–41l of the GH and V/H interconnection groups 200 associated with a given LAB 50. Each set of vertical branch conductors 41' may contain multiple conductors, each of which is connected to a different one of the V conductors 40. For example, each vertical branch conductor set 41' may include eight conductors.

Figure 6A:
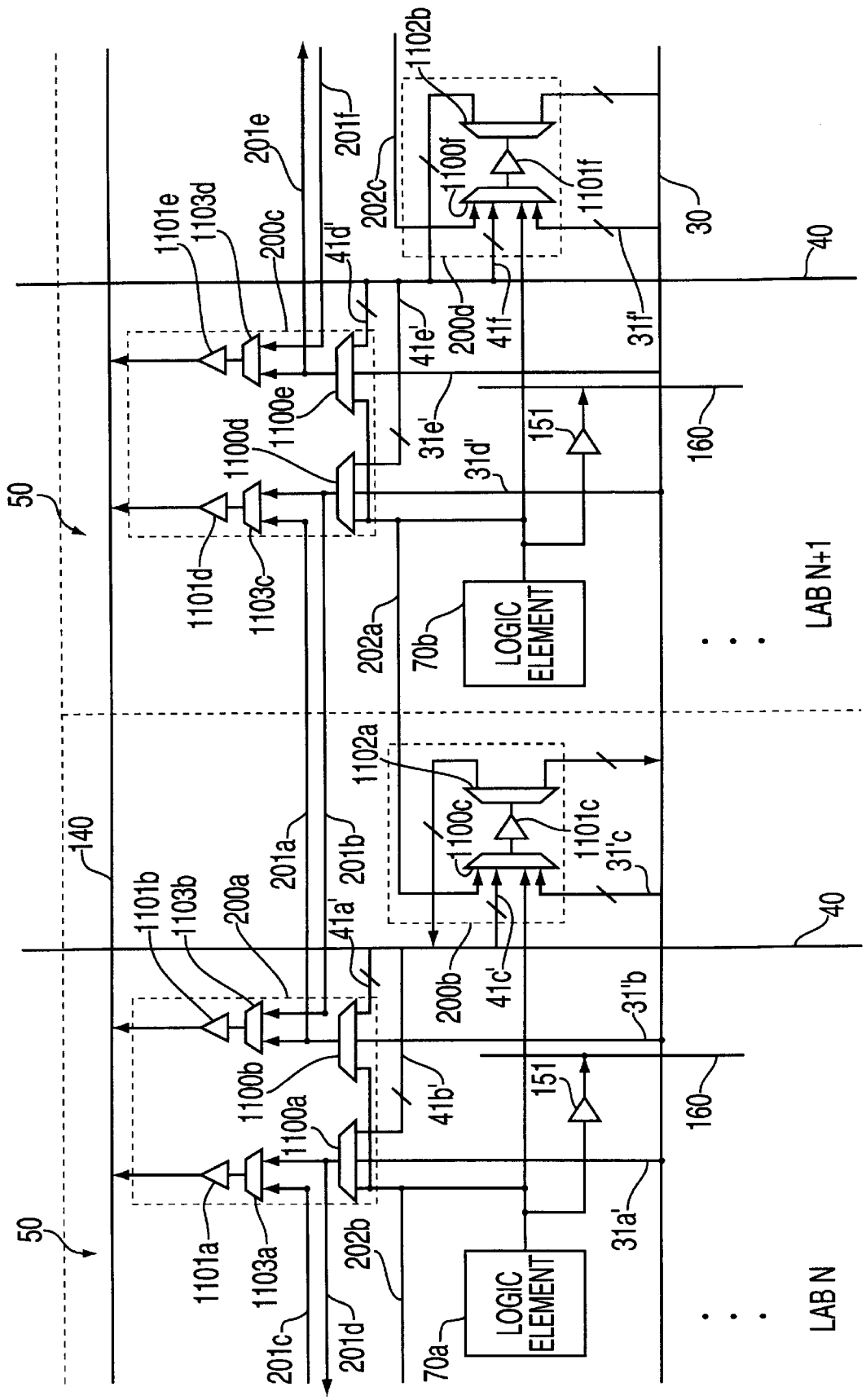
FIG. 6a is a diagram of another illustrative interconnection group accordance with the present invention.
Figure 6B:
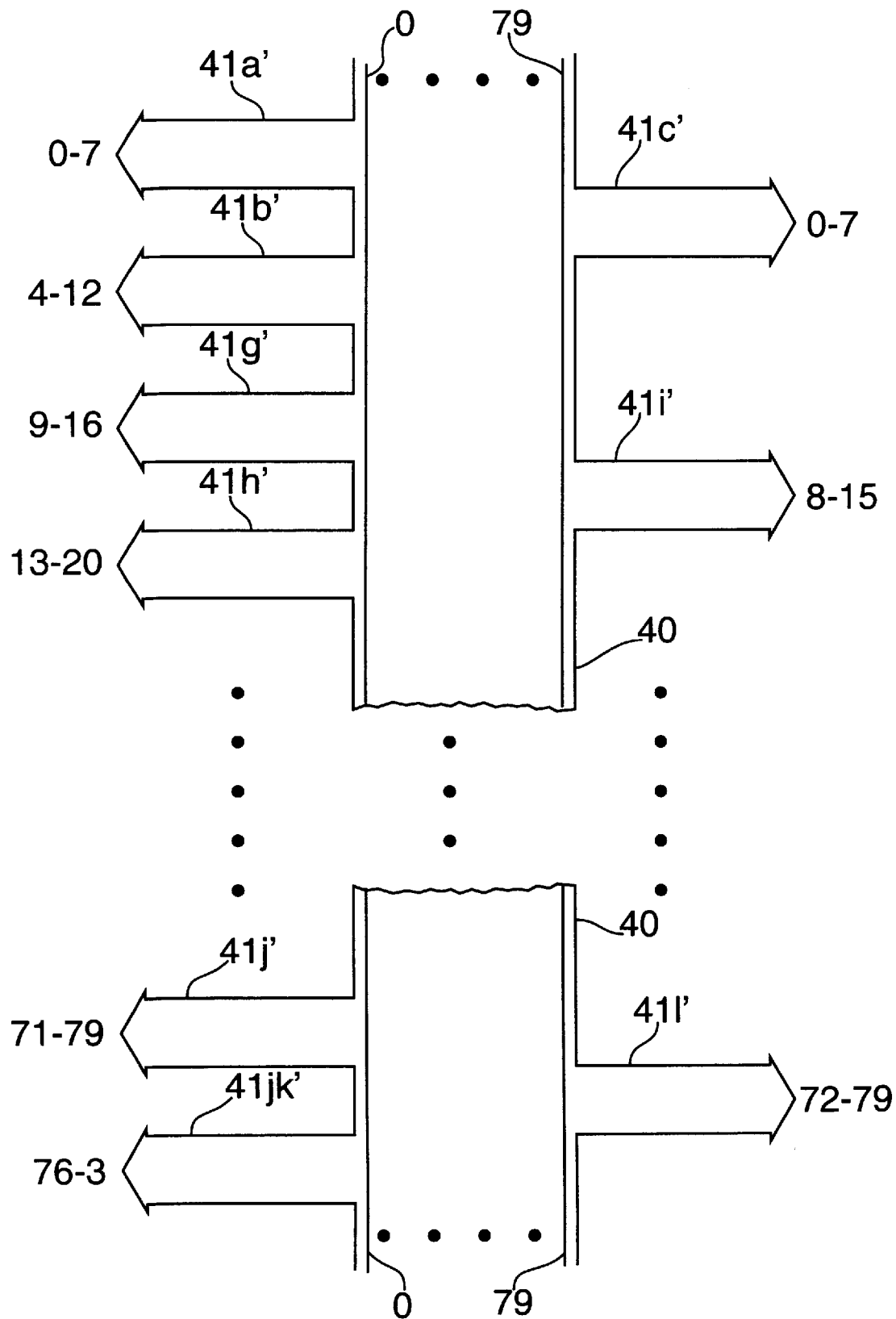
FIG. 6b is a diagram of an illustrative arrangement for interconnecting vertical inter-super-region conductors and vertical branch conductors in accordance with the present invention.

In FIG. 6b, each V conductor 40 is associated with a number from left to right, the left-most V conductor 40 being conductor number 0 and the right-most V conductor 40 being conductor number 79. The numbers associated with each vertical branch conductor sets 41' denotes which of the 80 V conductors 40 that set is connected to. For example, vertical branch conductor set 41a' is connected to V conductors 40 numbered 0–7 (vertical branch conductor set 41i' is connected to V conductors 40 numbered 8–15, etc.).

In the arrangement of FIG. 6b, the vertical branch conductor sets 41' pointed toward the left may be associated with the GH interconnection groups in a given LAB and are sometimes referred to herein as GH vertical branch conductors 41'. Connections made between the sets of GH vertical branch conductors 41' and V conductors 40 preferably partially overlap. For example, conductors of branch conductor set 41a' are connected to V conductors 40 numbered 0–7, whereas the conductors of branch conductor set 41b' are connected to V conductors numbered 4–12. Both conductor sets 41a' and 41b' are connected to V conductors 40 numbered 4–7. This overlapping interconnection scheme increases signal routing flexibility by permitting signals traveling on each V conductor 40 to be routed to multiple (and preferably different) GH interconnection groups 200 within a given LAB 50.

This overlapping interconnection scheme between the sets of GH vertical branch conductors 41' and V conductors 40 is preferably implemented in a random fashion. In FIG. 6b, interconnections are shown as being arranged in a somewhat orderly fashion to facilitate comprehension of the basic interconnection principle. In practice, these interconnections are randomly distributed to make the routing capability of each LAB 50 similar so that one LAB 50 is not greatly preferred over another when forming a particular pattern of interconnections. Distributing interconnections in this way reduces the number of special interconnection cases, making routing problems easier to solve.

In the arrangement of FIG. 6b, the vertical branch conductor sets 41' pointed toward the right may be associated with the V/H interconnection groups in a given LAB and are sometimes referred to herein as V/H vertical branch conductors 41'. Connections are made between the sets of V/H vertical branch conductors 41' and V conductors 40 such that each V/H branch conductor 41' may be connected to a different one of the V conductors 40 within a given LAB.

For example, conductors of V/H branch conductor set 41c' may be connected to V conductors 40 numbered 0–7, whereas the conductors of branch conductor set 41b' may be connected to V conductors numbered 8–15, etc. This mutually exclusive interconnection scheme permits signals traveling on each V conductor 40 to be routed to a V/H interconnection group 200 within a given LAB 50. This provides these signals with direct access to other V conductors 40 and H conductors 30 within that LAB (i.e., without having to pass through intermediate intra-GOL conductors).

The mutually exclusive interconnection scheme between the sets of V/H vertical branch conductors 41' and V conductors 40 is preferably implemented in a random fashion. In FIG. 6b, interconnections are shown as being arranged in a somewhat orderly fashion to facilitate comprehension of the basic interconnection principle. In practice, these interconnections are randomly distributed in order to make the routing capability of each LAB 50 similar so that one LAB 50 is not greatly preferred over another when forming a particular pattern of interconnections. Distributing interconnections in this way reduces the number of special interconnection cases, making routing problems easier to solve.

The number of conductors in each vertical branch conductor set 41' may be determined by the number of vertical branch conductor sets 41', logic elements 70, and V conductors 40 associated with a given LAB. For example, a given LAB may have 10 logic elements 70 and 80 associated V conductors 40. Each logic element 70 may be associated with one GH interconnection group having two sets of vertical branch conductors 41' and one V/H interconnection group having one vertical branch conductor set 41'. In this case, a given LAB may have a total of 10 sets of V/H vertical branch conductors 41'. If it is desired to equally connect the V conductors 40 to the sets V/H branch conductors 41' such that each V conductor 40 connects to a different V/H vertical branch conductor 41', then the number of V conductors 40 may be divided by the number V/H branch conductor sets 41' to determine the number of branch conductors required in each set. For example, 80 V conductors 40 divided by 10 V/H branch conductors sets 41' equals eight conductors per V/H conductor set 41'. A similar technique may be employed to determine the number of conductors in a GH vertical branch conductor set 41'. For example, if it is desired to equally distribute the 80 V conductors 40 among the 20 sets of GH branch conductors 41' such that each V conductor 40 connects to at least two different GH vertical branch conductors 41', then the number of V conductors 40 multiplied by the desired number of different connections may be divided by the number GH branch conductor sets 41' to determine the number of branch conductors required in each set. For example, 80 V conductors 40 multiplied by two connections divided by 20 V/H branch conductors sets 41' equals eight conductors per GH conductor set 41'.

Interconnection groups 200 can be configured in a variety of ways to allow signals access to different conductors types. In the FIG. 6 arrangement, drivers and multiplexers allow signals from each V/H interconnection group 200b or 200d to be connected to one V/H driver 1101 and signals from each GH interconnection group 200a or 200c to be connected to two GH drivers 1101. These arrangements are illustrative only and other such suitable arrangements may be used if desired. For example, V/H interconnection groups 200b and 200d can be configured to include other even or odd combinations of V/H drivers 1101 and routing demultiplexers 1102. Routing demultiplexers 1102 having a different number of outputs may be used for selectively routing signals to a different number of conductors. Similarly, GH interconnection groups 200a and 200c can be configured to include other even or odd combinations of GH drivers 1101 and swap multiplexers 1103. Additional multiplexers may be added to interconnection groups 200 in order to provide enhanced routing flexibility. Multiplexers 1100 having a different number of inputs may be used to accommodate signals from a different number of conductors. If desired, V/H and GH drivers 1101 may be programmably-controlled tri-state drivers, so that more than one such driver can be connected to a given one of conductors 30, 40, or 140.

As shown in FIG. 6, interconnection groups 200 are preferably associated with a particular logic element 70 of a given LAB 50. As a result, the interconnection shown in FIG. 6 may be repeated for all LABs 50 in a given PLD 10.

The illustrative embodiment shown in FIG. 7 provides an interconnection arrangement for selectively routing signals from individual logic elements 70 and H and V conductors 30 and 40 to the H, V, and GH conductors 30, 40, and 140 associated with a particular LAB 50. This is accomplished by a set of interconnection groups 300 (including e.g., multiplexers 2100, demultiplexers 2102, and drivers 2101) that are associated with the logic elements 70 of a LAB 50. As shown in FIG. 7, each logic element 70 may be associated with two such interconnection groups 300. Signals from logic element 70 and H and V conductors 30 and 40 are applied to certain inputs of interconnection groups 300. Programmable multiplexers 2100 select from among these input signals and apply the selected signals to programmable routing demultiplexers 2102, preferably using driver buffers such as GH/V driver buffer 2101a and GH/H driver buffer 2101b. Demultiplexers 2102 receive the buffered output signals and direct them to the desired conductors. For example, demultiplexer 2102a of interconnection group 300a may be programmed to connect signals to either the V or GH conductors 40 and 140 and demultiplexer 2102b of interconnection group 300b may be programmed to connect signals to either the H or GH conductors 30 and 140. In this way, signals from V and H conductors 30 and 40 and outputs 90 from logic element 70 can share direct access to H, V, and GH conductors 30, 40, and 140 without having to pass through intermediate conductors.

FIG. 7 also shows driver circuitry that may be used to convey output signals from logic element 70 to local branch conductors 160. Communication on the local level may be accomplished by selectively connecting each logic element 70 to local branch conductors 160 via dedicated local drivers 152.

Signals traveling on H conductors 30 can be turned to travel along V conductors 40 or GH conductors 140 by a GH/V interconnection group such as interconnection group 300a. For example, signals from an H conductor 30 can be turned to a V conductor 40 by programming multiplexer 2100a of interconnection group 300a to apply the input signal received from one of horizontal branch conductors 32 to GH/V driver 2101a. Demultiplexer 2102a receives the output signal from GH/V driver 2101a and applies it to a selected V conductor 40. Demultiplexer 2102a may also be programmed to apply the output signal to a selected GH conductor 140. This allows signals from the inter-GOL H conductors 30 to be selectively brought into a GOL 20.

Connections between H conductors 30 and the multiplexers 2100 associated with a row of LABs 50 are generally equally distributed among the GH/V interconnection groups 300 associated with that row by horizontal branch conductors 32. Each horizontal branch conductor 32 in a row of LABs 50 may be connected to a different one of the H conductors 30 associated with that row of LABs. For example, a row of LABs may include 16 LABs 50 and a memory region 51, each of which may be associated with one GH/V and one GH/H interconnection group 300. Each GH/V interconnection group 300 may contain a multiplexer 2100 which may be connected to a different one of the H conductors 30 (for a total of 16 multiplexers 2100 associated with that row of LABs). A set of 16 H conductors 30 may be associated with the row, and each H conductor 30 may be connected to a different multiplexer 2100 by a horizontal branch conductor 32. Horizontal branch conductors 32 can be arranged in this way to avoid competition between the H conductors 30 associated with a given row of LABs for the same drivers.

In certain GOL arrangements, however, each LAB 50 may include multiple GH/V and GH/H interconnection groups 300, each of which may have one or more multiplexers 2100. LABs 50 organized in this way may be arranged so that are multiple rows of interconnection groups 300 within that row of LABs. For example, in FIG. 5, interconnection groups 170a, 170'b, and 170c from LABs N, N+1, and memory region 51 are arranged such that they form a row of interconnection groups within a row of LABs. A row of LABs having interconnection groups such as interconnection groups 300 may be arranged in a similar fashion. This type of arrangement may be repeated for all of the interconnection groups within that row of LABs so that each interconnection group 300 is associated with a particular row of interconnection groups.

As described above, a set of multiple H conductors 30 may be associated with a given row of LABs. This set of multiple H conductors 30 may be divided into subsets so that each of the subsets may be associated with a different one of the multiple rows of interconnection groups 300. This is illustrated in FIG. 5. In one suitable GOL arrangement, a row of LABs 50 may have ten rows of interconnection groups 300. A set of 100 H conductors 30 associated with that row of LABs may be divided into ten subsets of ten. Each of these subsets of ten H conductors 30 may be associated with a different one of the ten rows of interconnection groups 300. In GOL arrangements having a row of 16 LABs, a total of 16 multiplexers 2100 may be associated with that row in GH/V interconnection groups 300. Each vertical branch conductor set 32 may contain multiple conductors so that each H conductor 30 may be connected to multiple different multiplexers 2100 in that row of GH/V interconnection groups 300. For example, each vertical branch conductor 32 set may contain two conductors so that each H conductor 30 may be connected to two different GH/V multiplexer 2100, each preferably being in a different GH/V interconnection group 300. Distributing H conductors 30 in this way improves routing flexibility within a given GOL 20 by providing signals traveling on each H conductor 30 with pathways to multiple GH/V interconnection groups 300.

H conductors 30 need not always be connected to multiplexers 2100 in whole number ratios. For example, a subset of H conductors 30 may be connected on to an average of 3.2 GH/V multiplexers in a given row of interconnection groups. This type of fractional interconnecting may be implemented by overlapping at least some of the connections between horizontal branch conductors 32 and H conductors 30. For example, each H conductor 30 may be connected to either three or four GH/V multiplexers 2100 in a row of interconnection groups (i.e., by connecting each H conductor 30 to either three or four horizontal branch conductors 32 associated with that row). This interconnection scheme may be employed in GOL arrangements where the number of H conductors 30 associated with a row of interconnection groups is not a perfect multiple of the number of horizontal branch conductors 32 in that row.

For example, a given row of interconnection groups may be associated with a subset of ten H conductors 30 and 16 GH/V multiplexers 2100. Each multiplexer 2100 may have two horizontal branch conductors 32. In this case, each of the ten H conductors 30 can be connected to the 32 horizontal branch conductors 32 by overlapping all ten of the connections, i.e., eight H conductors 30 may each connect to three horizontal branch conductors 32 and two H conductors 30 may each connect to four horizontal branch conductors 32. Consequently, the subset of ten H conductors 30 may be connected on average to 3.2 GH/V multiplexers 2100 per row of interconnection groups. This type of fractional overlapping may be used to ensure that each H conductor 30 has access to multiple GH/V interconnection groups 300 in a given row of LABs 50.

This fractional overlapping interconnection scheme between the sets of horizontal branch conductors 32 and H conductors 30 is preferably implemented in a random fashion. This may be done to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

Signals traveling on V conductors 40 can be turned to travel along H conductors 30 or GH conductors 140 by a GH/H interconnection group such as interconnection group 300b. For example, signals from a V conductor 40 can be turned onto an H conductor 30 by programming a multiplexer such as multiplexer 2100b of interconnection group 300b to apply the input signal received from one of vertical branch conductors 42 to GH/H driver 2101b. Demultiplexer 2102b receives the output signal from 2101b and applies it to a selected H conductor 30. Demultiplexer 2102b may also be programmed to apply the output signal to a selected GH conductor 140. This allows signals from the inter-GOL V conductors 40 to be selectively brought into a GOL 20.

A memory region 51 (FIG. 5) in the same row as a given LAB 50 is preferably interconnected to the conductors associated with that row using a comparable driver arrangement.

Figure 11:
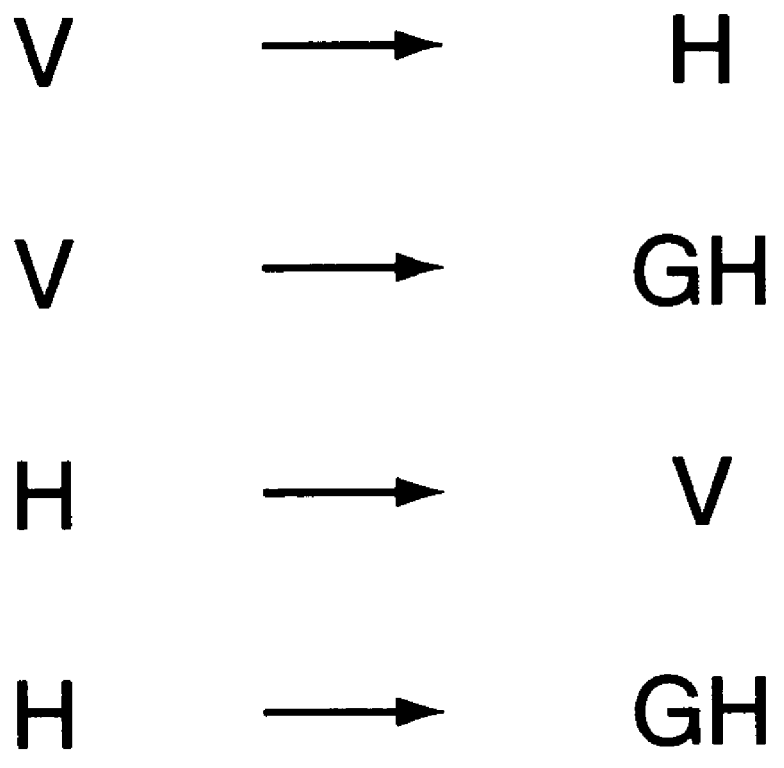

The turns supported by the driver arrangement of FIG. 7 are summarized in the table of FIG. 11.

Connections between V conductors 40 and multiplexers 2100 associated with a LAB 50 are generally evenly distributed among the GH/H interconnection groups 300 associated with that LAB by vertical branch conductors 43. Each set of vertical branch conductors 43 in a given LAB 50 may be connected to only a portion of the total number of V conductors 40 associated with that LAB 50 so that each V conductor 40 has access to at least two different GH/H interconnection groups within that LAB 50. This is illustrated in the interconnection diagram of FIG. 7b, which is a partial depiction of a suitable interconnection arrangement between a set of 80 V conductors 40 (0–79) and the sets of vertical branch conductors 43a–43j of the GH/H interconnection groups 300 associated with a given LAB 50. Each set of vertical branch conductors 43 may contain multiple conductors, each of which may be connected to a different one of the V conductors 40. For example, each vertical branch conductor set 43 may include 16 conductors.

Figure 7B:
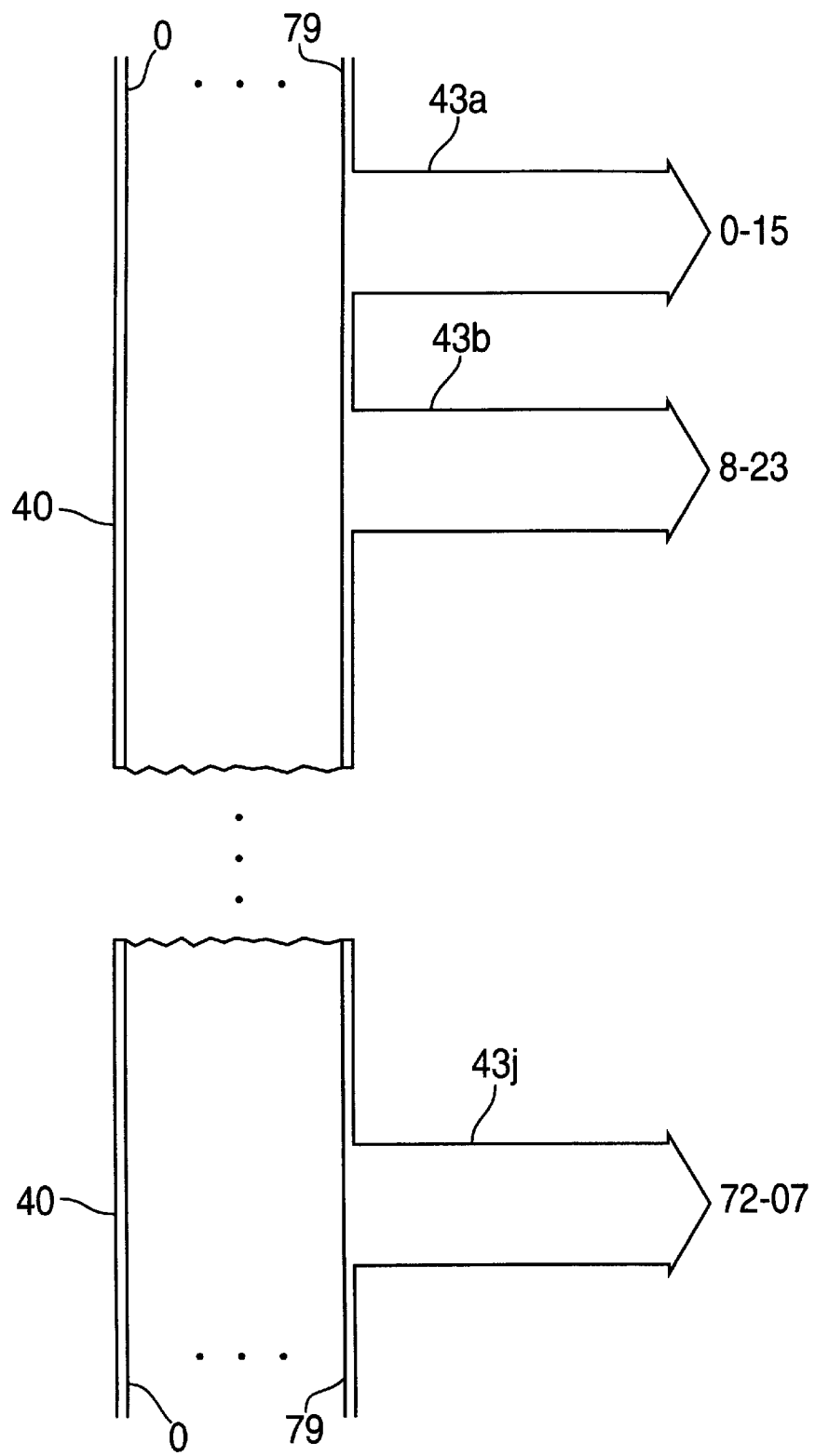
FIG. 7b is a diagram of an illustrative arrangement for interconnecting vertical inter-super-region conductors and vertical branch conductors in accordance with the present invention.

In FIG. 7b, each V conductor 40 is associated with a number from left to right, the left-most V conductor 40 being conductor number 0 and the right-most V conductor 40 being conductor number 79. The numbers associated with each vertical branch conductor sets 43 denotes which of the 80 V conductors 40 that set is connected to. For example, vertical branch conductor set 43a is connected to V conductors 40 numbered 0–15 (vertical branch conductor set 43b is connected to V conductors 40 numbered 8–23, etc.).

In the arrangement of FIG. 7b, the vertical branch conductor sets 43 are associated with the GH/H interconnection groups in a given LAB and are sometimes referred to herein as GH/H vertical branch conductors 43. Connections made between the sets of GH/H vertical branch conductors 43 and V conductors 40 preferably partially overlap. For example, conductors of branch conductor set 43a are connected to V conductors 40 numbered 0–15, whereas the conductors of branch conductor set 43b are connected to V conductors numbered 8–23. Both conductor sets 43a and 43b are connected to V conductors 40 numbered 8–15. This overlapping interconnection scheme increases signal routing flexibility by permitting signals traveling on each V conductor 40 to be routed to multiple (and preferably different) GH interconnection groups 200 within a given LAB 50.

This overlapping interconnection scheme between the sets of GH/H vertical branch conductors 43 and V conductors 40 is preferably implemented in a random fashion. In FIG. 7b, interconnections are shown as being arranged in a somewhat orderly fashion to facilitate comprehension of the basic interconnection principle. In practice, these interconnections are randomly distributed in order to make the routing capability of each LAB 50 similar so that one LAB 50 is not greatly preferred over another when forming a particular pattern of interconnections. Distributing interconnections in this way reduces the number of special interconnection cases, making routing problems easier to solve.

The number of conductors in each vertical branch conductor set 43 may be determined by the number of vertical branch conductor sets 43, logic elements 70, and V conductors 40 associated with a given LAB. For example, a given LAB may have may have 10 logic elements 70 and 80 associated V conductors 40. Each logic element 70 may be associated with one GH/H interconnection group 300 with one set of vertical branch conductors 43 and one GH/V interconnection group 300 with one vertical branch conductor set 32. In this case, a given LAB may have a total of 10 sets of GH/H vertical branch conductors 43 and 10 sets of GH/V horizontal branch conductors 32. If it is desired to equally connect the V conductors 40 to the sets GH/H branch conductors 43 such that each V conductor 40 connects to a different GH/H vertical branch conductor 43, then the number of V conductors 40 may be divided by the number V/H branch conductor sets 43 to determine the number of branch conductors required in each set. For example, 80 V conductors 40 divided by 10 GH/H branch conductors sets 43 equals eight conductors per GH/H conductor set 41'. Similarly, if it is desired to equally distribute the 80 V conductors 40 among the 10 sets of GH/H branch conductors 43 such that each V conductor 40 connects to at least two different GH vertical branch conductors 43, then the number of V conductors 40 multiplied by the desired number of different connections may be divided by the number GH/H branch conductor sets 43 to determine the number of branch conductors required in each set. For example, 80 V conductors 40 multiplied by two connections divided by 10 GH/H branch conductors sets 43 equals 16 conductors per GH/H conductor set 43.

As shown in FIG. 7, each logic element 70 in a given LAB 50 is associated with two interconnection groups (300a and 300b) such that only one logic element 70 has access to those interconnection groups. Logic elements 70 may share their associated interconnection groups 300 with V and H conductors 30 and 40, but preferably not with other logic elements 70. For example, each LAB 50 may have ten logic elements 70 and twenty associated interconnection groups 300, each logic element 70 having exclusive access to two of those interconnection groups 300.

Each interconnection group 300 has the capability to route both intra-GOL and inter-GOL signals for the logic element 70 with which it is associated. Interconnection group 300a in FIG. 7 can handle signals intended for V and GH conductors 40 and 140 whereas interconnection group 300b can handle signals intended for H and GH conductors 30 and 140. This arrangement allows logic elements 70 the flexibility to access both intra-GOL and inter-GOL conductor types with a minimum number of components. Each logic element 70 may be associated with two interconnection groups 300 (each of which may include a programmable multiplexer 2100, a programmable demultiplexer 2102, and a driver buffer 2101) and may have the ability to route signals to both intra-GOL or inter-GOL conductor types.

Interconnection groups 300 can be configured in a variety of ways to allow signals access to different conductors types. In the FIG. 7 arrangement, drivers and multiplexers allow signals from driver ??? group 300 to be connected to one GH/V driver 300a and one GH/H driver 300b. This arrangement is illustrative only and other such suitable arrangements may be used if desired. For example, interconnection groups 300 can be configured to include other even or odd combinations of GH/V or GH/H drivers. Additional multiplexers and demultiplexers may be added to interconnection groups 300 in order to provide enhanced routing flexibility. Routing demultiplexers 2102 having a different number of outputs may be used to connect to a different number of conductors. Multiplexers 2100 having a different number of inputs may be used to accommodate signals from a different number of conductors. GH/V and GH/H drivers 2101 may be programmably-controlled tri-state drivers, so that more than one such driver can be connected to a given one of conductors 30, 40, or 140.

As shown in FIG. 7, interconnection groups 300 are preferably associated with a particular logic element 70 of a given LAB 50. As a result, the interconnection arrangement shown in FIG. 7 may be repeated for all LABs 50 and memory regions 51 in a given PLD 10.

Figure 8A:
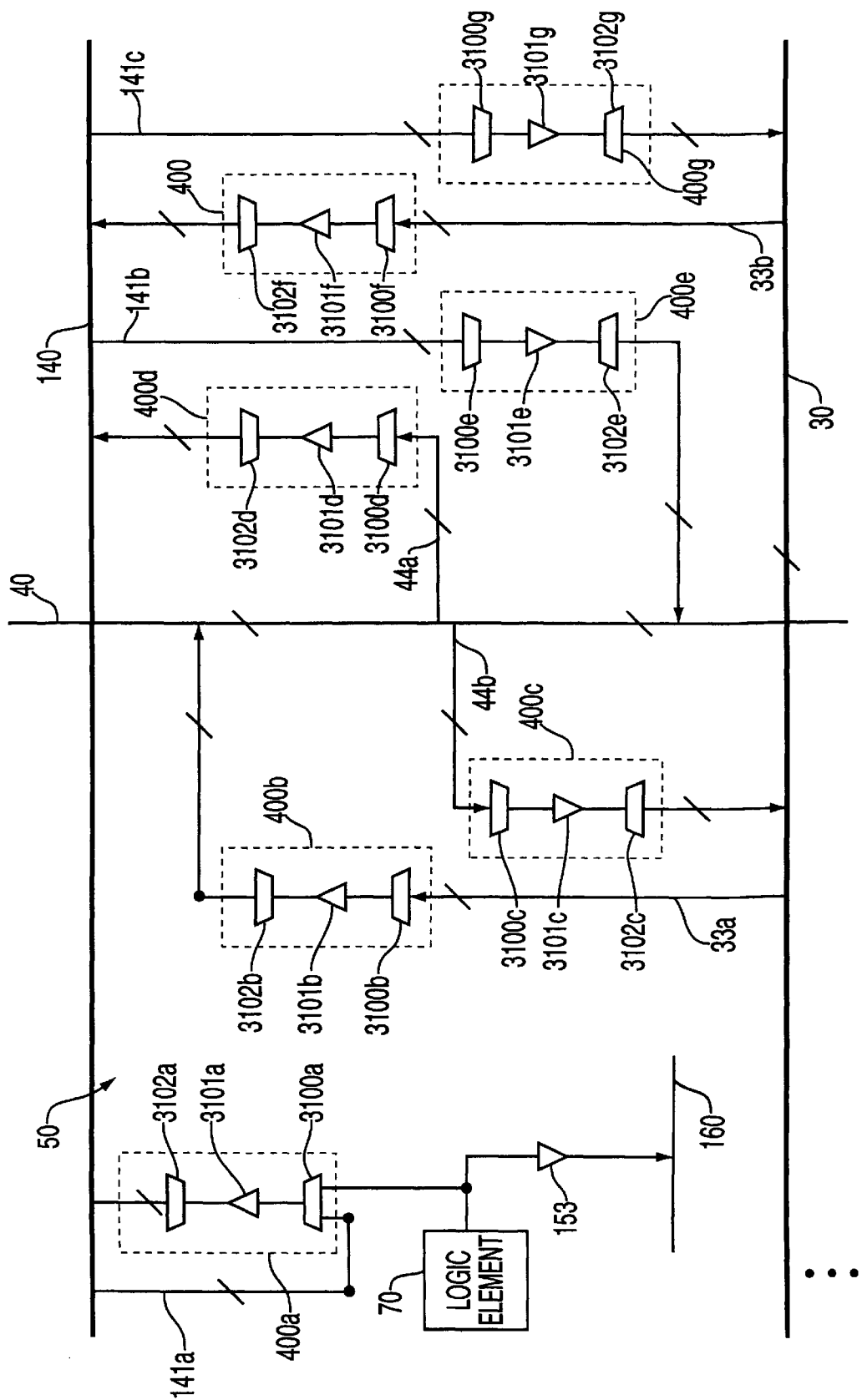
FIG. 8a is a diagram of another illustrative interconnection group accordance with the present invention.

Another interconnection arrangement for selectively routing signals among logic element 70 and the conductors associated with a particular LAB 50 is shown in FIG. 8a. The interconnection arrangement of FIG. 8a may be used for GOLs 20 that include one row of LABs 50. Interconnection among logic elements 70 and H, V, and GH conductors 30, 40 and 140 associated with a LAB 50 is accomplished by a set of interconnection groups 400 (including, e.g., multiplexers 3100, demultiplexers 3102, and drivers 3101) that are associated with each logic element 70 of a given LAB 50. Two types of interconnections groups 400 are shown in FIG. 8: GH interconnection group 400a and turning interconnection groups 400b–400g. The GH interconnection group 400a handles signals from logic elements 70 and GH conductors 140, whereas each turning interconnection group 400 exclusively handles signals from a particular conductor type. Each logic element 70 may be associated with both types of interconnection groups 400. For example, each logic element 70 may be associated with one GH interconnection group 400a and six turning interconnection groups 400.

Signals from logic element 70 and GH conductors 140 are applied to certain inputs of the GH interconnection group 400a. Programmable multiplexer 3100a selects from among these input signals and applies the selected signal to programmable demultiplexer 3102a, preferably using a driver buffer such as GH driver buffer 3101a. Demultiplexer 3102a receives the buffered output signal and directs it to the desired GH conductor 140. In this way, signals from GH conductors 140 and logic elements 70 can share direct access to GH conductors 140 without being required to pass through intermediate conductors.

In the turning interconnection groups 400, signals from one of the H, V, or GH conductor types 30, 40, or 140 are applied to the inputs of a turning interconnection group 400. A programmable multiplexer 3100 in each turning interconnection group 400 selects from among these input signals and applies the selected signal to a programmable demultiplexer 3102, preferably using a driver buffer 3101. Each demultiplexer 3102 receives such a buffered output signal and directs it to one of the conductors connected to the output of that demultiplexer. In this way, signals traveling on H, V, and GH conductors 30, 40, and 140 can be readily turned via a dedicated turning interconnection group 400 to travel on other conductors. For example, signals traveling on V conductors 40 can be turned to travel on GH or H conductors 140 by using turning interconnection groups 400d and 400c. Signals traveling on a given conductor type are provided with direct paths to other conductor types associated with a given LAB 50 without being required to pass through intermediate conductors.

FIG. 8 also shows driver circuitry that may be used to convey output signals from logic elements 70 to local branch conductors 160. Communication on the local level with the FIG. 8 arrangement may be accomplished by selectively connecting each logic element 70 to local branch conductors 160 via dedicated local drivers 153.

Signals traveling on H conductors 30 can be turned to travel along V conductors 40 and GH conductors 140. For example, signals from H conductors 30 can be turned onto V conductors 40 by programming a V to H multiplexer such as multiplexer 3100b in H to V turning interconnection group 400b to apply input signals received from one of the horizontal branch conductors 33a to V driver 3101b. Programmable demultiplexer 3102b receives the output signal from V driver 3101b and applies it to a selected V conductor 40. Signals from H conductors 30 can be turned onto GH conductors 140 by programming a GH to H multiplexer such as multiplexer 3100f of H to GH turning interconnection group 400f to apply the input signal received from one of the horizontal branch conductors 33b to GH driver 3101f. Programmable demultiplexer 3102f receives the output signal from GH driver 3101f and applies it to a selected GH conductor 140. This allows signals from the inter-GOL H conductors 30 to be selectively brought into a GOL 20.

Connections between H conductors 30 and the multiplexers 3100 associated with a row of LABs 50 are generally equally distributed among the H to GH and H to V turning interconnection groups 400 associated with that row by horizontal branch conductors 33. Each horizontal branch conductor 33 in a given row of LABs 50 may be connected to a different one of the H conductors 30 associated with that row of LABs. For example, a row of LABs 50 may include 16 LABs and a memory region 51, each of which may be associated with one H to V and one H to GH turning interconnection group 400. Each H to V and H to GH turning interconnection group 400 may contain a multiplexer 3100 which may be connected to a different one of the H conductors 30 (for a total of 32 multiplexers 3100 associated with that row of LABs, 16 in H to V turning interconnection groups and 16 in H to GH turning interconnection groups). A set of 16 H conductors 30 may be associated with the row such that each H conductor 30 is connected to a different H to V and H to GH interconnection group 400 by horizontal branch conductors 33. Horizontal branch conductors 33 may be arranged in this way to provide signals traveling on each H conductor 30 with direct access to both V conductors 40 and GH conductors 140 within that row of LABs (i.e., without having to pass through intermediate intra-GOL conductors).

In certain GOL arrangements, however, each LAB 50 may include multiple H to V and H to GH interconnection groups 400, each of which may have one or more multiplexers 3100. A row LABs 50 organized in this way may be arranged so that multiple rows of interconnection groups 400 are created within a that row of LABs. For example, in FIG. 5, interconnection groups 170a, 170'b, and 170c from LABs N, N+1, and memory region 51 are arranged such that they form a row of interconnection groups within a row of LABs. LABs containing interconnection groups 400 may be arranged in a similar fashion so that each interconnection group 400 is associated with a particular row of interconnection groups.

As described above, a set of multiple H conductors 30 may be associated with a given row of LABs. This set of multiple H conductors 30 may be divided into subsets of H conductors 30 so that each of the subsets may be associated with a different one of the multiple rows of interconnection groups 400. For example, a given row of LABs may have ten rows of interconnection groups 400. This is illustrated in FIG. 5. In one suitable GOL arrangement, a given row of LABs 50 may have ten rows of interconnection groups 400. A set of 100 H conductors 30 may be associated with that row of LABs which may be divided into ten subsets of ten. Each of these subsets of ten H conductors 30 may be associated with a different one of the ten rows of interconnection groups 400. In GOL arrangements having a row of 16 LABs, a total of 32 multiplexers 3100 may be associated with that row of LABs, 16 in H to V turning interconnection groups and 16 in H to GH turning interconnection groups. In this case, each H conductor 30 may be connected to multiple multiplexers 3100 in that row. For example, each H conductor 30 may connect to two H to V multiplexers 3100 and two in H to GH multiplexers 3100. Distributing H conductors 30 in this way improves routing flexibility within a given GOL 20 by providing signals traveling on each H conductor 30 with access to multiple H to V and H to GH turning interconnection groups 400.

H conductors 30 need not always connect be connected to multiplexers 3100 in whole number ratios. For example, a subset of H conductors 30 may be connected to an average of 3.2 H to V and H to GH multiplexers in a given row of interconnection groups. This type of fractional interconnecting may be implemented by overlapping the connections between horizontal branch conductors 33 and H conductors 30. For example, each H conductor 30 may be connected to either three or four H to V multiplexers 3100 in a row of interconnection groups (i.e., by connecting each H conductor 30 to either three or four horizontal branch conductors 33 associated with that row). This interconnection scheme may be employed in GOL arrangements where the number of H conductors 30 associated with a row of interconnection groups is not a perfect multiple of the number of horizontal branch conductors 33 in that row. For example, a given row of interconnection groups may be associated with a subset of ten H conductors 30 and 16 H to V multiplexers 3100. Each H to V multiplexer 3100 may have with two horizontal branch conductors 33. In this case, each of the ten H conductors 30 can be connected to the 32 horizontal branch conductors 33 by overlapping all ten of the connections, i.e., eight H conductors 30 may be connected to three horizontal branch conductors 32, and two H conductors 30 may each be connected to four horizontal branch conductors 32. Consequently, a subset of ten H conductors 30 may connect on average to 3.2 H to V multiplexers 3100 per row of interconnection groups.

This row of interconnection groups may also be associated with 16 H to GH multiplexers 3100, each with two horizontal branch conductors 33. In this case, each of the ten H conductors 30 can be connected to the 32 horizontal branch conductors 33 by overlapping all ten of the connections, i.e., eight H conductors 30 may each be connected to three horizontal branch conductors 32, and two H conductors 30 may each be connected to four horizontal branch conductors 32. Consequently, the subset of ten H conductors 30 may be connected on average to 3.2 H to GH multiplexers 3100 per row of interconnection groups. This type of fractional overlapping may be used to ensure that each H conductor 30 has access to multiple H to GH turning interconnection groups 400 in a given row of LABs 50.

This fractional overlapping interconnection scheme between the sets of horizontal branch conductors 33 and H conductors 30 is preferably implemented in a random fashion. This is done to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

Signals traveling on V conductors 40 can be turned to travel along H conductors 30 and GH conductors 140. For example, signals from V conductors 40 can be turned onto H conductors 30 by programming a multiplexer such as multiplexer 3100c of V to H turning interconnection group 400c to apply an input signal received from one of vertical branch conductors 44b to H driver 3101c. Programmable demultiplexer 3102c directs the output signal from H driver 3101c to a selected H conductor 30. Signals from V conductors 40 can be applied to GH conductors 140 by programming a multiplexer such as multiplexer 3100d of V to GH turning interconnection group 400d to apply the input signal received from one of the vertical branch conductors 44a to GH driver 3101d. Programmable demultiplexer 3102d directs the output signal from GH driver 3101d to a selected GH conductor 140. This allows signals from the inter-GOL V conductors 40 to be selectively brought into a GOL 20.

Connections between V conductors 40 and multiplexers 3100 associated with a LAB 50 are generally evenly distributed among the V to H and V to GH turning interconnection groups 400 associated with that LAB by vertical branch conductors sets 44. Each set of vertical branch conductors 44 in a given LAB 50 may be connected to only a portion of the total number of V conductors 40 associated with that LAB 50 such that each V conductor 40 has access to at least one V to H turning interconnection group 400 and two different V to GH turning interconnection groups 400 within that LAB 50. This is illustrated in the interconnection diagram of FIG. 8b, which is a partial depiction of a suitable interconnection arrangement between a set of 80 V conductors 40 (0–79) and the sets of vertical branch conductors 44a–44s of the V to H and V to GH turning interconnection groups 400 associated with a given LAB 50. Each set of vertical branch conductors 44 may contain multiple conductors, each of which may be connected to a different one of the V conductors 40. For example, vertical branch conductor set 44a may include 16 conductors.

Figure 8B:
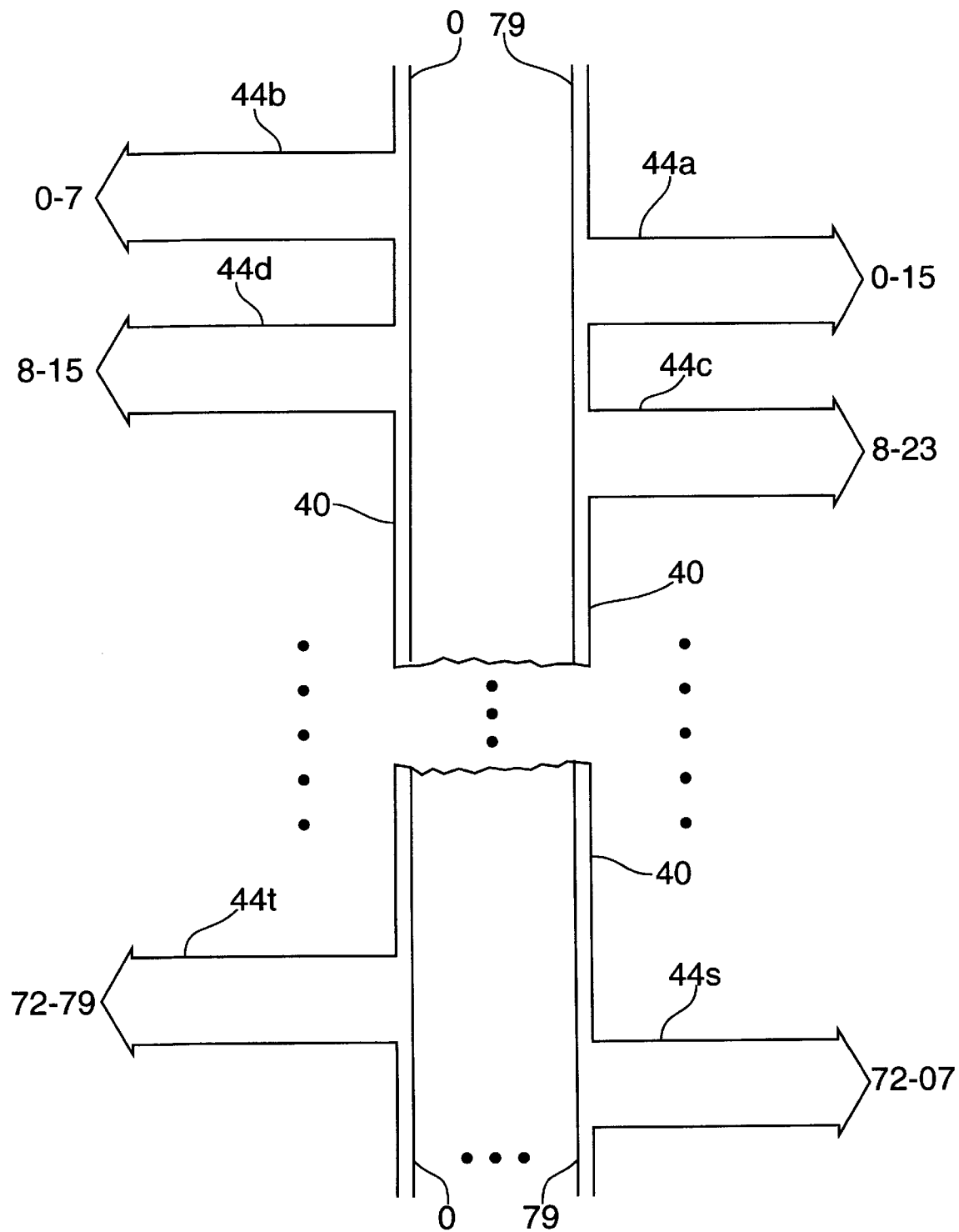
FIG. 8b is a diagram of an illustrative arrangement for interconnecting vertical inter-super-region conductors and vertical branch conductors in accordance with the present invention.

In FIG. 8b, each V conductor 40 is associated with a number from left to right, the left-most V conductor 40 being conductor number 0 and the right-most V conductor 40 being conductor number 79. The numbers associated with each vertical branch conductor sets 44 denotes which of the 80 V conductors 40 that set is connected to. For example, vertical branch conductor set 44a is connected to V conductors 40 numbered 0–15 (vertical branch conductor set 44c is connected to V conductors 40 numbered 8–23, etc.).

In the arrangement of FIG. 8b, the vertical branch conductor sets 44 pointed toward the right may be associated with the V to GH turning interconnection groups 400 in a given LAB and are sometimes referred to herein as V to GH vertical branch conductors 44. Connections made between the sets of V to GH vertical branch conductors 44 and V conductors 40 preferably partially overlap. For example, conductors of branch conductor set 44a may be connected to V conductors 40 numbered 0–15, whereas the conductors of branch conductor set 44c may be connected to V conductors numbered 8–23. Both conductor sets 44a and 44c may be connected to V conductors 40 numbered 8 . 15. This overlapping interconnection scheme increases signal routing flexibility by permitting signals traveling on each V conductor 40 to be routed to multiple (and preferably different) GH interconnection groups 200 within a given LAB 50.

This overlapping interconnection scheme between the sets of V to GH vertical branch conductors 44 and V conductors 40 is preferably implemented in a random fashion. In FIG. 8b, interconnections are shown as being arranged in a somewhat orderly fashion to facilitate comprehension of the basic interconnection principle. In practice, these interconnections are randomly distributed to make the routing capability of each LAB 50 similar so that one LAB 50 is not greatly preferred over another when forming a particular pattern of interconnections. Distributing interconnections in this way reduces the number of special interconnection cases, making routing problems easier to solve.

In the arrangement of FIG. 8b, the vertical branch conductor sets 44 pointed toward the left may be associated with the V to H interconnection groups in a given LAB and are sometimes referred to herein as V to H vertical branch conductors 44. Connections may be made between the sets of V to H vertical branch conductors 44 and V conductors 40 such that each V to H vertical branch conductor 44 may be connected to a different one of the V conductors 40. For example, conductors of V to H branch conductor set 44b may be connected to V conductors 40 numbered 0–7, whereas the conductors of branch conductor set 41d may be connected to V conductors numbered 8–15, etc. This mutually exclusive interconnection scheme permits signals traveling on each V conductor 40 to be routed to a V to H turning interconnection group 400 within a given LAB 50, thus providing these signals with direct access to H conductors 30 within that LAB (i.e., without having to pass through intermediate intra-GOL conductors).

The mutually exclusive interconnection scheme between the sets of V to H vertical branch conductors 44 and V conductors 40 is preferably implemented in a random fashion. In FIG. 8b, interconnections are shown as being arranged in a somewhat orderly fashion to facilitate comprehension of the basic interconnection principle. In practice, these interconnections are randomly distributed to make the routing capability of each LAB 50 similar so that one LAB 50 is not greatly preferred over another when forming a particular pattern of interconnections. Distributing interconnections in this way reduces the number of special interconnection cases, making routing problems easier to solve.

The number of conductors in each vertical branch conductor set 44 may be determined by the number of vertical branch conductor sets 44, logic elements 70 and V conductors 40 associated with a given LAB. For example, a given LAB may have ten logic elements 70 and 80 associated V conductors 40. Each logic element 70 may be associated with a number of interconnection groups 400 including one V to H and one V to GH turning interconnection group, each of which may have an associated set of vertical branch conductors 44. In this case, a given LAB 50 may have a total of ten sets of V to H vertical branch conductors 44 and ten sets of V to GH vertical branch conductors 44. If it is desired to equally connect the V conductors 40 to sets of V to H branch conductors 44 such that each V conductor 40 connects to a different V to H vertical branch conductor 44, then the number of V conductors 40 may be divided by the number V to H branch conductor sets 44 to determine the number of branch conductors required in each set. For example, 80 V conductors 40 divided by ten V to H branch conductors sets 44 equals eight conductors per V/H conductor set 44. A similar technique may be employed to determine the number of conductors in a V to GH vertical branch conductor set 44. For example, if it is desired to equally distribute the 80 V conductors 40 among the 10 sets of V to GH branch conductors 44 such that each V conductor 40 connects to at least two different V to GH vertical branch conductors 44, then the number of V conductors 40 multiplied by the desired number of different connections may be divided by the number GH branch conductor sets 44 to determine the number of branch conductors required in each set. For example, 80 V conductors 40 multiplied by two connections divided by ten V to GH branch conductors sets 44 equals 16 conductors per V to GH conductor set 44.

Signals traveling on GH conductors 140 can be turned to travel along H, V, and other GH conductors 30, 40, and 140. For example, signals from GH conductors 140 can be turned to V conductors 40 by programming a multiplexer such as multiplexer 3100e of GH to V turning interconnection group 400e to apply the input signals received from one of the conductors 141b to GH driver 3101e. Programmable demultiplexer 3102e directs the output signal from GH driver 3101e to a selected V conductor 40. Signals from GH conductors 140 can be turned onto H conductors 30 by programming a multiplexer such as multiplexer 3100g of GH to H turning interconnection group 400g to apply the input signal received from one of conductors 141c to GH driver 3101g. Programmable demultiplexer 3102g directs the output signal from GH driver 3101g to a selected H conductor 30. This allows signals traveling on the intra-GOL GH conductors 140 to be selectively brought out to inter-GOL V and H conductors 40 and 30. Signals from GH conductors 140 can be turned onto other GH conductors 140 by programming a multiplexer such as multiplexer 3100a of GH to GH turning interconnection group 400a to apply the input signal received from one of conductors 141a to GH driver 3101a. Programmable demultiplexer 3102a directs the output signal from GH driver 3101a and applies it to selected GH conductors 140.

Connections between GH conductors 140 and multiplexers 3100 associated with a row of LABs 50 are generally equally distributed among the GH to H, GH to V, and GH to GH turning interconnection groups 400 associated with that row by global horizontal branch conductors 141. Each global horizontal branch conductor 141 in a given row of LABs 50 may be connected to a different one of the GH conductors 140 associated with that row of LABs. For example, a row of LABs may include 16 LABs 50 and a memory region 51, each of which may be associated with one GH to H, GH to V, and GH to GH turning interconnection group 400. Each of these turning interconnection groups 400 may contain a multiplexer 3100 which may be connected to a different one of the GH conductors 140 (for a total of 48 multiplexers 3100 associated with that row of LABs, 16 in GH to H turning interconnection groups, 16 in GH to V turning interconnection groups, and 16 in GH to GH interconnection groups). A set of 48 GH conductors 140 may be associated with the row such that each GH conductor 141 is connected to a different GH to V, GH to H, and GH to GH interconnection group 400 by a global horizontal branch conductor 141. Global horizontal branch conductors 141 may be arranged in this way to provide signals traveling on each GH conductor 140 with direct access to H conductors 30, V conductors 40, and GH conductors 140 within that row of LABs (i.e., without having to pass through intermediate intra-GOL conductors).

In certain GOL arrangements, however, each LAB 50 may include multiple GH to H, GH to V, and GH to GH interconnection groups 400, each of which may have one or more multiplexers 3100. A row LABs 50 organized in this way may be arranged so that multiple rows of interconnection groups 400 are created within a that row of LABs. For example, in FIG. 5, interconnection groups 170a, 170'b, and 170c from LABs N, N+1, and memory region 51 are arranged such that they form a row of interconnection groups within a row of LABs. A row of LABs containing interconnection groups 400 may be arranged in a similar fashion so that each interconnection group 400 is associated with a particular row of interconnection groups.

As described above, a set of multiple GH conductors 140 may be associated with a given row of LABs 50. This set of multiple GH conductors 140 may be divided into subsets so that each of the subsets may be associated with a different one of the multiple rows of interconnection groups 400. This principle is illustrated in FIG. 5. In one suitable GOL arrangement, a given row of LABs 50 may have ten rows of interconnection groups 400. A set of 280 GH conductors 140 associated with a row of LABs may be divided into ten subsets of 28 conductors. Each of these subsets of 28 GH conductors 140 may be associated with a different one of the ten rows of interconnection groups 400. In GOL arrangements having a row of 16 LABs 50 and a memory region 51, a total of 48 multiplexers 3100 may be associated with that row of LABs, 16 in GH to H turning interconnection groups, 16 in GH to V turning interconnection groups, and 16 in GH to GH interconnection groups. In this case, each GH conductor 140 may be connected to multiple multiplexers 3100 in its row. For example, each GH conductor 140 may connect to an GH to H, GH to V, and a GH to GH multiplexer 3100 in that row. Distributing GH conductors 140 in this way improves routing flexibility within a given GOL 20 by providing signals traveling on each GH conductor 140 with access to GH to V, GH to V, and GH to GH turning interconnection groups 400.

GH conductors 140 need not always be connected to multiplexers 3100 in whole number ratios. For example, a subset of GH conductors 140 may be connected to an average of 1.14 GH to V, GH to H, and GH to GH multiplexers 3100 in a given row of interconnection groups. This type of fractional interconnecting may be implemented by overlapping at least some of the connections between global horizontal branch conductors 141 and GH conductors 140. For example, each GH conductor 140 may be connected to either one or two GH to V multiplexers 3100 in a row of interconnection groups (i.e., by connecting each GH conductor 140 to either one or two global horizontal branch conductors 141 associated with that row). This interconnection scheme may be employed in GOL arrangements where the number of GH conductors 140 associated with a row of interconnection groups is not a perfect multiple of the number of global horizontal branch conductors 141 in that row.

For example, a given row of interconnection groups may be associated with a subset of 28 GH conductors 140 and 16 GH to V multiplexers 3100, each with two horizontal branch conductors 33. In this case, each of the 28 GH conductors 140 may be connected to the 32 global horizontal branch conductors 141 by overlapping four of the connections, i.e., four GH conductors 140 may each be connected to two global horizontal branch conductors 141, and 28 GH conductors 140 may each be connected to only one global horizontal branch conductor 141. Consequently, the subset of 28 GH conductors 140 may connect on average to 1.14 GH to V multiplexers 3100 per row of interconnection groups. The GH to H and GH to GH turning interconnection groups 400 associated with a given row of interconnection groups may connect to GH conductors 140 in a similar fashion. This type of fractional overlapping may be used to ensure that each GH conductor 140 has access to at least one GH to V, GH to H, and GH to GH turning interconnection group 400 in a given row of LABs 50.

This fractional overlapping interconnection scheme between the sets of global horizontal branch conductors 141 and GH conductors 140 is preferably implemented in a random fashion. This is done in order to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

A memory region 51 (FIG. 5) in the same row as a given LAB 50 is preferably interconnected to the conductors associated with that row using a comparable interconnection group arrangement.

Figure 12:
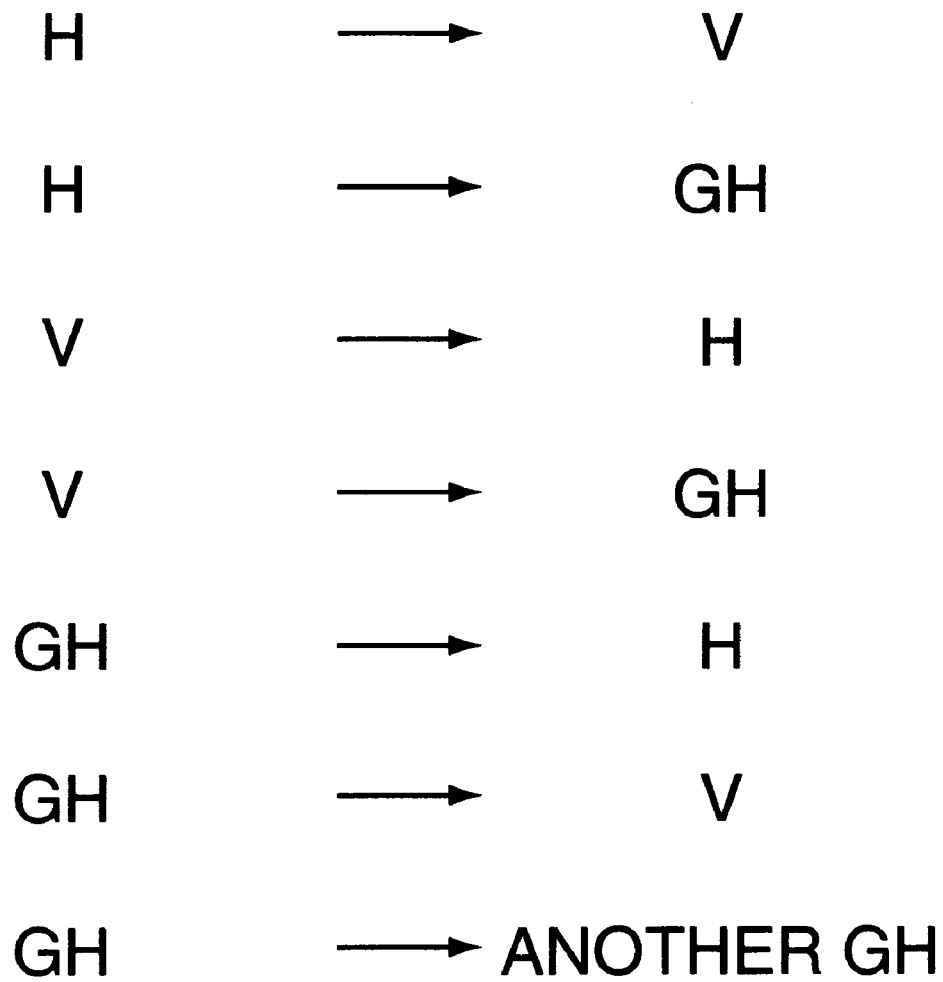

The turns supported by the driver arrangement of FIG. 8 are summarized in the table of FIG. 12.

One benefit of the interconnection scheme in FIG. 8 is that each conductor type (i.e., H, V, and GH) has a dedicated interconnection group 400 for readily turning signals to the other conductor types. This allows signals traveling on different conductor types to be turned to the other conductor types without blocking each other. For example, all the signal turns summarized in the table of FIG. 12 may occur simultaneously.

Interconnection groups 400 can be configured in a variety of ways to allow signals access to different conductors types. In the FIG. 8 arrangement, drivers and multiplexers allow signals from interconnection groups 400 to be connected to one driver buffer 3101. This arrangement is illustrative only and other such suitable arrangements may be used if desired. For example, interconnection groups 400 can be configured to include other even or odd combinations of driver buffers 3101. Additional multiplexers 3100 may be added to interconnection groups 400 in order to provide enhanced routing flexibility. Demultiplexers 3102 having a different number of outputs may be used to connect to a different number of conductors. Multiplexers 3100 having a different number of inputs may be used to accommodate signals from a different number of conductors. Drivers 3101 may be programmably-controlled tri-state drivers, so that more than one such driver can be connected to a given one of conductors 30, 40, or 140.

As shown in FIG. 8, interconnection groups 400 are preferably associated with a particular logic element 70 of a given LAB 50. As a result, the interconnection pattern shown in FIG. 8 may be repeated for all LABs 50 and memory regions 51 in a given PLD 10.

Figure 9A:
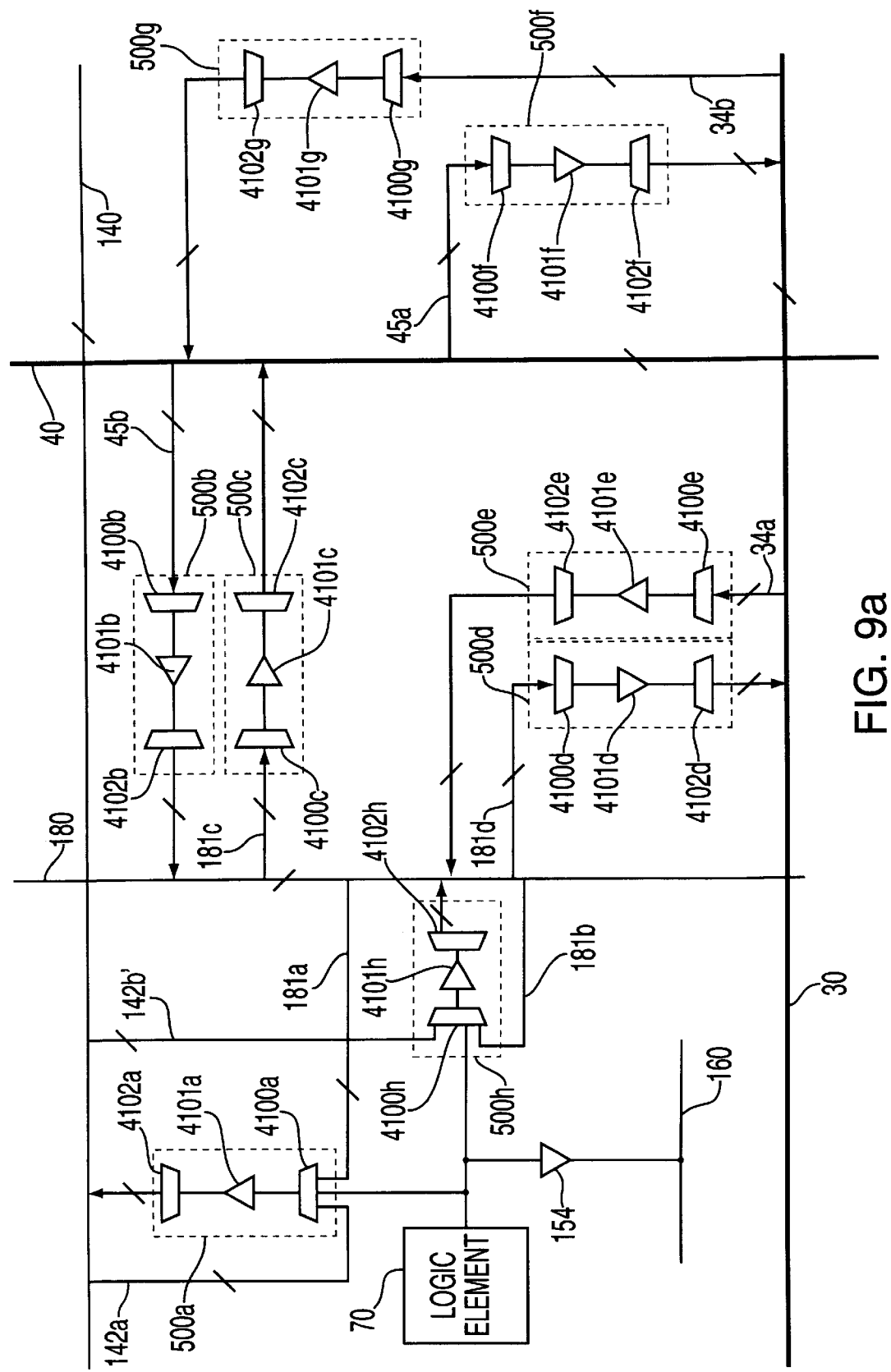
FIG. 9a is a diagram of another illustrative interconnection group accordance with the present invention.

Another interconnection arrangement for selectively routing signals among logic elements 70 and the conductors associated with a particular LAB 50 is shown in FIG. 9a. The interconnection arrangement of FIG. 9a may be used for GOLs 20 that include columns of LABs 50 interconnected by GV conductors 180 (see FIG. 2). Interconnection among logic elements 70 and H, V, GH, and GV conductors 30, 40, 140, and 180 is accomplished by a set of interconnection groups 500 (including e.g., multiplexers 4100, demultiplexers 4102, and drivers 4101) that are associated with each logic element 70 of a given LAB 50. Two types of interconnection groups 500 are shown in FIG. 9a: GH/GV to GH and GH/GV to GV interconnection groups 500a and 500h and turning interconnection groups 500b–500g. The GH/GV interconnection groups 500 handle signals from logic elements 70 and GH and GV conductors 140 and 180, whereas the turning interconnection groups 500 handle signals from a particular conductor type. Each logic element 70 in a given LAB 50 may be associated with both types of interconnection groups 500. For example, each logic element 70 may be associated with one GH interconnection group 500, one GV interconnection group 500, and six turning interconnection groups 500.

Signals from logic element 70 and GH and GV conductors 140 and 180 are applied to certain inputs of the GH/GV interconnection groups 500 (i.e., groups 500a and 500h). Programmable multiplexers 4100 select from among these input signals and apply the selected signals to programmable demultiplexers 4102, preferably using driver buffers such as GH and GV driver buffers 4101a and 4101h. Demultiplexers 4102 receive the buffered output signals and direct them to the desired conductors. In this way, signals from GH conductors 140, GV conductors 180, and logic element 70 can share direct access to other GH and GV conductors 140 and 180 without being required to pass through intermediate conductors.

Signals from one of the H, V, or GV conductor types 30, 40, or 180 are applied to the inputs of the turning interconnection groups 500 such that signals traveling on each conductor type have direct access to at least two other conductor types through a dedicated turning interconnection group 500. Programmable multiplexers 4100 select from among these input signals and apply the selected signals to programmable demultiplexer 4102, preferably using driver buffers such as driver buffers 4101. Demultiplexers 4102 receive the buffered output signals and connect them to the desired conductors. In this way, signals traveling on H, V, and GV conductors 30, 40, and 180 can be turned using a dedicated turning interconnection group 500 to travel on other conductors. Turning interconnection groups 500 therefore provide signals traveling on given conductors with direct paths to other conductors associated with a given LAB 50 without being required to pass through intermediate routing conductors.

The interconnection arrangement of FIG. 9a has driver circuitry that may be used to convey output signals from logic elements 70 to local conductors 85 (not shown). Communication on the local level may be accomplished by selectively connecting each logic element 70 to local conductors 85 via dedicated local drivers 154 and local branch conductors 160.

Signals traveling on H conductors 30 can be turned to travel along V conductors 40 and GV conductors 180. For example, signals from H conductors 30 can be turned to V conductors 40 by programming a multiplexer such as multiplexer 4100g of interconnection group 500g to apply the input signal received from one of horizontal branch conductors 33b to V driver 4101g. Programmable demultiplexer 4102g directs the output signal from V driver 4101g to a selected V conductor 40. Signals from H conductors 30 can be turned onto GV conductors 180 by programming a multiplexer such as multiplexer 4100e of interconnection group 500e to apply the input signal received from one of horizontal branch conductors 33a to GV driver 4101e. Programmable demultiplexer 4102e directs the output signal from GV driver 4101e to a selected GV conductor 180. This allows signals from the inter-GOL H conductors 30 to be selectively brought into a GOL 20 by using the GV conductors 180 of that GOL.

Connections between H conductors 30 and multiplexers 4100 associated with a row of LABs 50 are generally equally distributed among the H to GV and H to V turning interconnection groups 500 associated with that row by horizontal branch conductors 33. Each horizontal branch conductor 34 in a given row of LABs 50 may be connected to a different one of the H conductors 30 associated with that row of LABs 50. For example, a row of LABs 50 may include 16 LABs and a memory region 51, each of which may be associated with one H to V and one H to GV turning interconnection group 500. Each H to V and H to GV turning interconnection group 500 may contain a multiplexer 4100 each of which may be connected to a different one of the H conductors 30. This produces a total of 32 multiplexers 4100 associated with that row of LABs, 16 in H to V turning interconnection groups and 16 in H to GV turning interconnection groups. A set of 16 H conductors 30 may be associated with that row such that each H conductor 30 may be connected to a different H to V and H to GV interconnection group 500 by a horizontal branch conductors 34. Horizontal branch conductors 34 may be arranged in this way to provide signals traveling on each H conductor 30 with direct access to both V conductors 40 and GV conductors 180 within that row of LABs (i.e., without having to pass through intermediate routing conductors). Arranging horizontal branch conductors 34 in this way avoids competition between the H conductors 30 associated with a given row of LABs for the same interconnection group.

In certain GOL arrangements, however, each LAB 50 may include multiple H to V and H to GV interconnection groups 500, each of which may have one or more multiplexers 4100. A row LABs 50 organized in this way may be arranged so that multiple rows of interconnection groups 500 are created within a that row of LABs. For example, in FIG. 5, interconnection groups 170a, 170'b, and 170c from LABs N, N+1, and memory region 51 are arranged such that they form a row of interconnection groups within a row of LABs. LABs 50 containing interconnection groups 500 may be arranged in a similar fashion so that each interconnection group 500 is associated with a particular row of interconnection groups.

As described above, a set of multiple H conductors 30 may be associated with a given row of LABs. This set of multiple H conductors 30 may be divided into subsets so that each of the subsets may be associated with a different one of the multiple rows of interconnection groups 500. For example, a given row of LABs 50 may have ten rows of interconnection groups 500. This principle is illustrated in FIG. 5. A set of 100 H conductors 30 may be associated with that row of LABs 50 which may be divided into ten subsets of ten. Each of these subsets of ten H conductors 30 may be associated with a different one of the ten rows of interconnection groups 500. In GOL arrangements having a row of LABs 50 including 16 LABs and a memory region 51, a total of 32 multiplexers 4100 may be associated with that row of LABs, 16 in H to V turning interconnection groups and 16 in H to GV turning interconnection groups. In this case, each H conductor 30 may be connected to multiple multiplexers 4100 in its row of interconnection groups. For example, each H conductor 30 may connect to two H to V multiplexers 4100 and two in H to GV multiplexers 3100. Distributing H conductors 30 in this way improves routing flexibility within a given GOL 20 by providing signals traveling on each H conductor 30 with access to multiple H to V and H to GV turning interconnection groups 500.

H conductors 30 need not always be connected to multiplexers 4100 in whole number ratios. For example, a subset of H conductors 30 may be connected to an average of 3.2 H to V and H to GV multiplexers in a given row of interconnection groups. This type of fractional interconnecting may be implemented by overlapping at least some of the connections between horizontal branch conductors 34 and H conductors 30. For example, each H conductor 30 may be connected to either three or four H to V multiplexers 4100 in a row of interconnection groups (i.e., by connecting each H conductor 30 to either three or four horizontal branch conductors 34a associated with that row). This interconnection scheme may be employed in GOL arrangements where the number of H conductors 30 associated with a row of interconnection groups is not a perfect multiple of the number of horizontal branch conductors 34 in that row.

For example, a given row of interconnection groups 500 may be associated with a subset of ten H conductors 30 and 16 H to V multiplexers 4100. Each multiplexer 4100 may have two horizontal branch conductors 34. In this case, each of the ten H conductors 30 can connect to the 32 horizontal branch conductors 34 by overlapping all ten of the connections, i.e., eight H conductors 30 may each be connected to three horizontal branch conductors 34, and two H conductors 30 may each be connected to four horizontal branch conductors 34. Consequently, a subset of ten H conductors 30 may be connected on average to 3.2 H to V multiplexers 3100 per row of interconnection groups. Horizontal branch conductors 44b may connect H to GV multiplexers 4100 to H conductors 30 in a similar fashion. This type of fractional overlapping may be used to ensure that each H conductor 30 has access to multiple H to GV and H to V turning interconnection groups 500 in a given row of LABs 50.

This fractional overlapping interconnection scheme between the sets of horizontal branch conductors 34 and H conductors 30 is preferably implemented in a random fashion. This is done to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

Signals traveling on V conductors 40 can be turned to travel along H conductors 30 and GV conductors 180. For example, signals from V conductors 40 can be turned onto H conductors 30 by programming a multiplexer such as multiplexer 4100ƒ of interconnection group 500ƒ to apply the input signals received from one of vertical branch conductors 45a to H driver 4101ƒ. Programmable demultiplexer 4102ƒ directs the output signal from H driver 4101ƒ to a selected H conductor 30. Signals from V conductors 40 can be applied to GV conductors 180 by programming a multiplexer such as multiplexer 4100b of interconnection group 500b to apply the input signal received from one of vertical branch conductors 45b to GV driver 4101b. Programmable demultiplexer 4102b directs the output signals from GV driver 4101b to a selected GV conductor 180. This allows signals from inter-GOL V conductors 40 to be selectively brought into a GOL 20 by using the GV conductors 180 of that GOL.

Connections between V conductors 40 and multiplexers 4100 associated with a column of LABs 50 are generally evenly distributed among the V to H and V to GV turning interconnection groups 500 associated with that column of LABs by vertical branch conductors sets 45. Each set of vertical branch conductors 45 in a given LAB 50 may be connected to only a portion of the total number of V conductors 40 associated with that LAB 50 such that each V conductor 40 has access to at least two different V to H turning interconnection groups 500 and two different V to GV turning interconnection groups 500 within that LAB 50. This is illustrated in the interconnection diagram of FIG. 9b, which is a partial depiction of a suitable interconnection arrangement between a set of 80 V conductors 40 (0–79) and the sets of vertical branch conductors 45a–45s of the V to H and V to GV turning interconnection groups 500 associated with a given LAB 50. Each set of vertical branch conductors 45 may contain multiple conductors, each of which may be connected to a different one of the V conductors 40. For example, each vertical branch conductor set 45 may include 16 conductors.

Figure 9B:
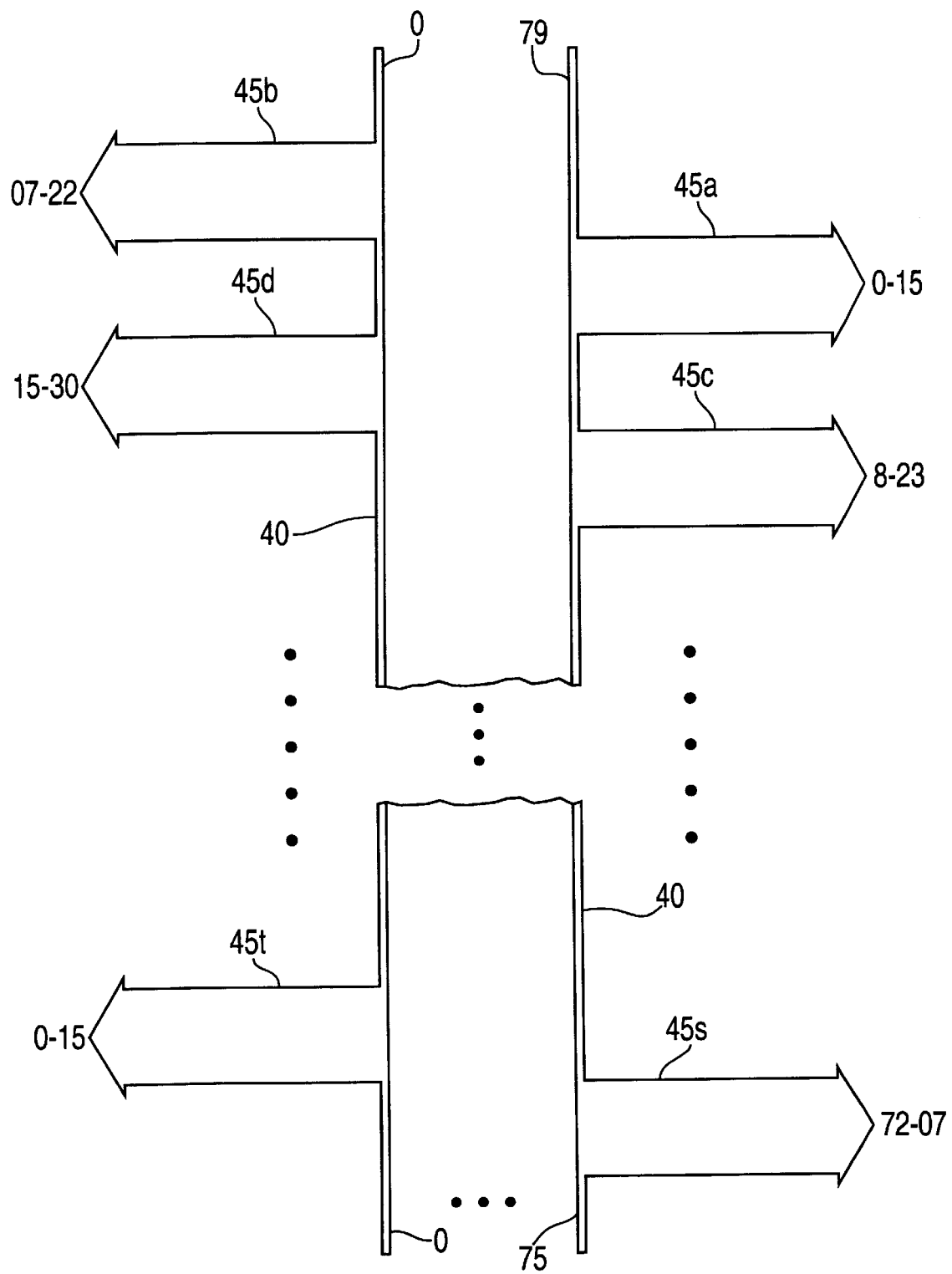
FIG. 9b is a diagram of an illustrative arrangement for interconnecting vertical inter-super-region conductors and vertical branch conductors in accordance with the present invention.

In FIG. 9b, each V conductor 40 is associated with a number from left to right, the left-most V conductor 40 being conductor number 0 and the right-most V conductor 40 being conductor number 79. The numbers associated with each vertical branch conductor sets 45 denotes which of the 80 V conductors 40 that set is connected to. For example, vertical branch conductor set 45a is connected to V conductors 40 numbered 0–15 (vertical branch conductor set 45c is connected to V conductors 40 numbered 8–23, etc.).

In the arrangement of FIG. 9b, the vertical branch conductor sets 45 pointed toward the right may be associated with the V to H turning interconnection groups 500 in a given LAB and are sometimes referred to herein as V to H vertical branch conductors 45. Connections made between the sets of V to H vertical branch conductors 45 and V conductors 40 preferably partially overlap. For example, conductors of branch conductor set 45a are connected to V conductors 40 numbered 0–15, whereas the conductors of branch conductor set 45c are connected to V conductors 40 numbered 8–23. Both conductor sets 45a and 45c are connected to V conductors 40 numbered 8–15. This overlapping interconnection scheme increases signal routing flexibility by permitting signals traveling on each V conductor 40 to be routed to multiple (and preferably different) V to H turning interconnection groups 500 within a given LAB 50.

This overlapping interconnection scheme between the sets of V to H vertical branch conductors 45 and V conductors 40 is preferably implemented in a random fashion. In FIG. 9b, interconnections are shown as being arranged in a somewhat orderly fashion to facilitate comprehension of the basic interconnection principle. In practice, these interconnections are randomly distributed to make the routing capability of each LAB 50 similar so that one LAB 50 is not greatly preferred over another when forming a particular pattern of interconnections. Distributing interconnections in this way reduces the number of special interconnection cases, making routing problems easier to solve.

In the arrangement of FIG. 9b, the vertical branch conductor sets 45 pointed toward the left may be associated with the V to GV interconnection groups in a given LAB and are sometimes referred to herein as V to GV vertical branch conductors 45. Connections made between the sets of V to GV vertical branch conductors 45 and V conductors 40 preferably partially overlap. For example, conductors of branch conductor set 45b are connected to V conductors 40 numbered 7–22, whereas the conductors of branch conductor set 45d are connected to V conductors numbered 15–30. Both conductor sets 45b and 45d are connected to V conductors 40 numbered 15–22. This overlapping interconnection scheme increases signal routing flexibility by permitting signals traveling on each V conductor 40 to be routed to multiple (and preferably different) V to GV turning interconnection groups 500 within a given LAB 50.

This overlapping interconnection scheme between the sets of V to GV vertical branch conductors 45 and V conductors 40 is preferably implemented in a random fashion. In FIG. 9b, interconnections are shown as being arranged in a somewhat orderly fashion to facilitate comprehension of the basic interconnection principle. In practice, these interconnections are randomly distributed to make the routing capability of each LAB 50 similar so that one LAB 50 is not greatly preferred over another when forming a particular pattern of interconnections. Distributing interconnections in this way reduces the number of special interconnection cases, making routing problems easier to solve.

The number of conductors in each vertical branch conductor set 45 may be determined by the number of vertical branch conductor sets 45, logic elements 70, and V conductors 40 associated with a given LAB 50. For example, a given LAB 50 may have ten logic elements 70 and 80 associated V conductors 40. Each logic element 70 may be associated with a number of various interconnection groups 500 including one V to H and one V to GV turning interconnection group, each having an associated set of vertical branch conductors 45. In this case, a given LAB may have a total of ten sets of V to H vertical branch conductors 45 and ten sets of V to GV vertical branch conductors 45. If it is desired to equally distribute the 80 V conductors 40 among the ten sets of V to GV branch conductors 45 such that each V conductor 40 connects to at least two different V to GV vertical branch conductors 45, then the number of V conductors 40 multiplied by the desired number of different connections may be divided by the number V to GV branch conductor sets 45 to determine the number of branch conductors required in each set. For example, 80 V conductors 40 multiplied by two connections divided by ten V to GH branch conductors sets 45 equals 16 conductors per V to GH conductor set 45. A similar technique may be employed to determine the number of conductors in a V to H vertical branch conductor set 45.

Signals traveling on GH conductors 140 can be turned to travel along other GH conductors 140 and GV conductors 180. For example, signals from GH conductors 140 can be turned to other GH conductors 140 by programming a multiplexer such as multiplexer 4100a of GH/GV to GH interconnection group 500a to apply the input signal received from one of conductors 142a to GH driver 4101a. Programmable demultiplexer 4102a directs the output signal from GH driver 4101a to a selected GH conductor 140. Signals from GH conductors 140 can be turned onto GV conductors 180 by programming a multiplexer such as multiplexer 4100h of GH/GV to GV interconnection group 500h to apply the input signal received from one of conductors 142b to GV driver 4101h. Programmable demultiplexer 4102h directs the output signal from GV driver 4101h to a selected GV conductors 180. This allows signals traveling on GH conductors 140 in one row of LABs 50 to be selectively routed to other GH conductors 140 associated with other rows of LABs 50 within a given GOL 20.

Connections between GH conductors 140 and the multiplexers 4100 associated with a row of LABs 50 are generally equally distributed among the GH/GV to GH and GH/GV to GV interconnection groups 500 associated with that row by global horizontal branch conductors 142. Each global horizontal branch conductor 142 in a given row of LABs may be connected to a different one of the GH conductors 140 associated with that row of LABs 50. For example, a given row of LABs 50 may include 16 LABs and a memory region 51, each of which may be associated with one GH/GV to GH and GH/GV to GV interconnection group 500. Each of these interconnection groups 500 may contain a multiplexer 4100 which may be connected to a different one of the GH conductors 140. Therefore, a total of 32 multiplexers 3100 may be associated with that row of LABs, 16 in GH/GV to GH interconnection groups and 16 in GH/GV to GV interconnection groups. A set of 32 GH conductors 140 may be associated with the row such that each GH conductor 140 is connected to a different GH/GV to GV and GH/GV to GH interconnection group 500 by a global horizontal branch conductor 142. Global horizontal branch conductors 142 may be arranged in this way to provide signals traveling on each GH conductor 140 with direct access to GH conductors 140 and GV conductors 180 within that row of LABs (i.e., without having to pass through intermediate intra-GOL conductors).

In certain GOL arrangements, however, each LAB 50 may include multiple GH/GV to GH and GH/GV to GV interconnection groups 500, each of which may have one or more multiplexers 4100. A row LABs 50 organized in this way may be arranged so that multiple rows of interconnection groups 500 are created within a that row of LABs. For example, in FIG. 5, interconnection groups 170a, 170'b, and 170c from LABs N, N+1, and memory region 51 are arranged such that they form a row of interconnection groups within a row of LABs. A row of LABs containing interconnection groups 500 may be arranged in a similar fashion so that each interconnection group 500 is associated with a particular row of interconnection groups.

As described above, a set of multiple GH conductors 140 may be associated with a given row of LABs. This set of multiple GH conductors 140 may be divided into subsets so that each of the subsets may be associated with a different one of the multiple rows of interconnection groups 500. This principle is illustrated in FIG. 5. In one suitable GOL arrangement, a given row of LABs 50 may have ten rows of interconnection groups 500. A set of 280 GH conductors 140 associated with that row of LABs may be divided into ten subsets of 28. Each of these subsets may be associated with a different one of the ten rows of interconnection groups 500. In GOL arrangements having a row of 16 LABs, a total of 32 multiplexers 4100 may be associated with that row of LABs, 16 in GH/GV to GH turning interconnection groups 16 in GH/GV to GV turning interconnection groups. In this case, each GH conductor 140 may be connected to multiple multiplexers 4100 in that row. For example, each GH conductor 140 may connect to a GH/GV to GH and a GH/GV to GV multiplexer 4100 in that row. Distributing GH conductors 140 in this way improves routing flexibility within a given GOL 20 by providing signals traveling on each GH conductor 140 with access to GH/GV to GV and GH/GV to GH turning interconnection groups 500.

GH conductors 140 need not always be connected to multiplexers 4100 in whole number ratios. For example, a subset of GH conductors 140 may be connected to average of 1.14 GH/GV to GV and GH/GV to GH multiplexers 4100 in a given row of interconnection groups. This type of fractional interconnecting may be implemented by overlapping at least some of the connections between global horizontal branch conductors 142 and GH conductors 140. For example, each GH conductor 140 may be connected to either one or two GH/GV to GV multiplexers 4100 in a row of interconnection groups (i.e., by connecting each GH conductor 140 to either one or two global horizontal branch conductors 142 associated with that row). This interconnection scheme may be employed in GOL arrangements where the number of GH conductors 140 associated with a row of interconnection groups 500 is not a perfect multiple of the number of global horizontal branch conductors 142 in that row.

For example, a given row of interconnection groups may be associated with a subset of 28 GH conductors 140 and 16 GH/GV to GV multiplexers 4100, each with two global horizontal branch conductors 142. In this case, each of the 28 GH conductors 140 can be connected to the 32 global horizontal branch conductors 142 by overlapping four of the connections, i.e., four GH conductors 140 may each be connected to two global horizontal branch conductors 142, and 28 GH conductors 140 may each be connected to one global horizontal branch conductor 142. Consequently, a subset of 28 GH conductors 140 may connect on average to 1.14 GH/GV to GV multiplexers 4100 per row of interconnection groups. The GH/GV to GH interconnection groups 500 associated with a given row of interconnection groups may connect to GH conductors 140 in a similar fashion. This type of fractional overlapping may be used to ensure that each GH conductor 140 has access to at least one GH/GV to GV and one GH/GV to GH interconnection group 500 in a given row of LABs 50.

This fractional overlapping interconnection scheme between the sets of global horizontal branch conductors 142 and GH conductors 140 is preferably implemented in a random fashion. This may be done to make the routing capability of each LAB 50 similar so that one LAB 50 is not greatly preferred over another when forming a particular pattern of interconnections. Distributing interconnections in this way reduces the number of special interconnection cases, thus making routing problems easier to solve.

Signals traveling on GV conductors 180 can be turned to travel along H, V, GH, and other GV conductors 30, 40, 140, and 180. For example, signals from GV conductors 180 can be turned to V conductors 40 by programming a multiplexer such as multiplexer 4100c of V to GV interconnection group 500c to apply the input signal received from one of conductors 181c to V driver 4101c. Programmable demultiplexer 4102c directs the output signal from V driver 4101c to a selected V conductor 40. Signals from GV conductors 180 can be turned to H conductors 30 by programming a multiplexer such as multiplexer 4100d of GV to H turning interconnection group 500d to apply the input signal received from one of conductors 181d to H driver 4101d.

Programmable demultiplexer 4102d directs the output signal from H driver 4101d to a selected H conductor 30. This allows signals traveling on inter-GOL interconnection conductors to be selectively brought into a GOL 20. Signals from GV conductors 180 can be turned onto GH conductors 140 by programming a multiplexer such as multiplexer 4100a of GH/GV to GH turning interconnection group 500a to apply the input signal received from one of conductors 181a to GH driver 4101a. Programmable demultiplexer 4102a directs the output signal from GH driver 4101a to a selected GH conductor 140. Signals from GV conductors 180 can be turned other to GV conductors 180 by programming a multiplexer such as multiplexer 4100h of GH/GV to GV turning interconnection group 500h to apply the input signals received from one of conductors 181b to GV driver 4101h. Programmable demultiplexer 4102h directs the output signal from GV driver 4101h to selected GV conductor 180. This allows signals traveling between rows of LABs 50 on GV conductors 180 to be selectively directed to inter-GOL (GH and GV) conductors associated with a particular row of LABs 50.

Connections between GV conductors 180 and multiplexers 4100 associated with a column of LABs 50 are generally evenly distributed among the GV to H, GV to V, and GH/GV to GH turning interconnection groups 500 associated with that column of LABs by global vertical branch conductors sets 181. Each set of global vertical branch conductors 181 in a given LAB 50 may be connected to only a portion of the total number of GV conductors 180 associated with that LAB 50 such that each GV conductor 180 has access to at least one GV to H, GV to V, and GH/GV to GH turning interconnection group 500 within that LAB and at least one GH/GV to GV turning interconnection group 500 in a given GOL. This is illustrated in the interconnection diagram of FIG. 9c, which is a partial depiction of a suitable interconnection arrangement between a set of 24 GV conductors 180 (0–23) and the sets of global vertical branch conductors 181a–181o' of the GV to H, GV to V, GH/GV to GH, and GH/GH to GV turning interconnection groups 500 associated with a given LAB 50. Each set of vertical branch conductors 181 may contain multiple conductors, each of which may be connected to one of the GV conductors 180.

Figure 9C:
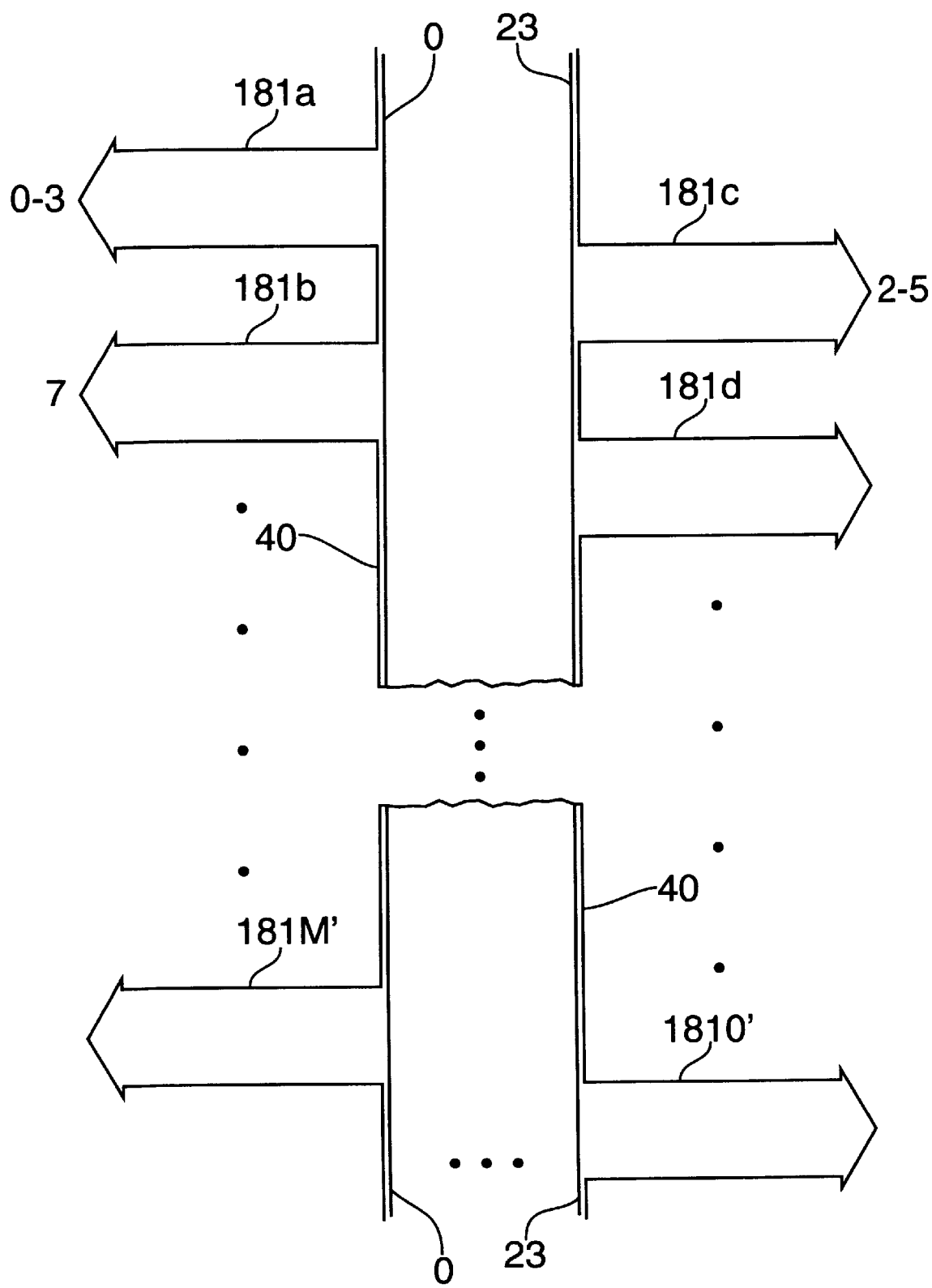
FIG. 9c is a diagram of an illustrative arrangement for interconnecting vertical inter-region conductors and vertical branch conductors in accordance with the present invention.

In FIG. 9c, each GV conductor 180 is associated with a number from left to right, the left-most GV conductor 180 being conductor number 0 and the right-most GV conductor 180 being conductor number 23. The numbers associated with each global vertical branch conductor sets 181 denotes which of the 24 GV conductors 180 that set is connected to. For example, global vertical branch conductor set 181a is connected to GV conductors 180 numbered 0–3 (global vertical branch conductor set 181c is connected to V conductors 40 numbered 2–5, etc.).

In the arrangement of FIG. 9c, the global vertical branch conductor sets 181 pointed toward the right may be associated with the GV to H and GV to V turning interconnection groups 500 in a given LAB and are sometimes referred to herein as GV to H or GV to V global vertical branch conductors 181 respectively. Some of the connections made between the sets of GV to V global vertical branch conductors 181 and GV conductors 180 may overlap. For example, conductors of GV to V global vertical branch conductor set 181c may connect to GV conductors 180 numbered 2–5, and conductors GV to V branch conductor set 181g (not shown) may connect to GV conductors numbered 5–8. Both conductor sets 181c and 181g may connect to GV conductor 180 numbered 5. Connections made between the sets of GV to H global vertical branch conductors 181 and GV conductors 180 may overlap in a similar fashion. Interconnecting in this way increases signal routing flexibility by permitting signals traveling on at least some GV conductors 180 to be routed to multiple (and preferably different) GV to H, GV to V, and GH/GV to GH turning interconnection groups 500 within a given LAB 50.

In the arrangement of FIG. 9c, the global vertical branch conductor sets 181 pointed toward the left may be associated with the GH/GV to H and GH/GV to V turning interconnection groups 500 in a given LAB and are sometimes referred to herein as GH/GV to H or GH/GV to V global vertical branch conductors 181 respectively. Some of the connections made between the sets of GH/GV to GH global vertical branch conductors 181 and GV conductors 180 may overlap. For example, conductors of GV to V global vertical branch conductor set 181a may connect to GV conductors 180 numbered 0–3, and conductors GV to V branch conductor set 181e (not shown) may connect to GV conductors numbered 3–6. Both conductor sets 181a and 181e may connect to GV conductor 180 numbered 3. Connections made between the sets of GH/GV to GH global vertical branch conductors 181 and GV conductors 180 may overlap in a similar fashion. Interconnecting in this way increases signal routing flexibility by permitting signals traveling on at least some GV conductors 180 to be routed to multiple (and preferably different) GH/GV to V and GH/GV to GH turning interconnection groups 500 within a given GOL 20.

GV conductors 180 need not be connected to GH/GV to GV and GH/GV to GH turning interconnection groups 500 in whole number ratios. For example, a subset of GV conductors 180 may connect to an average of 1.14 GH/GV to GV and turning interconnection groups 500 in a given GOL 20. This type of fractional interconnecting may be implemented by overlapping at least some of the connections between global vertical branch conductors 181 and GV conductors 180. For example, a given GOL may contain a column of three LABs 50 which are associated with 24 GV conductors 180. Each GV conductor 180 may connect to either one or two GH/GV to H interconnection groups in a given GOL 20 (i.e., by connecting each GV conductor 180 to either one or two GH/GV to V global vertical branch conductors 181 associated with that column of LABs 50). This interconnection scheme may be employed in GOL arrangements where the number of GV conductors 180 associated with a column of LABs 50 is not a perfect multiple of the number of GH/GV to V global vertical branch conductors 181 in those LAB.

For example, a given column of three LABs 50 may be associated with a set of 24 GV conductors 180 and each LAB 50 may have ten GH/GV to V turning interconnection groups 500. Each GH/GV to V turning interconnection group may contain a GH/GV to V global vertical branch conductor set 181 having one conductor. In this case, each of the 24 GV conductors 180 can connect to the 30 GH/GV to V global vertical branch conductors 181 in the GOL by overlapping six of the connections, i.e., six GV conductors 180 may each connect to two GH/GV to GV global vertical branch conductors 181, and 18 GV conductors 180 may each connect to only one GH/GV to V vertical branch conductors 181. Consequently, a set of 24 GV conductors 180 may connect on average to 1.14 GH/GV to GV interconnection groups per GOL 20. GH/GV to GH interconnection groups 500 may connect GV conductors 180 in a similar fashion with the provision that each GH/GV to GH global vertical conductor set 181 may contain 4 conductors, and thus a set of 24 GV conductors 180 may connect on average to 1.66 GH/GV to GH per LAB. This type of fractional overlapping may be used to ensure that each GV conductor 180 has access to multiple GH/GV to GH turning interconnection groups 500 in a given LAB 50 and access to at least one GH/GV to V turning interconnection group 500 in a given GOL 20.

This overlapping interconnection scheme between the sets of GV to H, GV to V, GH/GV to GV, and GH/GV to GH global vertical branch conductors 181 and GV conductors 180 is preferably implemented in a random fashion. In FIG. 9c, interconnections are shown as being arranged in a somewhat orderly fashion to facilitate comprehension of the basic interconnection principle. In practice, these interconnections are randomly distributed to make the routing capability of each LAB 50 similar so that one LAB 50 is not greatly preferred over another when forming a particular pattern of interconnections. Distributing interconnections in this way reduces the number of special interconnection cases, making routing problems easier to solve.

a memory region 51 (FIG. 5) in the same row as a given LAB 50 is preferably interconnected to the conductors associated with that row using a comparable driver arrangement.

The turns supported by the driver arrangement of FIG. 9a are summarized in the table of FIG. 13.

One benefit of the interconnection scheme in FIG. 9a is that each conductor type has dedicated a interconnection group 500 for readily turning signals to the other conductor types. This allows signals traveling on different conductor types to be turned to other conductors types without blocking with one another. For example, signals traveling on H, V, GV, and GH conductors 30, 40, 140, and 180 may be turned to other conductor types simultaneously. This provides enhanced routing flexibility by minimizing the number of potentially blocked signal routes.

As shown in FIG. 9a, interconnection groups 500 are preferably associated with a particular logic element 70 of a given LAB 50. As a result, the interconnection scheme shown in FIG. 9a may be used for all LABs 50 and memory regions 51 in a given PLD 10.

Figure 14:
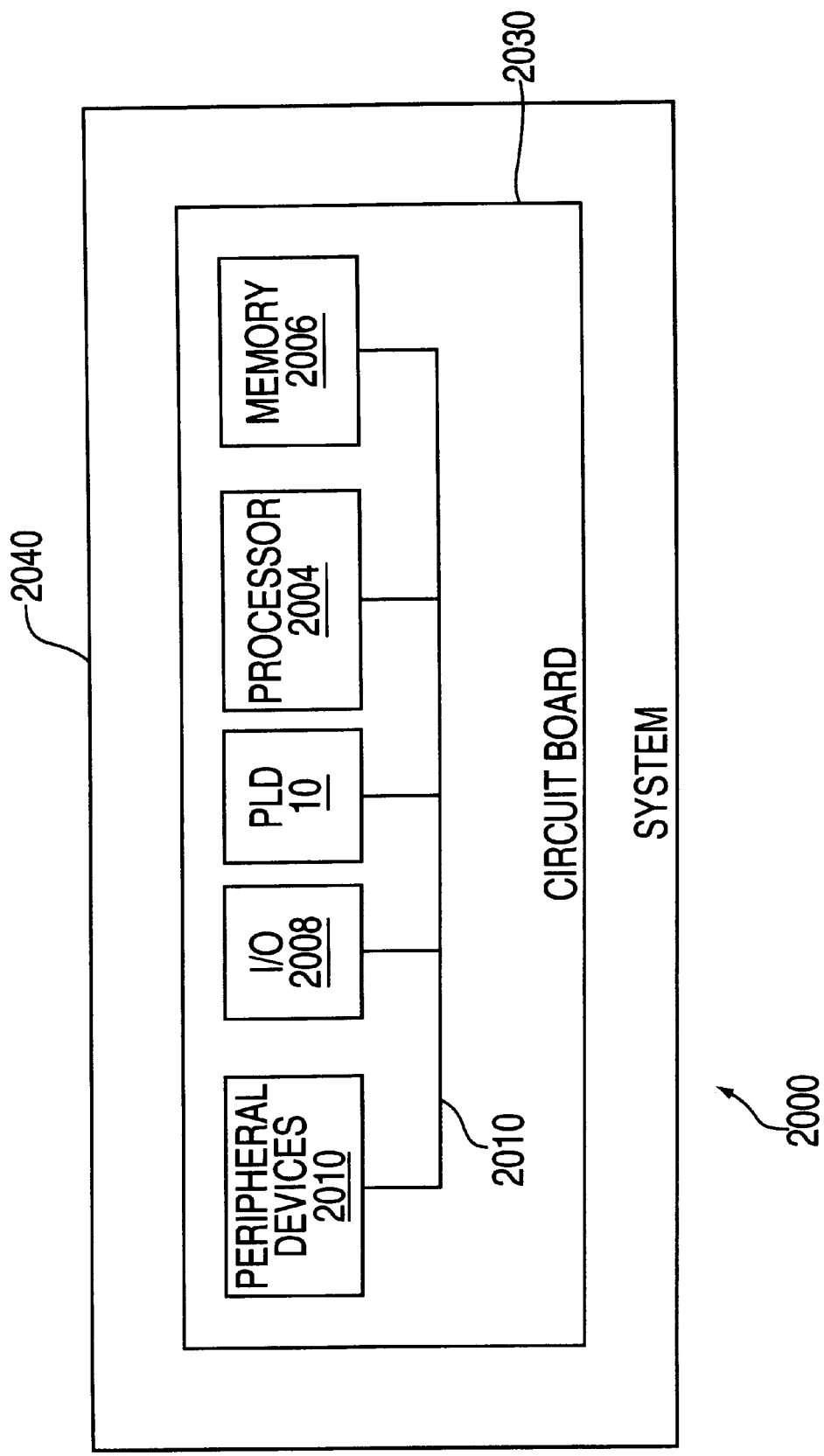
FIG. 14 is a block diagram showing an illustrative use of the programmable logic devices in accordance with the present invention.

FIG. 14 illustrates a programmable logic device 10 (which includes the interconnection circuitry in accordance with this invention) in a data processing system 2000. In addition to device 10, data processing system 2000 may include one or more of the following components: a processor 2004; memory 2006; I/O circuitry 2008; and peripheral devices 2010. These components are coupled together by a system bus 2020 and are populated on a printed circuit board 2030 which is contained in an end-user system 2040.

System 2000 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 2004. Programmable logic device 10 may also be used as an arbiter for arbitrating access to a shared resource in system 2000. In yet another example, programmable logic device 10 can be configured as an interface between processor 2004 and one of the other components in system 2000. It should be noted that system 2000 is only exemplary, and that the true scope and spirit of the invention should be indicated by the following claims.

The PLCs mentioned throughout this specification can be implemented in any of a wide variety of ways. For example, each PLC can be a relatively simple programmable connector such as a switch or a plurality of switches for connecting any one of several inputs to an output (i.e., PLCs may be organized as switching circuits such as multiplexers and demultiplexers). Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. The components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) Like PLCs, FCEs can be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

One skilled in the art will appreciate that the present invention can be practiced by other than the described embodiments, which are presented for the purposes of illustration and not limitation. The present invention is to be limited only by the claims which follow.

The invention claimed is:

1. A programmable logic device, comprising:

a two-dimensional array of intersecting rows and columns of programmable logic super-regions, each of said super-regions including a plurality of programmable logic regions;

a plurality of horizontal inter-super-region interconnection conductors associated with each of said rows for conveying signals between the logic super-regions;

a plurality of vertical inter-super-region interconnection conductors associated with each of said columns for conveying signals between the logic super-regions;

a plurality of horizontal inter-region interconnection conductors that are associated with each of the logic regions for conveying signals between the logic regions; and a plurality of programmable interconnection groups, each of which is connected to a multiplicity of said programmable logic regions and to at least some of the horizontal inter-super-region interconnection conductors and vertical inter-super-region interconnection conductors, each programmable interconnection group selectively routing signals from the multiplicity of programmable logic regions to which that programmable interconnection group is connected and from the horizontal and vertical inter-super-region interconnection conductors to which that programmable interconnection group is connected to selected horizontal inter-region interconnection conductors, horizontal inter-super-region interconnection conductors, and vertical inter-super-region interconnection conductors.

2. The circuitry defined in claim 1 wherein said programmable logic device further comprises vertical branch-feeding conductors connected to the vertical inter-super-region interconnection conductors.

3. The circuitry defined in claim 2 wherein said programmable logic device further comprises vertical branch conductors connected to the vertical branch-feeding conductors.

4. The circuitry defined in claim 3 wherein each interconnection group further comprises multiplexing circuitry having inputs connected to said vertical inter-super-region interconnection conductors by said vertical branch conductors.

5. The circuitry defined in claim 1 wherein said programmable logic device further comprises horizontal branch conductors connected to the horizontal inter-super-region interconnection conductors.

6. The circuitry defined in claim 5 wherein each interconnection group further comprises multiplexing circuitry having inputs connected to said horizontal inter-super-region interconnection conductors by said horizontal branch conductors.

7. The circuitry defined in claim 6 wherein each interconnection group further comprises driver circuitry connected to the programmable multiplexing circuitry for receiving output signals from the programmable multiplexing circuitry.

8. The circuitry defined in claim 7 wherein a portion of said driver circuitry is configured to supply output signals from said multiplexing circuitry to the selected horizontal inter-region interconnection conductors.

9. The circuitry defined in claim 8 wherein a remaining portion of said driver circuitry is configured to supply output signals from said programmable multiplexing circuitry to selected vertical and horizontal inter-super-region interconnection conductors.

10. The circuitry defined in claim 9 further comprising demultiplexing circuitry connected to the remaining portion of said driver circuitry for directing output signals from said driver circuitry to selected horizontal and vertical inter-super-region interconnection conductors.

11. The circuitry defined in claim 10 wherein each of the logic regions further comprise a plurality of subregions of programmable logic.

12. The circuitry defined in claim 11 wherein the multiplexer circuitry is configured to receive output signals from the subregions.

13. The circuitry defined in claim 12 wherein each of the subregions in a region of programmable logic is connected to a different portion of said multiplexing circuitry within the interconnection groups.

14. The circuitry defined in claim 13 wherein two patterns with which the subregions of programmable logic and the multiplexing circuitry of said interconnection groups are connected are alternated.

15. The circuitry defined in claim 13 wherein the multiplexer circuitry is configured to receive output signals from subregions included in different programmable logic regions.

16. The circuitry defined in claim 1 wherein each of said programmable logic regions includes a plurality of subregions of programmable logic.

17. The circuitry defined in claim 16 wherein each of said logic regions further includes local feedback interconnection conductors configured to programmably recirculate signals within said subregions.

18. The circuit defined in claim 1 wherein:
said programmable logic regions are logic array blocks ("LABs");
said programmable logic super-regions are groups of LABs ("GOLs"); and
said programmable logic subregions are logic elements.

19. A digital processing system comprising:
processing circuitry;
a memory coupled to said processing circuitry;
a programmable logic integrated circuit device comprising:
a two-dimensional array of intersecting rows and columns of programmable logic super-regions, each of said super-regions including a plurality of programmable logic regions;
a plurality of horizontal inter-super-region interconnection conductors associated with each of said rows for conveying signals between the logic super-regions;
a plurality of vertical inter-super-region interconnection conductors associated with each of said columns for conveying signals between the logic super-regions;
a plurality of horizontal inter-region interconnection conductors that are associated with each of the logic regions for conveying signals between the logic regions; and
a plurality of programmable interconnection groups, each of which is connected to a multiplicity of said programmable logic regions and to at least some of the horizontal inter-super-region interconnection conductors and vertical inter-super-region interconnection conductors, each programmable interconnection group selectively routing signals from the multiplicity of programmable logic regions to which that programmable interconnection group is connected and from the horizontal and vertical inter-super-region interconnection conductors to which that programmable interconnection group is connected to selected horizontal inter-region interconnection conductors, horizontal inter-super-region interconnection conductors, and vertical inter-super-region interconnection conductors, said programmable logic integrated circuit device being coupled to the processing circuitry and the memory.

20. A printed circuit board on which is mounted a programmable logic integrated circuit device as defined in claim 1.

21. The printed circuit board defined in claim 20 further comprising:
a memory mounted on the printed circuit board and coupled to the memory.

22. The printed circuit board defined in claim 20 further comprising:
processing circuitry mounted on the printed circuit board and coupled to the memory.

23. A programmable logic device, comprising:
a two-dimensional array of intersecting rows and columns of programmable logic super regions, each of said super-regions including a plurality of programmable logic regions;
a plurality of horizontal inter-super-region interconnection conductors associated with each of said rows for conveying signals between the logic super-regions;
a plurality of vertical inter-super-region interconnection conductors associated with each of said columns for conveying signals between the logic super-regions;
a plurality of horizontal inter-region interconnection conductors that are associated with each of the logic regions for conveying signals between the logic regions; and a plurality of first programmable interconnection groups, each of which is connected to a multiplicity of said programmable logic regions and to at least some of the horizontal inter-super-region interconnection conductors and vertical inter-super-region interconnection conductors, each first programmable interconnection group selectively routing signals from the multiplicity of programmable logic regions to which that programmable interconnection group is connected and from the horizontal and vertical inter-super-region interconnection conductors to which that programmable interconnection group is connected to selected horizontal inter-region interconnection conductors; and a plurality of second programmable interconnection groups, each of which is connected to a multiplicity of said programmable logic regions and to at least some of the horizontal inter-super-region interconnection conductors and vertical inter-super-region interconnection conductors, each second programmable interconnection group selectively routing signals from the multiplicity of programmable logic regions to which that second programmable interconnection group is connected and from the horizontal and vertical inter-super-region interconnection conductors to which that programmable interconnection group is connected to selected horizontal and vertical inter-super-region interconnection conductors.

24. The circuitry defined in claim 23 wherein each of said second interconnection groups further comprises programmable demultiplexing circuitry connected to at least some of said horizontal and vertical inter-super-region interconnection conductors.

25. The circuitry defined in claim 23 wherein said programmable logic device further comprises horizontal branch conductors connected to said horizontal inter-super-region interconnection conductors.

26. The circuitry defined in claim 25 wherein each of said first interconnection groups further comprises programmable multiplexing circuitry connected to said horizontal inter-super-region interconnection conductors by said horizontal branch conductors.

27. The circuitry defined in claim 25 wherein each of said second interconnection groups further comprises programmable multiplexing circuitry connected to said horizontal inter-super-region interconnection conductors by said horizontal branch conductors.

28. The circuitry defined in claim 23 wherein said programmable logic device further comprises vertical branch conductors connected to said vertical inter-super-region interconnection conductors.

29. The circuitry defined in claim 28 wherein each of said first and second interconnection groups further comprise programmable multiplexing circuitry connected to said vertical inter-super-region interconnection conductors by said vertical branch conductors.

30. The circuitry defined in claim 29 wherein each of the first and second interconnection groups further comprise driver circuitry connected to the multiplexing circuitry for receiving output signals from the multiplexing circuitry.

31. The circuitry defined in claim 30 wherein said driver circuitry in said first interconnection group is configured to supply output signals from said multiplexing circuitry to selected horizontal inter-region interconnection conductors.

32. The circuitry defined in claim 30 wherein said driver circuitry in said second interconnection group is configured to supply output signals from said multiplexing circuitry to selected vertical and horizontal inter-super-region interconnection conductors.

33. The circuitry defined in claim 30 wherein said second interconnection groups further comprise demultiplexing circuitry connected to the driver circuitry for directing output signals from said driver circuity to selected horizontal and vertical inter-super-region interconnection conductors.

34. The circuitry defined in claim 30 wherein each of said logic regions further comprises a plurality of subregions of programmable logic.

35. The circuitry defined in claim 34 wherein the multiplexer circuitry in said first interconnection group is configured to receive output signals from said plurality of subregions.

36. The circuitry defined in claim 34 wherein the multiplexer circuitry in said second interconnection group is configured to receive output signals from said plurality of subregions.

37. The circuitry defined in claim 34 wherein the multiplexer circuitry in said first interconnection group is configured to receive output signals from subregions included in different programmable logic regions.

38. The circuitry defined in claim 34 wherein the multiplexer circuitry in said second interconnection group is configured to receive output signals from subregions included in different programmable logic regions.

39. The circuitry defined in claim 23 wherein each of said programmable logic regions further includes a plurality of subregions of programmable logic.

40. The circuitry defined in claim 39 wherein each of said logic regions further includes local feedback interconnection conductors configured to programmably recirculate signals within said subregions.

41. The circuitry defined in claim 23 wherein:

said programmable logic regions are logic array blocks ("LABs"); and said programmable logic super-regions are groups of logic array blocks("GOLs");

said programmable logic subregions are logic elements.

42. A digital processing system comprising:

processing circuitry;

a memory coupled to said processing circuitry; and a programmable logic integrated circuit device comprising:

a two-dimensional array of intersecting rows and columns of programmable logic super regions, each of said super-regions including a plurality of programmable logic regions;

a plurality of horizontal inter-super-region interconnection conductors associated with each of said rows for conveying signals between the logic super-regions;

a plurality of vertical inter-super-region interconnection conductors associated with each of said columns for conveying signals between the logic super-regions;

a plurality of horizontal inter-region interconnection conductors that are associated with each of the logic regions for conveying signals between the logic regions; and a plurality of first programmable interconnection groups, each of which is connected to a multiplicity of said programmable logic regions and to at least some of the horizontal inter-super-region interconnection conductors and vertical inter-super-region interconnection conductors, each first programmable interconnection group selectively routing signals from the multiplicity of programmable logic regions to which that programmable interconnection group is connected and from the horizontal and vertical inter-super-region interconnection conductors to which that programmable interconnection group is connected to selected horizontal inter-region interconnection conductors; and a plurality of second programmable interconnection groups, each of which is connected to a multiplicity of said programmable logic regions and to at least some of the horizontal inter-super-region interconnection conductors and vertical inter-super-region interconnection conductors, each second programmable interconnection group selectively routing signals from the multiplicity of programmable logic regions to which that second programmable interconnection group is connected and from the horizontal and vertical inter-super-region interconnection conductors to which that programmable interconnection group is connected to selected horizontal and vertical inter-super-region interconnection conductors, said device being coupled to the processing circuitry and the memory.

43. A printed circuit board on which is mounted a programmable logic integrated circuit device as defined in claim 23.

44. The printed circuit board defined in claim 43 further comprising:

a memory mounted on the printed circuit board and coupled to the memory.

45. The printed circuit board defined in claim 43 further comprising:

processing circuitry mounted on the printed circuit board and coupled to the memory.

46. A programmable logic device comprising:

a two-dimensional array of intersecting rows and columns of programmable logic super regions, each of said super-regions including a plurality of programmable logic regions;

a plurality of horizontal inter-super-region interconnection conductors associated with each of said rows for conveying signals between the logic super-regions;

a plurality of vertical inter-super-region interconnection conductors associated with each of said columns for conveying signals between the logic super-regions;

a plurality of horizontal inter-region interconnection conductors that are associated with each of the logic regions for conveying signals between the logic regions; and a plurality of first programmable interconnection groups, each of which is connected to at least one of said programmable logic regions and to at least some of the horizontal inter-super-region interconnection conductors, each first programmable interconnection group selectively routing signals from said at least one programmable logic region to which that programmable interconnection group is connected and from the horizontal inter-super-region conductors to which that programmable interconnection group is connected to selected horizontal inter-region interconnection conductors and to selected vertical inter-super-region interconnection conductors; and a plurality of second programmable interconnection groups, each of which is connected to at least one of said programmable logic regions and to at least some of the vertical inter-super-region interconnection conductors, each second programmable interconnection group selectively routing signals from said at least one programmable logic region to which that programmable interconnection group is connected and from the vertical inter-super-region conductors to which that programmable interconnection group is connected to selected horizontal inter-region interconnection conductors and to selected horizontal inter-super-region interconnection conductors.

47. The circuitry defined in claim 46 wherein said programmable logic device further comprises horizontal branch conductors connected to the horizontal inter-super-region interconnection conductors.

48. The circuitry defined in claim 47 wherein each of said first interconnection groups further comprises programmable multiplexing circuitry connected to said horizontal inter-super-region interconnection conductors by said horizontal branch conductors.

49. The circuitry defined in claim 48 wherein each of the first interconnection groups further comprises driver circuitry connected to the multiplexing circuitry for receiving output signals from the multiplexing circuitry.

50. The circuitry defined in claim 49 wherein said driver circuitry is configured to supply output signals from said multiplexing circuitry to selected horizontal inter-region interconnection conductors and to selected vertical inter-super-region interconnection conductors.

51. The circuitry defined in claim 50 wherein said first interconnection groups further comprise demultiplexing circuitry connected to the driver circuitry for directing output signals from said driver circuity to selected horizontal inter-region interconnection conductors and to selected vertical inter-super-region interconnection conductors.

52. The circuitry defined in claim 50 wherein each of said logic regions further comprise a plurality of subregions of programmable logic.

53. The circuitry defined in claim 52 wherein the multiplexer circuitry is configured to receive output signals from at least one of the subregions.

54. The circuitry defined in claim 46 wherein said programmable logic device further comprises vertical branch conductors connected to the vertical inter-super-region interconnection conductors.

55. The circuitry defined in claim 54 wherein each of the second interconnection groups further comprises programmable multiplexing circuitry connected to said vertical inter-super-region interconnection conductors by said vertical branch conductors.

56. The circuitry defined in claim 55 wherein each of the second interconnection groups further comprises driver circuitry connected to the multiplexing circuitry for receiving output signals from the multiplexing circuitry.

57. The circuitry defined in claim 56 wherein said driver circuitry is configured to supply output signals from said multiplexing circuitry to selected horizontal inter-region interconnection conductors and to selected horizontal inter-super-region interconnection conductors.

58. The circuitry defined in claim 57 wherein the second interconnection groups further comprise demultiplexing circuitry connected to the driver circuitry for directing output signals from said driver circuity to selected horizontal inter-region interconnection conductors and to selected horizontal inter-super-region interconnection conductors.

59. The circuitry defined in claim 57 wherein each of said logic regions further comprise a plurality of subregions of programmable logic.

60. The circuitry defined in claim 59 wherein the multiplexer circuitry is configured to receive output signals from at least one of the subregions.

61. The circuitry defined in claim 46 wherein each of said logic regions further comprise a plurality of subregions of programmable logic.

62. The circuitry defined in claim 61 wherein said logic regions further includes local feedback interconnection conductors configured to programmably recirculate signals within said subregions.

63. The circuitry defined in defined in claim 46 wherein:

said programmable logic regions are logic array blocks ("LABs"); and said programmable logic super-regions are groups of logic array blocks ("GOLs");

said programmable logic subregions are logic elements.

64. A digital processing system comprising:

processing circuitry;

a memory coupled to said processing circuitry; and a programmable logic integrated circuit device comprising:

a two-dimensional array of intersecting rows and columns of programmable logic super regions, each of said super-regions including a plurality of programmable logic regions;

a plurality of horizontal inter-super-region interconnection conductors associated with each of said rows for conveying signals between the logic super-regions;

a plurality of vertical inter-super-region interconnection conductors associated with each of said columns for conveying signals between the logic super-regions;

a plurality of horizontal inter-region interconnection conductors that are associated with each of the logic regions for conveying signals between the logic regions; and a plurality of first programmable interconnection groups, each of which is connected to at least one of said programmable logic regions and to at least some of the horizontal inter-super-region interconnection conductors, each first programmable interconnection group selectively routing signals from said at least one programmable logic region to which that programmable interconnection group is connected and from the horizontal inter-super-region conductors to which that programmable interconnection group is connected to selected horizontal inter-region interconnection conductors and to selected vertical inter-super-region interconnection conductors; and a plurality of second programmable interconnection groups, each of which is connected to at least one of said programmable logic regions and to at least some of the vertical inter-super-region interconnection conductors, each second programmable interconnection group selectively routing signals from said at least one programmable logic region to which that programmable interconnection group is connected and from the vertical inter-super-region conductors to which that programmable interconnection group is connected to selected horizontal inter-region interconnection conductors and to selected horizontal inter-super-region interconnection conductors, said programmable integrated circuit device coupled to the processing circuitry and the memory.

65. A printed circuit board on which is mounted a programmable logic integrated circuit device as defined in claim 46.

66. The printed circuit board defined in claim 65 further comprising:

a memory mounted on the printed circuit board and coupled to the memory.

67. The printed circuit board defined in claim 65 further comprising:

processing circuitry mounted on the printed circuit board and coupled to the memory.

68. A programmable logic device comprising:

a two-dimensional array of intersecting rows and columns of programmable logic super regions, each of said super-regions including a plurality programmable logic regions;

a plurality of horizontal inter-super-region interconnection conductors associated with each of said rows for conveying signals between the logic super-regions;

a plurality of vertical inter-super-region interconnection conductors associated with each of said columns for conveying signals between the logic super-regions;

a plurality of horizontal inter-region interconnection conductors that are associated with each of the logic regions for conveying signals between the logic regions;

a plurality of programmable interconnection groups each of which is connected to at least one of said programmable logic regions and to at least some of the horizontal inter-region interconnection conductors, each programmable interconnection group selectively routing signals from said at least one programmable logic region to which that programmable interconnection group is connected and from the horizontal inter-region interconnection conductors to which that programmable interconnection group is connected to selected horizontal inter-region interconnection conductors; and a plurality of first programmable turning interconnection groups, each of which is associated with at least one of the programmable logic regions and each of which is connected to at least some of the horizontal inter-super-region interconnection conductors and to some of the vertical inter-super-region interconnection conductors, said first programmable turning interconnection groups selectively routing signals traveling on said horizontal inter-super-region interconnection conductors to travel on selected vertical inter-super-region interconnection conductors, and selectively routing signals traveling on said vertical inter-super-region interconnection conductors to travel on selected horizontal inter-super-region interconnection conductors.

69. The circuitry defined in claim 68 wherein said programmable logic device further comprises global horizontal branch conductors connected to the horizontal inter-region interconnection conductors.

70. The circuitry defined in claim 69 wherein each of said interconnection groups further comprises programmable multiplexing circuitry connected to said horizontal inter-region interconnection conductors by said global horizontal branch conductors.

71. The circuitry defined in claim 70 wherein each of the interconnection groups further comprises driver circuitry connected to the multiplexing circuitry for receiving output signals from the multiplexing circuitry.

72. The circuitry defined in claim 71 wherein said driver circuitry is configured to supply output signals from said multiplexing circuitry to selected horizontal inter-region interconnection conductors.

73. The circuitry defined in claim 72 wherein said interconnection groups further comprise demultiplexing circuitry connected to the driver circuitry for directing output signals from said driver circuity to selected horizontal inter-region interconnection conductors.

74. The circuitry defined in claim 72 wherein each of said logic regions further comprise a plurality of subregions of programmable logic.

75. The circuitry defined in claim 74 wherein the multiplexer circuitry is configured to receive output signals from at least one of the subregions.

76. The circuitry defined in claim 69 wherein said programmable logic device further comprises horizontal branch conductors connected to the horizontal inter-super-region interconnection conductors.

77. The circuitry defined in claim 76 wherein said programmable logic device further comprises vertical branch conductors connected to the vertical inter-super-region interconnection conductors.

78. The circuitry defined in claim 77 wherein a portion of said first programmable turning interconnection groups further comprises programmable multiplexing circuitry connected to said horizontal inter-super-region interconnection conductors by said horizontal branch conductors.

79. The circuitry defined in claim 78 wherein a remaining portion of said first programmable turning interconnection groups further comprises programmable multiplexing circuitry connected to said vertical inter-super-region interconnection conductors by said vertical branch conductors.

80. The circuitry defined in claim 79 wherein each of the first programmable turning interconnection groups further comprises driver circuitry connected to the multiplexing circuitry for receiving output signals from the multiplexing 81. The circuitry defined in claim 80 wherein the driver circuitry in said portion of first programmable turning interconnection groups is configured to supply output signals from said multiplexing circuitry to selected vertical inter-super-region interconnection conductors.

82. The circuitry defined in claim 81 wherein the driver circuitry in said remaining portion of first programmable turning interconnection groups is configured to supply output signals from said multiplexing circuitry to selected horizontal inter-super-region interconnection conductors.

83. The circuitry defined in claim 82 wherein said portion of first programmable turning interconnection groups further comprises demultiplexing circuitry connected to said driver circuitry for directing output signals from the horizontal inter-super-region interconnection conductors to selected vertical inter-super-region interconnection conductors.

84. The circuitry defined in claim 83 wherein said remaining portion of first programmable turning interconnection groups further comprises demultiplexing circuitry connected to said driver circuitry for directing output signals from the vertical inter-super-region interconnection conductors to selected horizontal inter-super-region interconnection conductors.

85. The circuitry defined in claim 77 further comprising a plurality of second programmable turning interconnection groups, each of which is associated with at least one of the programmable logic regions and each of which is connected to at least some of the horizontal inter-region interconnection conductors horizontal and to at least some of the vertical inter-super-region interconnection conductors, the second programmable turning interconnection groups selectively routing signals traveling on said horizontal inter-region interconnection conductors to travel on selected vertical inter-super-region interconnection conductors, and selectively routing signals traveling on said vertical inter-super-region interconnection conductors to travel on selected horizontal inter-region interconnection conductors.

86. The circuitry defined in claim 85 wherein a portion of said second programmable turning interconnection groups further comprises programmable multiplexing circuitry connected to said vertical inter-super-region interconnection conductors by said vertical branch conductors.

87. The circuitry defined in claim 86 wherein a remaining portion of said second programmable turning interconnection groups further comprises programmable multiplexing circuitry connected to said horizontal inter-region interconnection conductors by said global horizontal branch conductors.

88. The circuitry defined in claim 87 wherein each of the second programmable turning interconnection groups further comprises driver circuitry connected to the multiplexing circuitry for receiving output signals from the multiplexing circuitry.

89. The circuitry defined in claim 88 wherein the driver circuitry in said portion of second programmable turning interconnection groups is configured to supply output signals from said multiplexing circuitry to selected horizontal inter-region interconnection conductors.

90. The circuitry defined in claim 89 wherein the driver circuitry in said remaining portion of second programmable turning interconnection groups is configured to supply output signals from said multiplexing circuitry to selected vertical inter-super-region interconnection conductors.

91. The circuitry defined in claim 90 wherein said portion of second programmable turning interconnection groups further comprises demultiplexing circuitry connected to said driver circuitry for directing output signals from the vertical inter-super-region interconnection conductors to selected horizontal inter-region interconnection conductors.

92. The circuitry defined in claim 91 wherein said remaining portion of second programmable turning interconnection groups further comprises demultiplexing circuitry connected to said driver circuitry for directing output signals from the horizontal inter-region interconnection conductors to selected vertical inter-super-region interconnection conductors.

93. The circuitry defined in claim 77 further comprising a plurality of third programmable turning interconnection groups, each of which is associated with at least one of the programmable logic regions and each of which is connected to at least some of the horizontal inter-region interconnection conductors and to at least some of the horizontal inter-super-region interconnection conductors, the third programmable turning interconnection groups selectively routing signals traveling on said horizontal inter-region interconnection conductors to travel on selected horizontal inter-super-region interconnection conductors, and selectively routing signals traveling on said horizontal inter-super-region interconnection conductors to travel on selected horizontal inter-region interconnection conductors.

94. The circuitry defined in claim 93 wherein a portion of said third programmable turning interconnection groups further comprises programmable multiplexing circuitry connected to said horizontal inter-super-region interconnection conductors by said horizontal branch conductors.

95. The circuitry defined in claim 94 wherein a remaining portion of said third programmable turning interconnection groups further comprises programmable multiplexing circuitry connected to said horizontal inter-region interconnection conductors by said global horizontal branch conductors.

96. The circuitry defined in claim 95 wherein each of the third programmable turning interconnection groups further comprises driver circuitry connected to the multiplexing circuitry for receiving output signals from the multiplexing circuitry.

97. The circuitry defined in claim 96 wherein the driver circuitry in said portion of third programmable turning interconnection groups is configured to supply output signals from said multiplexing circuitry to selected horizontal inter-region interconnection conductors.

98. The circuitry defined in claim 97 wherein the driver circuitry in said remaining portion of third programmable turning interconnection groups is configured to supply output signals from said multiplexing circuitry to selected horizontal inter-super-region interconnection conductors.

99. The circuitry defined in claim 98 wherein said portion of third programmable turning interconnection groups further comprises demultiplexing circuitry connected to said driver circuitry for directing output signals from the horizontal inter-super-region interconnection conductors to selected horizontal inter-region interconnection conductors.

100. The circuitry defined in claim 99 wherein said remaining portion of third programmable turning interconnection groups further comprises demultiplexing circuitry connected to said driver circuitry for directing output signals from the horizontal inter-region interconnection conductors to selected horizontal inter-super-region interconnection conductors.

101. The circuitry defined in claim 68 wherein said programmable logic regions include a plurality of subregions of programmable logic.

102. The circuitry defined in claim 101 wherein said logic regions further includes local feedback interconnection conductors configured to programmably recirculate signals within said subregions.

103. The circuits defined in defined in claim 68 wherein:

said programmable logic regions are logic array blocks ("LABs"); and said programmable logic super-regions are groups of logic array blocks ("GOLs"); and said programmable logic subregions are logic elements.

104. A digital processing system comprising:

processing circuitry;

a memory coupled to said processing circuitry; and a programmable logic integrated circuit device comprising:

a two-dimensional array of intersecting rows and columns of programmable logic super regions, each of said super-regions including a plurality programmable logic regions;

a plurality of horizontal inter-super-region interconnection conductors associated with each of said rows for conveying signals between the logic super-regions;

a plurality of vertical inter-super-region interconnection conductors associated with each of said columns for conveying signals between the logic super-regions;

a plurality of horizontal inter-region interconnection conductors that are associated with each of the logic regions for conveying signals between the logic regions;

a plurality of programmable interconnection groups each of which is connected to at least one of said programmable logic regions and to at least some of the horizontal inter-region interconnection conductors, each programmable interconnection group for routing signals from said at least one programmable logic region to which that programmable interconnection group is connected and from the horizontal inter-region interconnection conductors to which that programmable interconnection group is connected to selected horizontal inter-region interconnection conductors;

a plurality of programmable turning interconnection groups, each of which is associated with at least one of the programmable logic regions and each of which is connected to at least some of the horizontal inter-super-region interconnection conductors and to some of the vertical inter-super-region interconnection conductors, said first programmable turning interconnection groups for routing signals traveling on said horizontal inter-super-region interconnection conductors to travel on selected vertical inter-super-region interconnection conductors, and for routing signals traveling on said vertical inter-super-region interconnection conductors to travel on selected horizontal inter-super-region interconnection conductors, the programmable logic integrated circuit device being coupled to the processing circuitry and the memory.

105. A printed circuit board on which is mounted a programmable logic integrated circuit device as defined in claim 68.

106. The printed circuit board defined in claim 105 further comprising:

a memory mounted on the printed circuit board and coupled to the memory.

107. The printed circuit board defined in claim 105 further comprising:

processing circuitry mounted on the printed circuit board and coupled to the memory.

108. A programmable logic device comprising:

a two-dimensional array of intersecting rows and columns of programmable logic super regions, each of said super-regions including a plurality of programmable logic regions;

a plurality of horizontal inter-super-region interconnection conductors associated with each of said rows for conveying signals between the logic super-regions;

a plurality of vertical inter-super-region interconnection conductors associated with each of said columns for conveying signals between the logic super-regions;

a plurality of horizontal inter-region interconnection conductors that are associated with each of the logic regions for conveying signals between rows of the logic regions;

a plurality of vertical inter-region interconnection conductors that are associated with each of the logic regions for conveying signals between columns of the logic regions; and a plurality of first programmable interconnection groups, each of which is connected to at least one of said programmable logic regions and at to least some of the horizontal inter-region interconnection conductors and to at least some of the vertical inter-region interconnection conductors, each first programmable interconnection group selectively routing signals from said at least one programmable logic region to which that interconnection group is connected and from the horizontal and vertical inter-region interconnection conductors to which that interconnection group is connected to selected horizontal inter-region interconnection conductors.

109. The circuitry defined in claim 108 wherein said programmable logic device further comprises global horizontal branch conductors connected to the horizontal inter-region interconnection conductors.

110. The circuitry defined in claim 109 wherein said programmable logic device further comprises global vertical branch conductors connected to the vertical inter-region interconnection conductors.

111. The circuitry defined in claim 110 wherein each of said first interconnection groups further comprises programmable multiplexing circuitry connected to said horizontal inter-region interconnection conductors by said global horizontal branch conductors.

112. The circuitry defined in claim 111 wherein the multiplexing circuitry is connected to said vertical inter-region interconnection conductors by said global vertical branch conductors.

113. The circuitry defined in claim 112 wherein each of the first interconnection groups further comprises driver circuitry connected to the multiplexing circuitry for receiving output signals from the multiplexing circuitry.

114. The circuitry defined in claim 113 wherein said driver circuitry is configured to supply output signals from said multiplexing circuitry to selected horizontal inter-region interconnection conductors.

115. The circuitry defined in claim 114 wherein each of said first interconnection groups further comprises demultiplexing circuitry connected to the driver circuity for directing output signals from said driver circuity to selected horizontal inter-region interconnection conductors.

116. The circuitry defined in claim 115 wherein each of said logic regions further comprise a plurality of subregions of programmable logic.

117. The circuitry defined in claim 116 wherein the multiplexer circuitry is configured to receive output signals from at least one of the subregions.

118. The circuitry defined in claim 110 further comprising a plurality of second programmable interconnection groups, each of which is connected to at least one of said programmable logic regions and to at least some of the horizontal inter-region interconnection conductors and to at least some of the vertical inter-region interconnection conductors, each second programmable interconnection group selectively routing signals from said at least one programmable logic region to which that interconnection group is connected and from the horizontal and vertical inter-region interconnection conductors to which that interconnection group is connected to selected vertical inter-region interconnection conductors.

119. The circuitry defined in claim 118 wherein each of said second interconnection groups further comprises programmable multiplexing circuitry connected to said horizontal inter-region interconnection conductors by said global horizontal branch conductors.

120. The circuitry defined in claim 119 wherein the multiplexing circuitry is connected to said vertical inter-region interconnection conductors by said global vertical branch conductors.

121. The circuitry defined in claim 120 wherein each of the second interconnection groups further comprises driver circuitry connected to the multiplexing circuitry for receiving output signals from the multiplexing circuitry.

122. The circuitry defined in claim 121 wherein said driver circuitry is configured to supply output signals from said multiplexing circuitry to selected vertical inter-region interconnection conductors.

123. The circuitry defined in claim 122 wherein each of said second interconnection groups further comprises demultiplexing circuitry connected to the driver circuity for directing output signals from said driver circuity to selected vertical inter-region interconnection conductors.

124. The circuitry defined in claim 123 wherein each of said logic regions further comprise a plurality of subregions of programmable logic.

125. The circuitry defined in claim 124 wherein the multiplexer circuitry is configured to receive output signals from at least one of the subregions.

126. The circuitry defined in claim 110 wherein said programmable logic device further comprises horizontal branch conductors connected to the horizontal inter-super-region interconnection conductors.

127. The circuitry defined in claim 126 wherein said programmable logic device further comprises vertical branch conductors connected to the vertical inter-super-region interconnection conductors.

128. The circuitry defined in claim 127 further comprising a plurality of first programmable turning interconnection groups, each of which is associated with at least one of the programmable logic regions and each of which is connected to at least some of the horizontal inter-super-region interconnection conductors and to at least some of the vertical inter-super-region interconnection conductors, said first programmable turning interconnection groups selectively routing signals traveling on said horizontal inter-super-region interconnection conductors to travel on selected vertical inter-super-region interconnection conductors, and selectively routing signals traveling on said vertical inter-super-region interconnection conductors to travel on selected horizontal inter-super-region interconnection conductors.

129. The circuitry defined in claim 128 wherein a portion of said first programmable turning interconnection groups further comprises programmable multiplexing circuitry connected to said horizontal inter-super-region interconnection conductors by said horizontal branch conductors.

130. The circuitry defined in claim 129 wherein a remaining portion of said first programmable turning interconnection groups further comprises programmable multiplexing circuitry connected to said vertical inter-super-region interconnection conductors by said vertical branch conductors.

131. The circuitry defined in claim 130 wherein each of the first programmable turning interconnection groups further comprises driver circuitry connected to the multiplexing circuitry for receiving output signals from the multiplexing circuitry.

132. The circuitry defined in claim 131 wherein the driver circuitry in said portion of first programmable turning interconnection groups is configured to supply output signals from said multiplexing circuitry to selected vertical inter-super-region interconnection conductors.

133. The circuitry defined in claim 132 wherein the driver circuitry in said remaining portion of first programmable turning interconnection groups is configured to supply output signals from said multiplexing circuitry to selected horizontal inter-super-region interconnection conductors.

134. The circuitry defined in claim 133 wherein said portion of first programmable turning interconnection groups further comprises demultiplexing circuitry connected to said driver circuitry for directing output signals from the horizontal inter-super-region interconnection conductors to selected vertical inter-super-region interconnection conductors.

135. The circuitry defined in claim 134 wherein said remaining portion of first programmable turning interconnection groups further comprises demultiplexing circuitry connected to said driver circuitry for directing output signals from the vertical inter-super-region interconnection conductors to selected horizontal inter-super-region interconnection conductors.

136. The circuitry defined in claim 127 further comprising a plurality of second programmable turning interconnection groups, each of which is associated with at least one of the programmable logic regions and each of which is connected to at least some of the vertical inter-region interconnection conductors and to at least some of the horizontal inter-super-region interconnection conductors, the second programmable turning interconnection groups selectively routing signals traveling on said vertical inter-region interconnection conductors to travel on selected horizontal inter-super-region interconnection conductors, and selectively routing signals traveling on said horizontal inter-super-region interconnection conductors to travel on selected vertical inter-region interconnection conductors.

137. The circuitry defined in claim 136 wherein a portion of said second programmable turning interconnection groups further comprises programmable multiplexing circuitry connected to said horizontal inter-super-region interconnection conductors by said horizontal branch conductors.

138. The circuitry defined in claim 137 wherein a remaining portion of said second programmable turning interconnection groups further comprises programmable multiplexing circuitry connected to said vertical inter-region interconnection conductors by said global vertical branch conductors.

139. The circuitry defined in claim 138 wherein each of the second programmable turning interconnection groups further comprises driver circuitry connected to the multiplexing circuitry for receiving output signals from the multiplexing circuitry.

140. The circuitry defined in claim 139 wherein the driver circuitry in said portion of second programmable turning interconnection groups is configured to supply output signals from said multiplexing circuitry to selected vertical inter-region interconnection conductors.

141. The circuitry defined in claim 140 wherein the driver circuitry in said remaining portion of second programmable turning interconnection groups is configured to supply output signals from said multiplexing circuitry to selected horizontal inter-super-region interconnection conductors.

142. The circuitry defined in claim 141 wherein said portion of second programmable turning interconnection groups further comprises demultiplexing circuitry connected to said driver circuitry for directing output signals from the horizontal inter-super-region interconnection conductors to selected vertical inter-region interconnection conductors.

143. The circuitry defined in claim 142 wherein said remaining portion of second programmable turning interconnection groups further comprises demultiplexing circuitry connected to said driver circuitry for directing output signals from the vertical inter-region interconnection conductors to selected horizontal inter-super-region interconnection conductors.

144. The circuitry defined in claim 127 further comprising a a plurality of third programmable turning interconnection groups, each of which is associated with at least one of the programmable logic regions and each of which is connected to at least some of the vertical inter-region interconnection conductors and to at least some of the vertical inter-super-region interconnection conductors, the third programmable turning interconnection groups selectively routing signals traveling on said vertical inter-region interconnection conductors to travel on selected vertical inter-super-region interconnection conductors, and selectively routing signals traveling on said vertical inter-super-region interconnection conductors to travel on selected vertical inter-region interconnection conductors.

145. The circuitry defined in claim 144 wherein a portion of said third programmable turning interconnection groups further comprises programmable multiplexing circuitry connected to said vertical inter-super-region interconnection conductors by said vertical branch conductors.

146. The circuitry defined in claim 145 wherein a remaining portion of said third programmable turning interconnection groups further comprises programmable multiplexing circuitry connected to said vertical inter-region interconnection conductors by said global vertical branch conductors.

147. The circuitry defined in claim 146 wherein each of the third programmable turning interconnection groups further comprises driver circuitry connected to the multiplexing circuitry for receiving output signals from the multiplexing circuitry.

148. The circuitry defined in claim 147 wherein the driver circuitry in said portion of third programmable turning interconnection groups is configured to supply output signals from said multiplexing circuitry to selected vertical inter-region interconnection conductors.

149. The circuitry defined in claim 148 wherein the driver circuitry in said remaining portion of third programmable turning interconnection groups is configured to supply output signals from said multiplexing circuitry to selected vertical inter-super-region interconnection conductors.

150. The circuitry defined in claim 149 wherein said portion of third programmable turning interconnection groups further comprises demultiplexing circuitry connected to said driver circuitry for directing output signals from the vertical inter-super-region interconnection conductors to selected vertical inter-region interconnection conductors.

151. The circuitry defined in claim 150 wherein said remaining portion of third programmable turning interconnection groups further comprises demultiplexing circuitry connected to said driver circuitry for directing output signals from the vertical inter-region interconnection conductors to selected vertical inter-super-region interconnection conductors.

152. The circuitry defined in claim 108 wherein said programmable logic regions include a plurality of subregions of programmable logic.

153. The circuitry defined in claim 152 wherein said logic regions further includes local feedback interconnection conductors configured to programmably recirculate signals within said subregions.

154. The circuitry defined in defined in claim 108 wherein:
said programmable logic super-regions are groups of logic array blocks ("GOLs");
said programmable logic regions are logic array blocks ("LABs"); and
said programmable logic subregions are logic elements.

155. A digital processing system comprising:
processing circuitry;
a memory coupled to said processing circuitry; and
a programmable logic integrated circuit device comprising:
a two-dimensional array of intersecting rows and columns of programmable logic super regions, each of said super-regions including a plurality of programmable logic regions;
a plurality of horizontal inter-super-region interconnection conductors associated with each of said rows for conveying signals between the logic super-regions;
a plurality of vertical inter-super-region interconnection conductors associated with each of said columns for conveying signals between the logic super-regions;
a plurality of horizontal inter-region interconnection conductors that are associated with each of the logic regions for conveying signals between rows of the logic regions;

a plurality of vertical inter-region interconnection conductors that are associated with each of the logic regions for conveying signals between columns of the logic regions; and a plurality of programmable interconnection groups, each of which is connected to at least one of said programmable logic regions and at least some of the horizontal inter-region interconnection conductors and to at least some of the vertical inter-region interconnection conductors, each first programmable interconnection group for routing signals from said at least one programmable logic region to which that interconnection group is connected and from the horizontal and vertical inter-region interconnection conductors to which that interconnection group is connected to selected horizontal inter-region interconnection conductors, the programmable logic integrated circuit device being coupled to the processing circuitry and the memory.

156. A printed circuit board on which is mounted a programmable logic integrated circuit device as defined in claim 108.

157. The printed circuit board defined in claim 156 further comprising:

a memory mounted on the printed circuit board and coupled to the memory.

158. The printed circuit board defined in claim 156 further comprising:

processing circuitry mounted on the printed circuit board and coupled to the memory.

* * * * *